(12) United States Patent
Lee et al.

(10) Patent No.: US 12,453,261 B2
(45) Date of Patent: Oct. 21, 2025

(54) DISPLAY DEVICE AND METHOD OF MANUFACTURING THE SAME

(71) Applicant: Samsung Display Co., Ltd., Yongin-Si (KR)

(72) Inventors: Kwang Soo Lee, Yongin-si (KR); Sho Yeon Kim, Yongin-si (KR); Hyun Kim, Yongin-si (KR); Kap Soo Yoon, Yongin-si (KR); Woo Geun Lee, Yongin-si (KR); Seung Ha Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 428 days.

(21) Appl. No.: 18/118,746

(22) Filed: Mar. 8, 2023

(65) Prior Publication Data

US 2024/0016011 A1   Jan. 11, 2024

(30) Foreign Application Priority Data

Jul. 5, 2022 (KR) .......................... 10-2022-0082323

(51) Int. Cl.
*H10K 59/131* (2023.01)
*H10K 59/12* (2023.01)

(52) U.S. Cl.
CPC ....... *H10K 59/131* (2023.02); *H10K 59/1201* (2023.02)

(58) Field of Classification Search
CPC .. H10K 59/131; H10K 59/1201; H10K 50/19; H10K 59/38; H10K 59/8792; H10K 59/1213; H10K 59/126; H10K 59/123; H10K 59/1216; H10K 59/124; H10K 50/805; H10K 59/10; H10K 71/00; H10D 30/6755

See application file for complete search history.

(56) References Cited

U.S. PATENT DOCUMENTS

| | | | |
|---|---|---|---|
| 12,237,340 B2 * | 2/2025 | Wang | H10D 86/60 |
| 2020/0243566 A1 * | 7/2020 | Liu | H10K 59/131 |
| 2023/0123185 A1 | 4/2023 | Kim et al. | |
| 2023/0329047 A1 * | 10/2023 | Chang | H10D 86/441 |
| 2024/0040870 A1 * | 2/2024 | Jeon | H10K 59/131 |
| 2024/0049524 A1 * | 2/2024 | Ren | H10K 59/126 |
| 2024/0138209 A1 * | 4/2024 | Zheng | H10K 59/1213 |
| 2024/0297177 A1 * | 9/2024 | Wang | G02F 1/1368 |

FOREIGN PATENT DOCUMENTS

KR   10-2023-0056090 A   4/2023

* cited by examiner

*Primary Examiner* — J. E. Schoenholtz
(74) *Attorney, Agent, or Firm* — Innovation Counsel LLP

(57) ABSTRACT

A display device includes a first base portion, a first conductive layer comprising a lower light blocking layer on the first base portion, and a lower wiring spaced apart from the lower light blocking layer, a buffer layer disposed on the first conductive layer, a semiconductor layer disposed on the first buffer layer and comprising a first area, a second area on one side of the first area, and a third area on the other side of the first area, a gate insulating layer on the semiconductor layer, and a second conductive layer comprising a gate electrode overlapping the first area on the gate insulating layer, wherein conductivity of each of the first area and the second area is higher than conductivity of the first area, the third area is electrically connected to the lower wiring, and the second area is directly connected to the lower light blocking layer.

28 Claims, 52 Drawing Sheets

DISPLAY DEVICE AND METHOD OF MANUFACTURING THE SAME

CROSS-REFERENCE TO RELATED APPLICATION

This application claims priority from Korean Patent Application No. 10-2022-0082323 filed on Jul. 5, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device and a method of manufacturing the same.

2. Description of the Related Art

The importance of display devices has steadily increased with the development of multimedia technology. Accordingly, various types of display devices such as a liquid crystal display (LCD) device, an organic light emitting diode (OLED) display device and the like have been developed.

Among the display devices, a self-light emitting display device includes a self-light emitting element such as an organic light emitting element. The self-light emitting element may include two opposite electrodes and a light emitting layer interposed therebetween. In the case of using the organic light emitting element as the self-light emitting element, the electrons and holes from the two electrodes are recombined in the light emitting layer to produce excitons, which transition from the excited state to the ground state, emitting light.

The self-light emitting display device is attracting attention as a next-generation display device because of its ability to meet the high display quality requirements such as wide viewing angle, high brightness and contrast, and quick response speed as well as having a low power consumption, and being lightweight and thin due to no need for an independent light source such as a backlight unit.

SUMMARY

Aspects of the present disclosure provide a display device in which the number of unnecessary conductive layers is reduced by making a semiconductor layer conductive and bringing it into contact with a conductive layer disposed thereunder.

Aspects of the present disclosure also provide a method of manufacturing a display device in which the number of unnecessary conductive layers is reduced by making a semiconductor layer conductive and bringing it into contact with a conductive layer disposed thereunder.

An embodiment of a display device includes a first base portion, a first conductive layer comprising a lower light blocking layer on the first base portion, and a lower wiring spaced apart from the lower light blocking layer, a buffer layer disposed on the first conductive layer, a semiconductor layer disposed on the first buffer layer and comprising a first area, a second area on one side of the first area, and a third area on the other side of the first area, a gate insulating layer on the semiconductor layer, and a second conductive layer comprising a gate electrode overlapping the first area on the gate insulating layer, wherein conductivity of each of the second area and the third area is higher than conductivity of the first area, the third area is electrically connected to the lower wiring, and the second area is directly connected to the lower light blocking layer.

The semiconductor layer may comprise an oxide semiconductor layer.

Each of the second area and the third area may contain boron (B) or argon (Ar).

The lower light blocking layer may overlap the semiconductor layer in a thickness direction.

The second conductive layer may further comprise a first connection electrode overlapping the third area.

The first connection electrode may be directly connected to the third area and the lower wiring.

The third area may be connected to the first connection electrode and the lower wiring.

The display device may further comprise a light emitting element comprising a first electrode on the second conductive layer, a second electrode on the first electrode, and a light emitting layer between the first electrode and the second electrode.

The first connection electrode may be directly connected to the first electrode.

The light emitting element may comprise a first electrode on the second conductive layer, a second electrode on the first electrode, and a light emitting layer between the first electrode and the second electrode.

The third area may be directly connected to the first electrode.

The first conductive layer may further comprise a first sub-capacitance electrode, and the second conductive layer further comprises a second sub-capacitance electrode overlapping the first sub-capacitance electrode.

The semiconductor layer may further comprise the second capacitance electrode, and the second capacitance electrode has conductivity higher than that of the first area.

The second capacitance electrode may overlap each of the first sub-capacitance electrode and the second sub-capacitance electrode.

The second capacitance electrode may form a capacitor with each of the first sub-capacitance electrode and the second sub-capacitance electrode.

An embodiment of a display device includes a first base portion, a first conductive layer comprising a lower light blocking layer on the first base portion and a lower wiring spaced apart from the lower light blocking layer, a buffer layer disposed on the first conductive layer, a semiconductor layer disposed on the first buffer layer and comprising a first area, a second area on one side of the first area, and a third area on the other side of the first area, a gate insulating layer on the semiconductor layer and a second conductive layer comprising a gate electrode overlapping the first area on the gate insulating layer, a first connection electrode overlapping the third area, and a second connection electrode overlapping the second area, wherein conductivity of each of the second area and the third area is higher than conductivity of the first area, the second area is directly connected to the lower light blocking layer, and the third area is electrically connected to the lower wiring.

The semiconductor layer may comprise an oxide semiconductor layer.

Each of the second area and the third area may contain boron (B) or argon (Ar).

The second area may be electrically connected to the lower light blocking layer through the second connection electrode, and the third area is electrically connected to the lower wiring through the first connection electrode.

The semiconductor layer may further comprise a fourth area between the first area and the second area, and a fifth area between the first area and the third area, and conductivity of each of the fourth area and the fifth area is higher than conductivity of the second area and the third area.

An embodiment of a method of manufacturing a display device includes forming a first conductive layer comprising a lower light blocking layer on a first base portion, a lower wiring spaced apart from the lower light blocking layer, and a first sub-capacitance electrode spaced apart from the lower wiring, forming a buffer layer disposed on the first conductive layer, forming a semiconductor layer on the buffer layer, disposing a first photoresist layer on the semiconductor layer, etching the semiconductor layer using the first photoresist layer to form a semiconductor layer comprising a first target area, a second target area on one side of the first target area, and a third target area on the other side of the first target area, and a second capacitance electrode, and etching the first photoresist layer such that a remaining first photoresist layer covers only the first target area, and making conductive the second target area, the third target area, and the second capacitance electrode by implanting ions outside of the remaining first photoresist layer.

The method of manufacturing may further comprise, after making conductive the second target area, the third target area, and the second capacitance electrode, removing the first photoresist layer, and forming a gate insulating layer on the semiconductor layer and the second capacitor electrode.

After forming the gate insulating layer, forming a second conductive layer comprising a gate electrode overlapping the first target area, a first connection electrode overlapping the third target area, and a second sub-capacitance electrode overlapping the second capacitance electrode using a second photoresist layer.

After forming the second conductive layer, making conductive a part of the first target area adjacent to each of the second target area and the third target area by implanting ions outside of the second photoresist layer overlapping the gate electrode to form the first target area as a first area, form the second target area as a second area, and form the third target area as a third area.

The second area may be electrically connected to the lower light blocking layer, and the third area is electrically connected to the lower wiring.

The method of manufacturing may further comprise, after forming the gate insulating layer, forming a second conductive layer comprising a gate electrode overlapping the first target area, a first connection electrode overlapping the third target area, a second connection electrode overlapping the second target area, and a second sub-capacitance electrode overlapping a second capacitor electrode using a second photoresist layer.

After forming the second conductive layer, making conductive a part of the first target area adjacent to each of the second target area and the third target area using the second photoresist layer overlapping the gate electrode, the first connection electrode, and the second connection electrode to form first to fifth areas.

The second area may be electrically connected to the lower light blocking layer through the second connection electrode, and the third area is electrically connected to the lower wiring through the first connection electrode.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

In accordance with embodiments of the present disclosure, it is possible to provide a display device in which the number of conductive layers is reduced by making a semiconductor layer conductive and bringing it into contact with a conductive layer disposed thereunder, and a method of manufacturing the same.

However, the effects of the present disclosure are not limited to the aforementioned effects, and various other effects are included in the present disclosure.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

Figure 1:
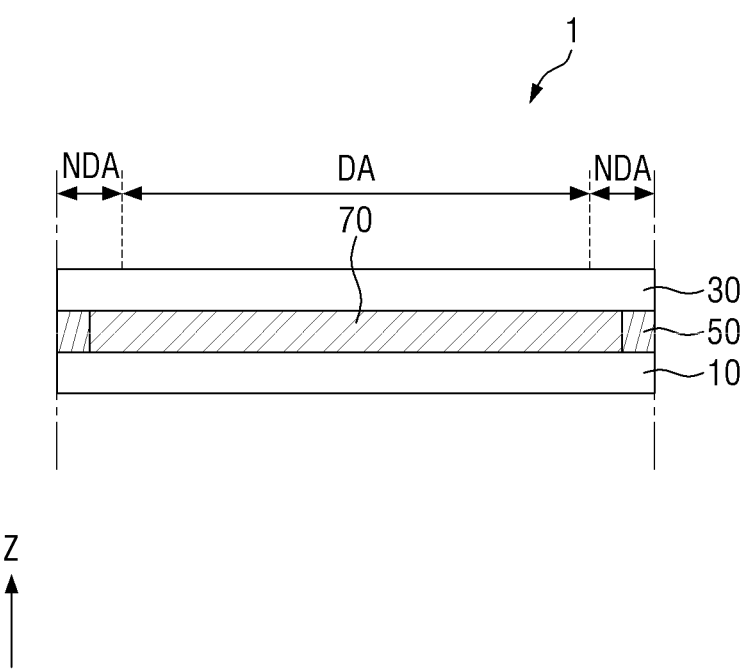
FIG. 1 is a cross-sectional view illustrating a schematic stacked structure of a display device according to one embodiment.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B."

The present invention will be described with reference to perspective views, cross-sectional views, or plan views, in which preferred embodiments of the invention are shown. Thus, the profile of an exemplary view may be modified according to manufacturing techniques or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

Hereinafter, embodiments of the present disclosure will be described with reference to the accompanying drawings.

FIG. 1 is a cross-sectional view illustrating a schematic stacked structure of a display device according to one embodiment.

Referring to FIG. 1, a display device 1 may be applied to a variety of electronic apparatuses, i.e., small and medium electronic devices such as a tablet PC, a smartphone, a car navigation unit, a camera, a center information display (CID) provided in a vehicle, a wristwatch-type electronic device, a personal digital assistant (PDA), a portable multimedia player (PMP) and a game console, and medium and large electronic devices such as a television, an external billboard, a monitor, a personal computer and a laptop computer. These are merely examples and the display device 1 may also be applied to other electronic devices without departing from the present disclosure.

The display device 1 may include a display area DA displaying an image and a non-display area NDA not displaying an image. In some embodiments, the non-display area NDA may be located around the display area DA and may surround the display area DA. The image displayed in the display area DA may be recognized by a user in an arrow direction in the drawing in the third direction Z.

In some embodiments, as shown in FIG. 1, the display device 1 may include, as a schematic stacked structure, a display substrate 10 and a color conversion substrate 30 facing the display substrate 10, and may further include a sealing member 50 for coupling the display substrate 10 and the color conversion substrate 30, and a filler 70 filled between the display substrate 10 and the color conversion substrate 30.

The display substrate 10 may include elements and circuits for displaying an image, for example, a pixel circuit such as a switching element, a pixel defining layer and a self-light emitting element that define an emission area and a non-emission area, which will be described later, in the display area DA. In an embodiment, the self-light emitting element may include at least one of an organic light emitting diode, a quantum dot light emitting diode, an inorganic material-based micro light emitting diode (e.g., micro LED), or an inorganic material-based light emitting diode having a nano size (e.g., nano LED). Hereinafter, for simplicity of description, a case where the self-light emitting element is an organic light emitting element will be described as an example.

The color conversion substrate 30 may be located above the display substrate 10 to face the display substrate 10. In some embodiments, the color conversion substrate 30 may include a color conversion pattern for converting the color of incident light. In some embodiments, the color conversion substrate 30 may include at least one of a color filter and a wavelength conversion pattern as the color conversion pattern. In some embodiments, the color conversion substrate 30 may include both the color filter and the wavelength conversion pattern.

The sealing member 50 may be positioned between the display substrate 10 and the color conversion substrate 30 in the non-display area NDA. The sealing member 50 may be disposed along the edges of the display substrate 10 and the color conversion substrate 30 in the non-display area NDA to surround the display area DA in plan view. The display substrate 10 and the color conversion substrate 30 may be coupled to each other by the sealing member 50.

In some embodiments, the sealing member 50 may be made of an organic material. For example, the sealing member 50 may be made of epoxy resin, but is not limited thereto. In some other embodiments, the sealing member 50 may be applied in the form of a frit including glass or the like.

The filler 70 may be positioned in the space between the display substrate 10 and the color conversion substrate 30 surrounded by the sealing member 50. The filler 70 may fill the space between the display substrate 10 and the color conversion substrate 30.

In some embodiments, the filler 70 may be made of a material capable of transmitting light. In some embodiments, the filler 70 may be made of an organic material. For example, the filler may be made of a silicon-based organic material, an epoxy-based organic material, or a mixture of a silicon-based organic material and an epoxy-based organic material.

In some embodiments, the filler 70 may be made of a material having an extinction coefficient of substantially zero. There is a correlation between a refractive index and the extinction coefficient, and the extinction coefficient decreases as the refractive index decreases. Further, when the refractive index is 1.7 or less, the extinction coefficient may substantially converge to zero. In some embodiments, the filler 70 may be made of a material having a refractive index of 1.7 or less, so that it is possible to prevent or minimize light provided from the self-light emitting element from being absorbed while passing through the filler 70. In some embodiments, the filler 70 may be made of an organic material having a refractive index of 1.4 to 1.6.

Although FIG. 1 illustrates that the display device 1 includes the display substrate 10, the color conversion substrate 30, the sealing member 50, and the filler 70, in some embodiments, the display device 1 may not include the sealing member 50 and the filler 70, and components of the color conversion substrate 30 except a second base portion 310 may be disposed on the display substrate 10.

Figure 2:
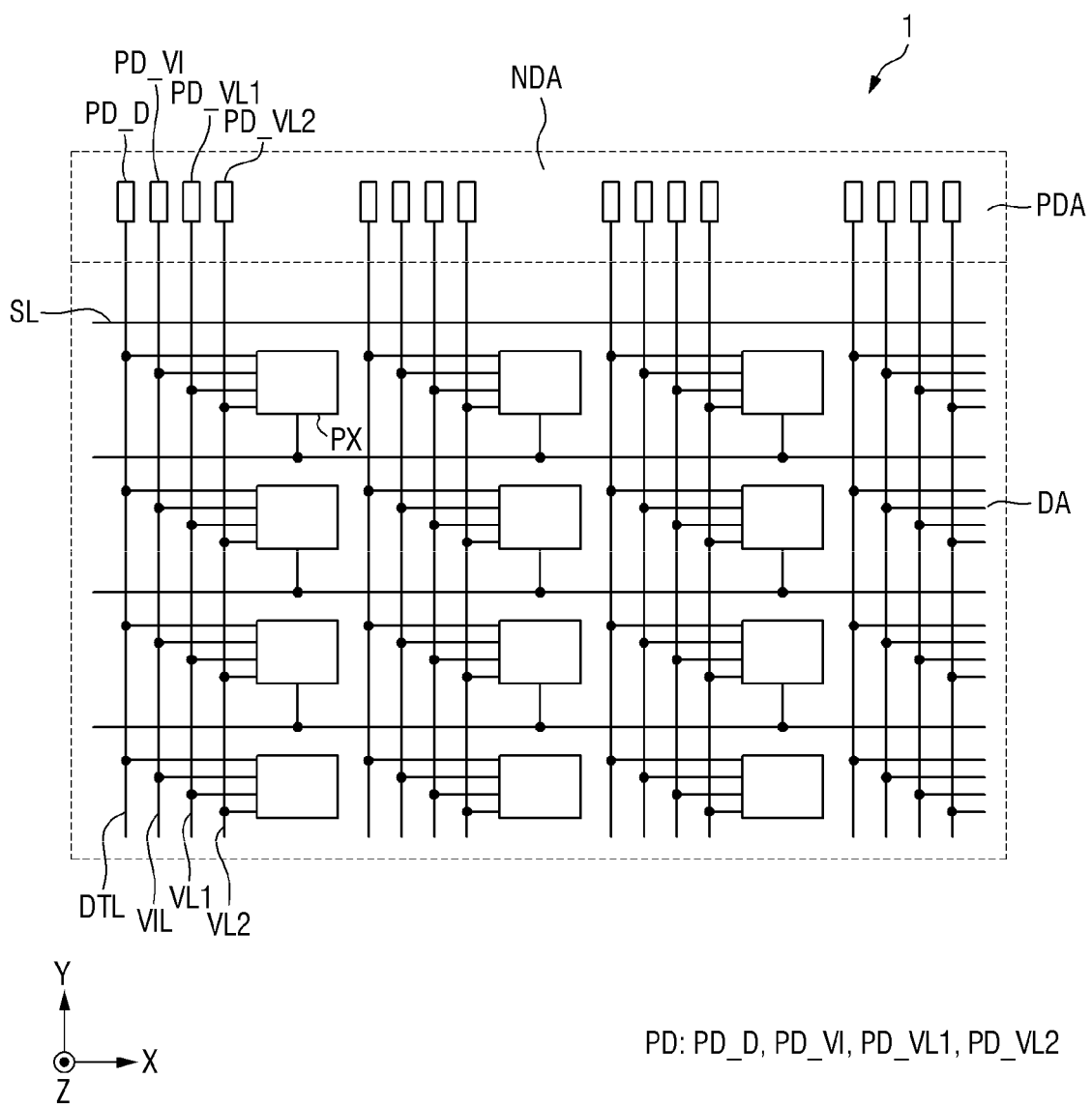
FIG. 2 is a plan view illustrating an arrangement of wires of a display device according to one embodiment.

FIG. 2 is a plan view illustrating an arrangement of wires of a display device according to one embodiment.

Referring to FIG. 2, the display device 1 may include a plurality of wires. The display device may include a plurality of scan lines SL, a plurality of data lines DTL, an initialization voltage line VIL, and a plurality of voltage lines VL (VL1 and VL2). Although not shown in the drawing, other wires may be further provided in the display device.

Each of the data line DTL, the initialization voltage line VIL, and the plurality of voltage lines VL described above may extend in a second direction (Y direction), and the scan line SL may extend in a first direction (X direction). The data line DTL, the initialization voltage line VIL, and the plurality of voltage lines VL may be respectively connected to pads PD disposed in a pad area PDA of the non-display area NDA. The pad PD may include a data pad PD_D connected to the data line DTL, an initialization voltage pad PD_VI connected to the initialization voltage line VIL, and voltage pads PD_VL1 and PD_VL2 respectively connected to the voltage lines VL1 and VL2.

Meanwhile, the term "connected" as used herein may mean not only that one member is connected to another member through a physical contact, but also that one member is connected to another member through yet another member. This may also be understood as one part and the other part as integral elements are connected into an integrated element via another element. Furthermore, if one element is connected to another element, this may be construed as a meaning including an electrical connection via another element in addition to a direct connection in physical contact.

The drawing exemplifies that each of the pads PD is disposed on the pad area PDA disposed on the upper side of the display area DA, but is not limited thereto. Some of the plurality of pads PD may be disposed in any one area on the lower side or on the left and right sides of the display area DA.

Each pixel PX or sub-pixel SPXn (n is an integer of 1 to 3) of the display device 1 includes a pixel driving circuit. The above-described wires may pass through each pixel PX or the vicinity thereof to apply a driving signal to each pixel driving circuit. The pixel driving circuit may include transistors and capacitors. The number of the transistors and the capacitors of each pixel driving circuit may be variously modified. According to one embodiment, in each sub-pixel SPXn of the display device, the pixel driving circuit may have a 3T1C structure including three transistors and one capacitor. Hereinafter, the pixel driving circuit of the 3T1C structure will be described as an example, but the present disclosure is not limited thereto, and various other modified structures such as a 2T1C structure, a 7T1C structure, and a 6T1C structure may be applied.

Figure 3:
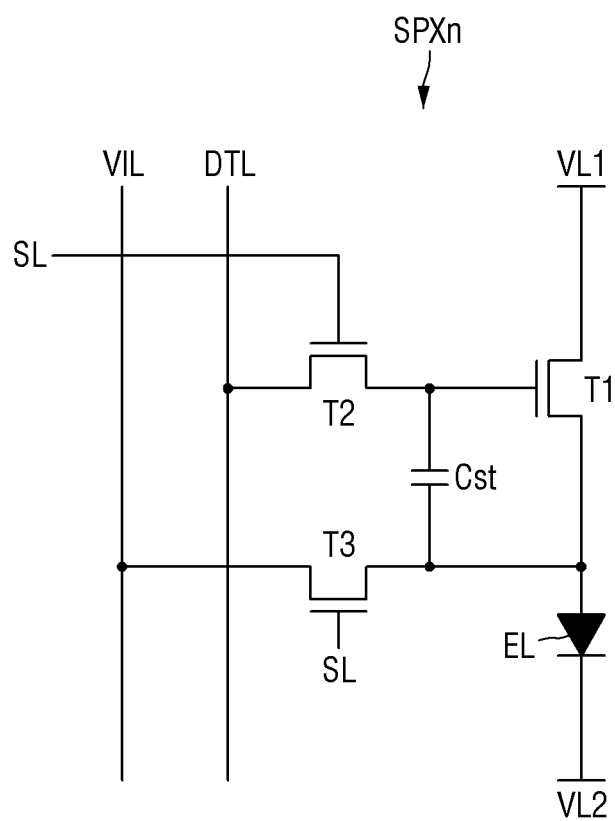
FIG. 3 is a pixel circuit diagram of a display device according to one embodiment.

FIG. 3 is a pixel circuit diagram of a display device according to one embodiment.

Referring to FIG. 3, each sub-pixel SPXn of the display device 1 according to one embodiment includes three transistors T1, T2 and T3 and one storage capacitor Cst in addition to a light emitting diode EL.

The light emitting diode EL emits light by a current supplied through a first transistor T1. The light emitting diode EL includes a first electrode, a second electrode, and at least one light emitting element disposed between them. The light emitting element may emit light of a specific wavelength band by electrical signals transmitted from the first electrode and the second electrode.

One end of the light emitting diode EL may be connected to the source electrode of the first transistor T1, and the other end thereof may be connected to the second voltage line VL2 to which a low potential voltage (hereinafter, a second power voltage) lower than a high potential voltage (hereinafter, a first power voltage) of the first voltage line VL1 is supplied.

The first transistor T1 adjusts a current flowing from the first voltage line VL1, to which the first power voltage is supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1 to which the first power voltage is applied.

The second transistor T2 is turned on by a scan signal of the scan line SL to connect the data line DTL to the gate electrode of the first transistor T1. The gate electrode of the second transistor T2 may be connected to the scan line SL, the source electrode thereof may be connected to the gate electrode of the first transistor T1, and the drain electrode thereof may be connected to the data line DTL.

The third transistor T3 is turned on by a scan signal of the scan line SL to connect the initialization voltage line VIL to one end of the light emitting diode EL. The gate electrode of the third transistor T3 may be connected to the scan line SL, the drain electrode thereof may be connected to the initialization voltage line VIL, and the source electrode thereof may be connected to one end of the light emitting diode EL or to the source electrode of the first transistor T1.

In one embodiment, the source electrode and the drain electrode of each of the transistors T1, T2, and T3 are not limited to those described above, and vice versa. Each of the transistors T1, T2, and T3 may be formed of a thin film transistor. In FIG. 3, each of the transistors T1, T2, and T3 has been described as being formed of an N-type metal oxide semiconductor field effect transistor (MOSFET), but is not limited thereto. For example, each of the transistors T1, T2, and T3 may be formed of a P-type MOSFET. Alternatively, some of the transistors T1, T2, and T3 may be formed of an N-type MOSFET and the others may be formed of a P-type MOSFET.

The storage capacitor Cst is formed between the gate electrode and the source electrode of the first transistor T1. The storage capacitor Cst stores a difference voltage between a gate voltage and a source voltage of the first transistor T1.

Although the embodiment of FIG. 3 illustrates that the gate electrodes of the second transistor T2 and the third transistor T3 are connected to the same scan line SL and, thus, the second transistor T2 and the third transistor T3 are simultaneously turned on by the scan signal applied from the same scan line, the present disclosure is not limited thereto, and the gate electrode of the second transistor T2 may be connected to any one scan line SL, and the gate electrode of the third transistor T3 may be connected to another scan line SL different from the any one scan line SL.

Figure 4:
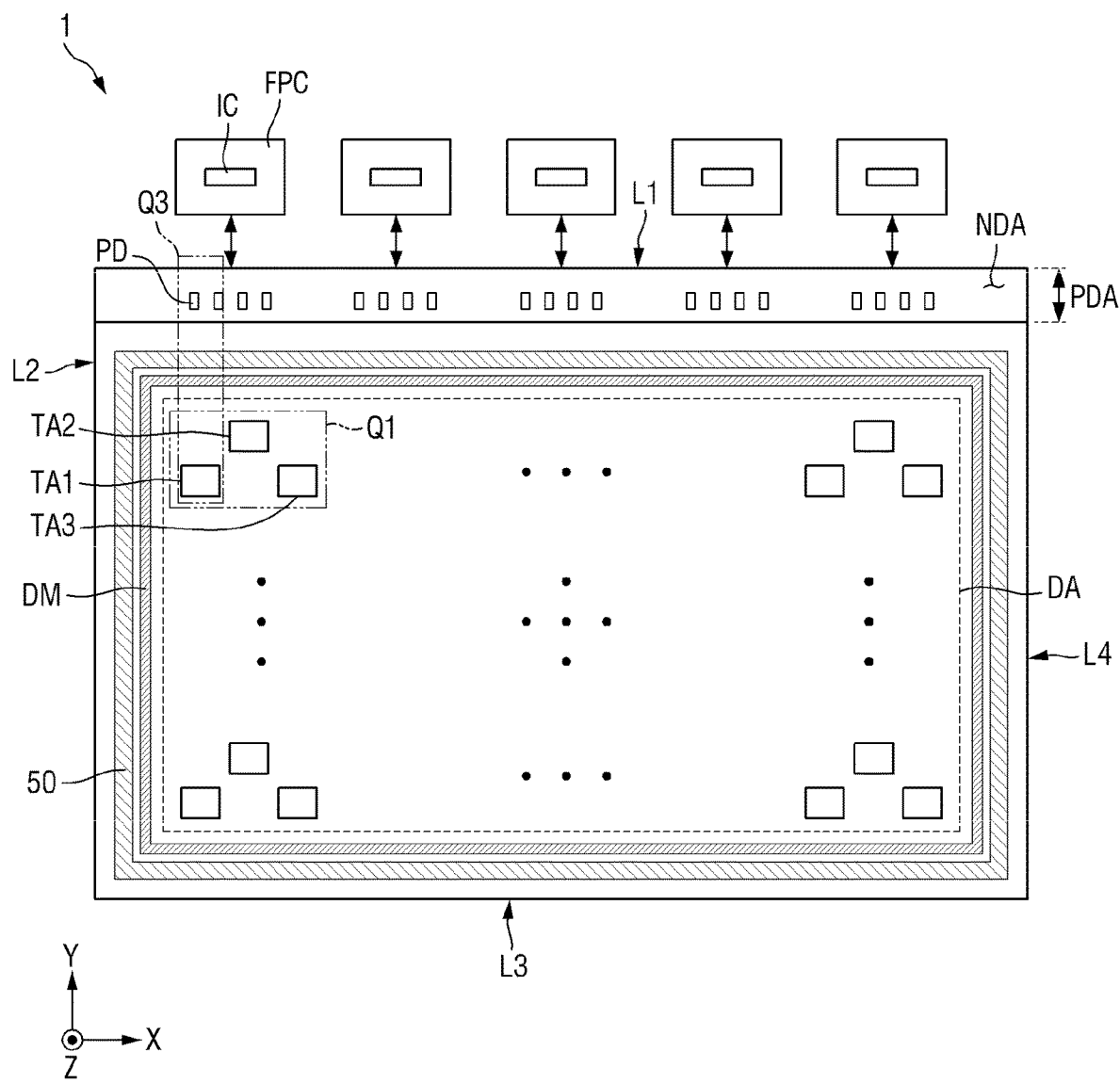
FIG. 4 is a plan view of a display device according to one embodiment.
Figure 5:
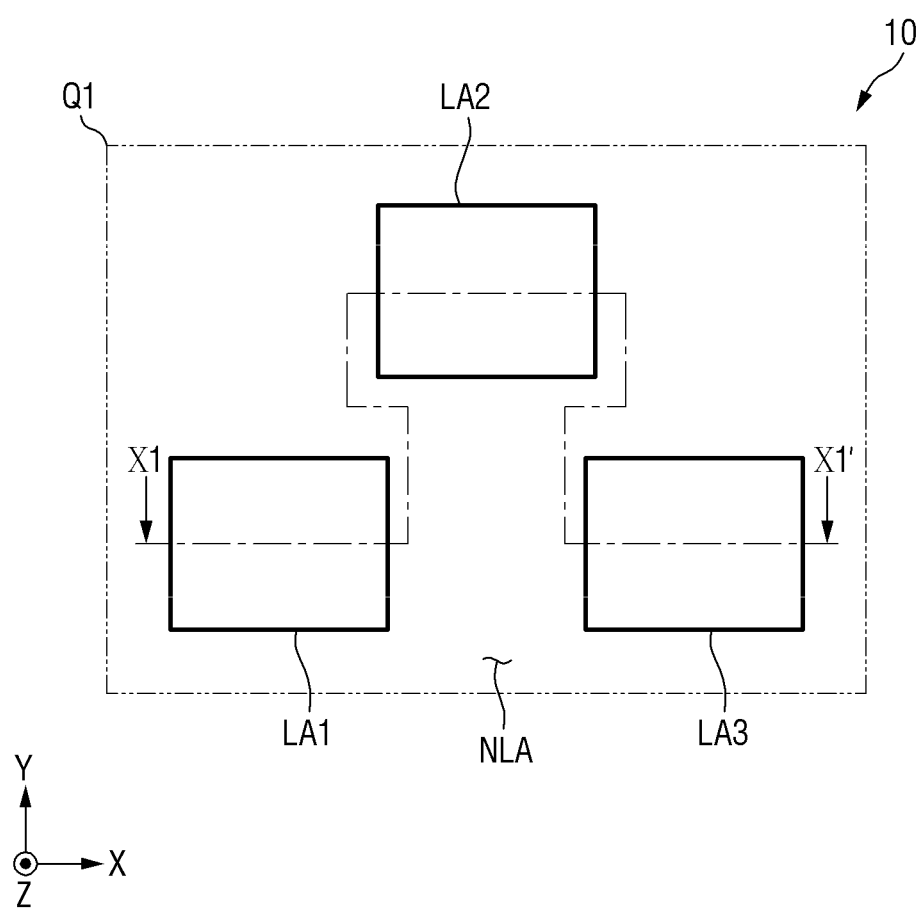
FIG. 5 is an enlarged plan view of area Q1 of FIG. 4, and more specifically, is a schematic plan view of a display substrate included in the display device of FIG. 4.
Figure 6:
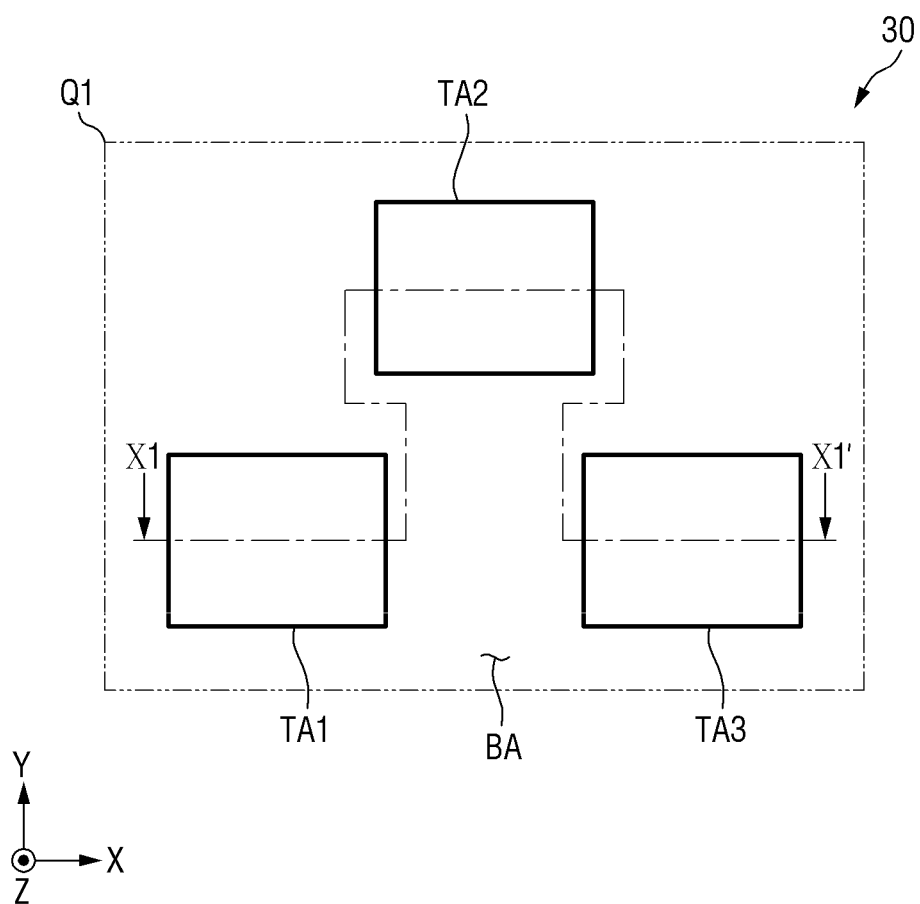
FIG. 6 is an enlarged plan view of area Q1 of FIG. 4, and more specifically, is a schematic plan view of a color conversion substrate included in the display device of FIG. 4.
Figure 7:
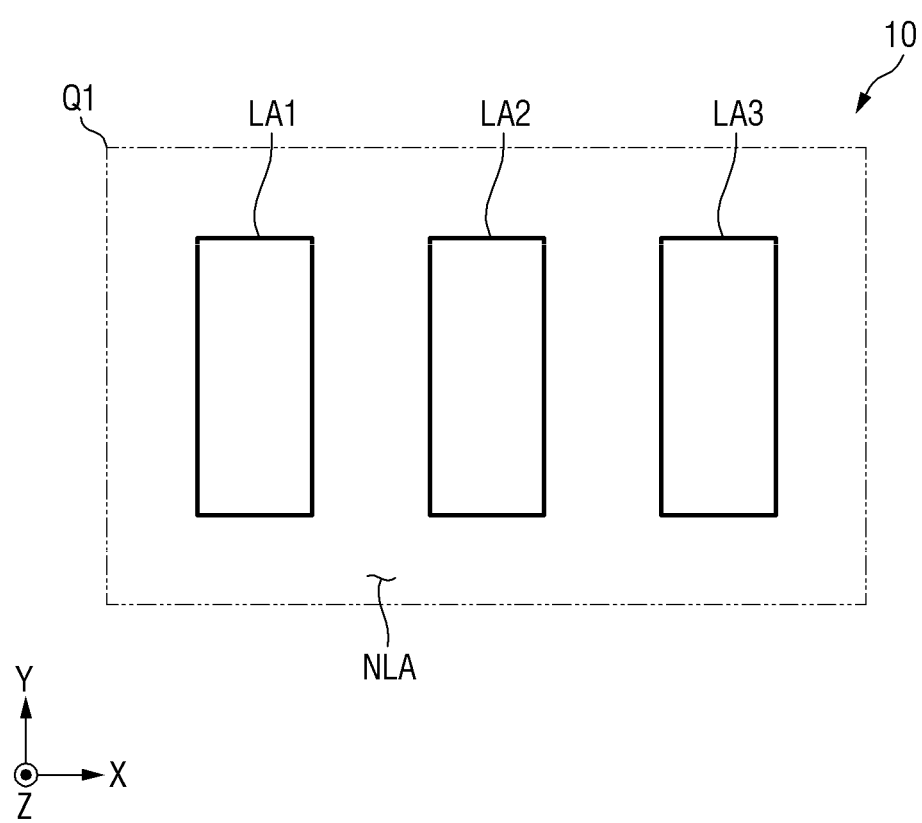
FIG. 7 is a plan view showing a modified example of FIG. 5.
Figure 8:
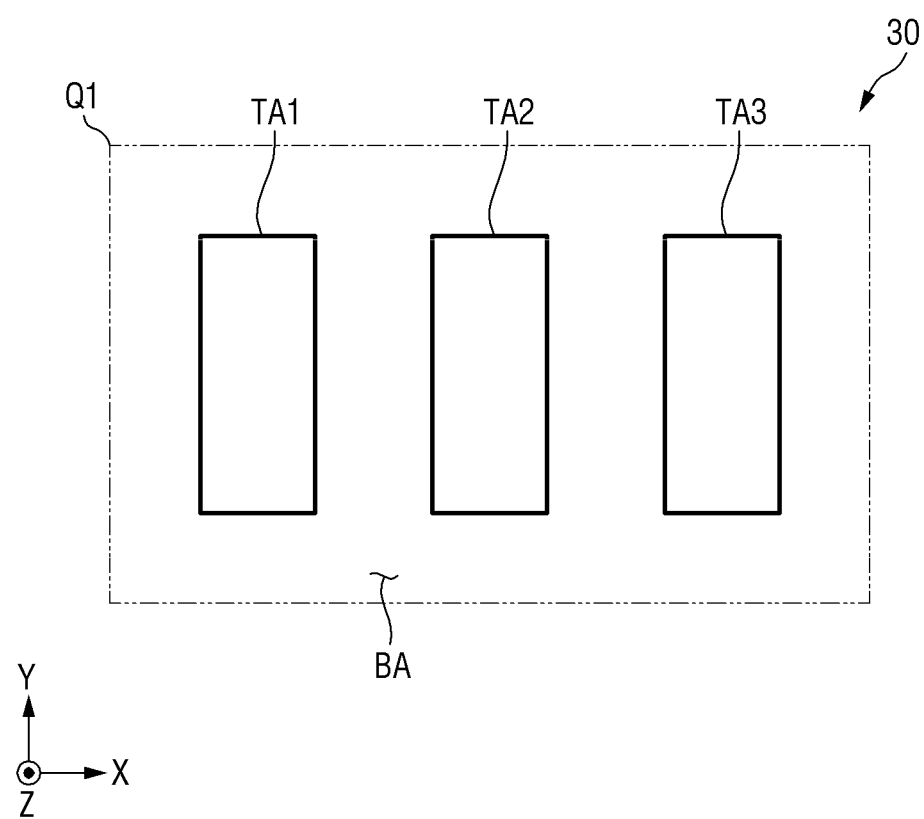
FIG. 8 is a plan view showing a modified example of FIG. 6.
Figure 9:
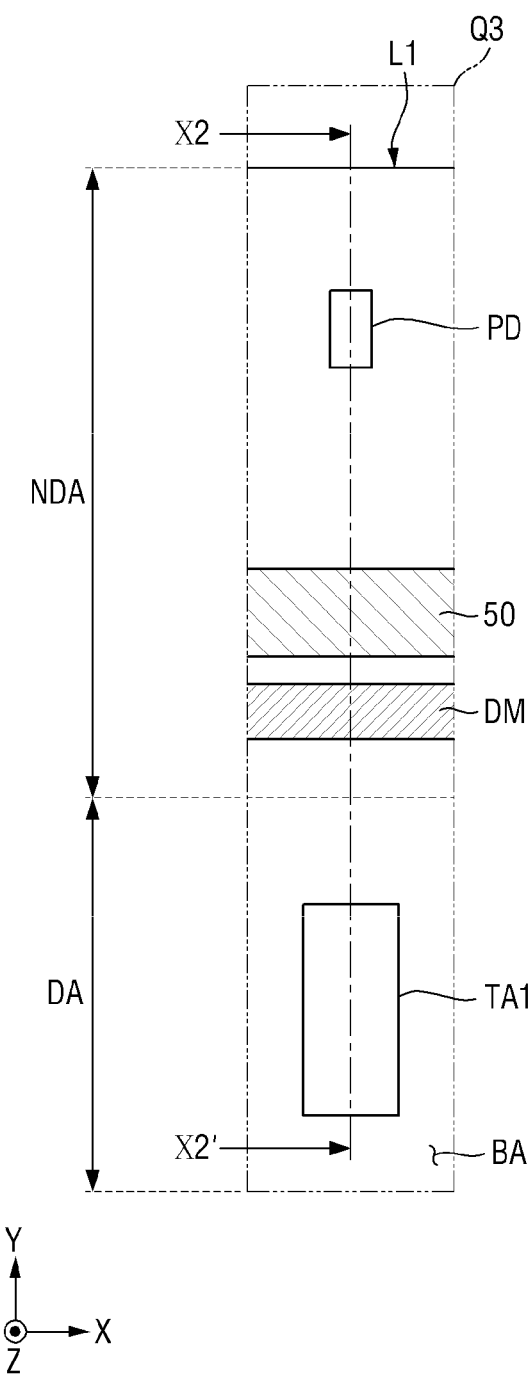
FIG. 9 is an enlarged plan view of area Q3 of FIG. 4.

FIG. 4 is a plan view of a display device according to one embodiment. FIG. 5 is an enlarged plan view of area Q1 of FIG. 4, and more specifically, is a schematic plan view of a display substrate included in the display device of FIG. 4. FIG. 6 is an enlarged plan view of area Q1 of FIG. 4, and more specifically, is a schematic plan view of a color conversion substrate included in the display device of FIG. 4. FIG. 7 is a plan view showing a modified example of FIG. 5. FIG. 8 is a plan view showing a modified example of FIG. 6. FIG. 9 is an enlarged plan view of area Q3 of FIG. 4.

Referring further to FIGS. 4 to 9 in addition to FIG. 1, in some embodiments, as shown in FIG. 4, the display device 1 may have a rectangular shape in plan view. The display device 1 may include a first side L1 and a third side L3 extending in the first direction (X direction) and a second side L2 and a fourth side L4 extending in the second direction (Y direction) intersecting the first direction (X direction). The corners where the sides of the display device 1 meet may be right-angled, but is not limited thereto. In some embodiments, the lengths of the first sides L1 and the third sides L3 and the lengths of the second sides L2 and the fourth sides L4 may be different from each other. For example, the first sides L1 and the third sides L3 may be relatively longer than the second sides L2 and the fourth sides L4. The planar shape of the display device 1 is not limited to the exemplified one, but may have a circular shape or other shapes.

In some embodiments, the display device 1 may further include a flexible circuit board FPC and a driving chip IC.

As shown in FIG. 5, in the display area DA, a plurality of emission areas LA1, LA2, LA3 and a non-emission area NLA may be defined on the display substrate.

In some embodiments, a first emission area LA1, a second emission area LA2, and a third emission area LA3 may be defined in the display area DA of the display substrate 10. The first emission area LA1, the second emission area LA2, and the third emission area LA3 may be areas in which light generated by the light emitting element of the display substrate 10 is emitted to the outside of the display substrate 10, and the non-emission area NLA may be an area in which light is not emitted to the outside of the display substrate 10. In some embodiments, the non-emission area NLA may surround each of the first emission area LA1, the second emission area LA2, and the third emission area LA3 in the display area DA.

In some embodiments, the light emitted to the outside in the first emission area LA1, the second emission area LA2, and the third emission area LA3 may be light of a third color. In some embodiments, the light of the third color may be blue light, and may have a peak wavelength within a range of about 440 nm to about 480 nm. Here, the peak wavelength means a wavelength at which the intensity of light is maximum.

In some embodiments, the first emission area LA1, the second emission area LA2, and the third emission area LA3 may form one group, and a plurality of groups may be defined in the display area DA.

As illustrated in FIG. 5, the first emission area LA1 and the third emission area LA3 may be adjacent to each other along the first direction (X direction), and the second emission area LA2 may be located at one sides of the first emission area LA1 and the third emission area LA3 along the second direction (Y direction). However, the present disclosure is not limited thereto, and the arrangement of the first emission area LA1, the second emission area LA2, and the third emission area LA3 may be variously changed. For example, as illustrated in FIG. 5, the first emission area LA1, the second emission area LA2, and the third emission area LA3 may be sequentially positioned along the first direction (X direction). In some embodiments, in the display area DA, the first emission area LA1, the second emission area LA2, and the third emission area LA3 may form one group and be repeatedly arranged along the first direction (X direction) and the second direction (Y direction).

Hereinafter, a case in which the first emission area LA1, the second emission area LA2, and the third emission area LA3 are arranged as shown in FIG. 5 will be described as an example.

As shown in FIG. 6, in the display area DA, a plurality of light transmitting areas TA1, TA2, and TA3 and a light blocking area BA may be defined on the color conversion substrate 30. The light transmitting areas TA1, TA2, and TA3 may be regions where light emitted from the display substrate 10 passes through the color conversion substrate 30 and is provided to the outside of the display device 1. The light blocking area BA may be a region where light emitted from the display substrate 10 does not transmit.

In some embodiments, a first light transmitting area TA1, a second light transmitting area TA2, and a third light transmitting area TA3 may be defined on the color conversion substrate 30.

The first light transmitting area TA1 may correspond to or overlap the first emission area LA1. Similarly, the second light transmitting area TA2 may correspond to or overlap the second emission area LA2, and the third light transmitting area TA3 may correspond to or overlap the third emission area LA3.

When the first emission area LA1 and the third emission area LA3 may be adjacent to each other along the first direction (X direction) and the second emission area LA2 is located at one sides of the first emission area LA1 and the third emission area LA3 along the second direction (Y direction) as shown in FIG. 5, the first light transmitting area TA1 and the third light transmitting area TA3 may be adjacent to each other along the first direction (X direction) and the second light transmitting area TA2 may be located at one sides of the first light transmitting area TA1 and the third light transmitting area TA3 along the second direction (Y direction) as shown in FIG. 4.

In some embodiments, when the first emission area LA1, the second emission area LA2, and the third emission area LA3 are sequentially positioned along the first direction (X direction) as shown in FIG. 7, the first light transmitting area TA1, the second light transmitting area TA2, and the third light transmitting area TA3 may also be sequentially positioned along the first direction (X direction) as shown in FIG. 8.

In some embodiments, each of the first light transmitting area TA1, the second light transmitting area TA2, and the third light transmitting area TA3 may have a quadrilateral shape in plan view. For example, the quadrilateral shape may be a rectangular shape or a square shape. However, the present disclosure is not limited thereto, and each of the first light transmitting area TA1, the second light transmitting area TA2, and the third light transmitting area TA3 may have a circular shape, an elliptical shape, or another polygonal shape in plan view.

In some embodiments, the light of the third color provided from the display substrate 10 may pass through the first light transmitting area TA1, the second light transmitting area TA2, and the third light transmitting area TA3 may be provided to the outside of the display device 1. When the light emitted from the first light transmitting area TA1 to the outside of the display device 1 is referred to as first emission light, the light emitted from the second light transmitting area TA2 to the outside of the display device 1 is referred to as second emission light and the light emitted from the third light transmitting area TA3 to the outside of the display device 1 is referred to as third emission light, the first emission light may be light of a first color, the second emission light may be light of a second color different from the first color, and the third emission light may be light of a third color. In some embodiments, the light of the third color may be blue light having a wavelength range of 380 nm to 500 nm and having a peak wavelength within a range of 440 nm to 480 nm, and the light of the first color may be red light having a wavelength range of 600 nm to 780 nm and having a peak wavelength within a range of 610 nm to 650 nm. Further, the light of the second color may be green light having a wavelength range of 500 nm to 600 nm and having a peak wavelength within a range of 510 nm to 550 nm.

The light blocking area BA may be positioned around the first light transmitting area TA1, the second light transmitting area TA2, and the third light transmitting area TA3 of the color conversion substrate 30 in the display area DA. In some embodiments, the light blocking area BA may surround the first light transmitting area TA1, the second light transmitting area TA2, and the third light transmitting area TA3. Further, the light blocking area BA may also be positioned in the non-display area NDA of the display device 1.

Meanwhile, as shown in FIG. 6, in the display area DA, the plurality of light transmitting areas TA1, TA2, and TA3 and the light blocking area BA may be defined on the color conversion substrate 30. The light transmitting areas TA1, TA2, and TA3 may be regions where light emitted from the display substrate 10 passes through the color conversion substrate 30 and is provided to the outside of the display device 1. The light blocking area BA may be a region where light emitted from the display substrate 10 does not transmit.

Referring back to FIG. 4, a dam member DM and the sealing member 50 may be disposed in the non-display area NDA of the display device 1.

The dam member DM may block an organic material (or monomer) from overflowing in a process of forming an encapsulation layer disposed in the display area DA, so that it is possible to prevent the organic material of the encapsulation layer from extending toward the edge of the display device 1.

In some embodiments, the dam member DM may be disposed to completely surround the display area DA in plan view.

The sealing member 50 may couple the display substrate 10 and the color conversion substrate 30 to each other as described above.

The sealing member 50 may be positioned more outward than the dam member DM in the non-display area NDA, and may be disposed to completely surround the dam member DM and the display area DA in plan view.

The non-display area NDA of the display device 1 may include the pad area PDA, and the plurality of connection pads PD described above may be positioned in the pad area PDA.

In the display device 1, the display substrate 10 (see FIG. 1) may include the above-described dam member DM and the connection pad PD.

The flexible circuit board FPC may be connected to the connection pad PD. The flexible circuit board FPC may electrically connect the display substrate 10 (see FIG. 1) and a circuit board that provides a signal and power for driving the display device 1.

The driving chip IC may be electrically connected to the circuit board to receive data and a signal. In some embodiments, the driving chip IC may be a data driving chip, and may receive a data control signal and image data from the circuit board and generate and output a data voltage corresponding to the image data.

In some embodiments, the driving chip IC may be mounted on the flexible circuit board FPC. For example, the driving chip IC may be mounted on the flexible circuit board FPC in the form of a chip on film (COF).

The data voltage provided from the driving chip IC, and the power provided from the circuit board may be transmitted to the pixel circuit of the display substrate 10 (see FIG. 1) via the flexible circuit board FPC and the connection pad PD.

Hereinafter, the structure of the display device 1 will be described in more detail.

Figure 10:
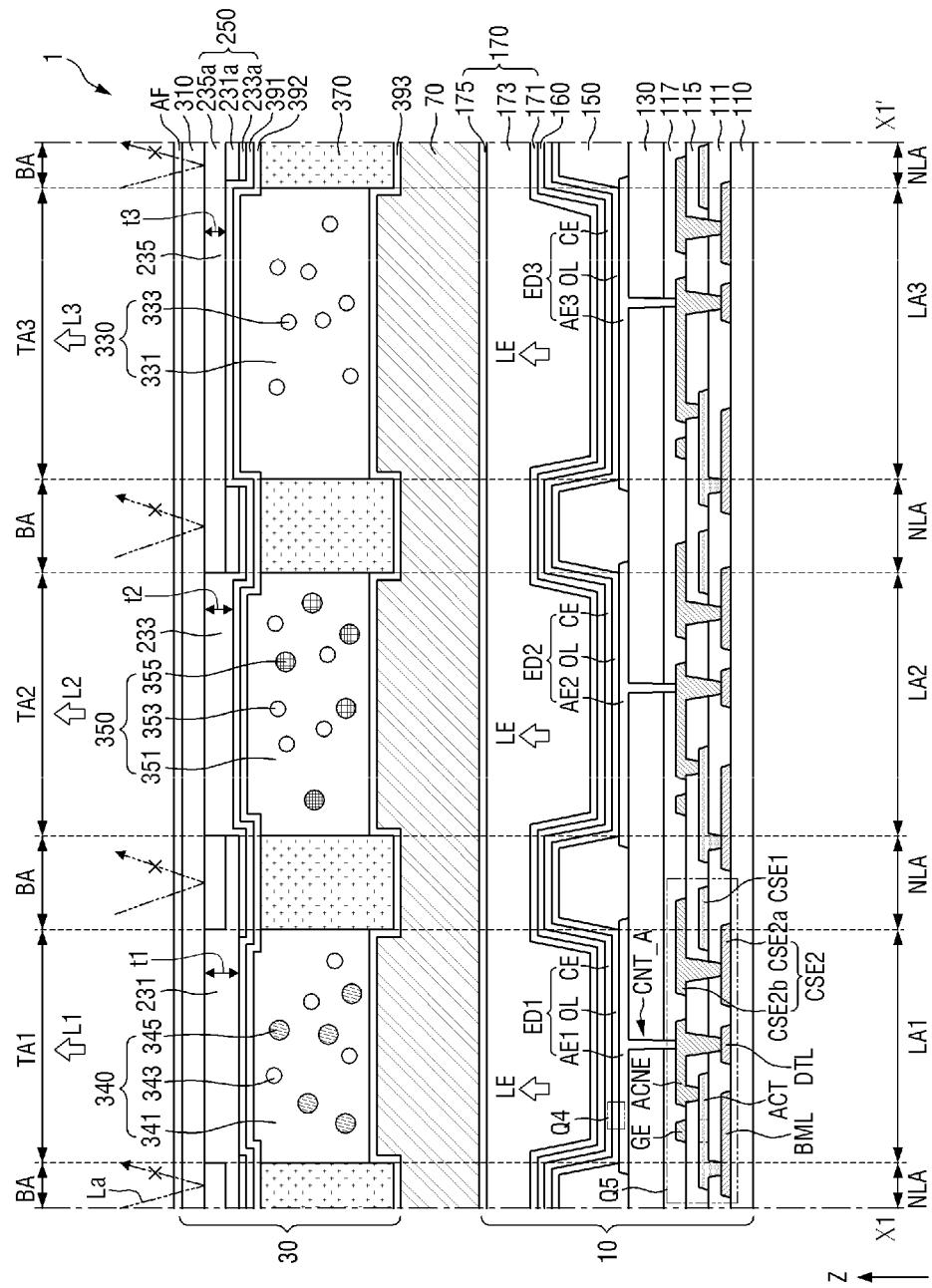
FIG. 10 is a cross-sectional view of a display device according to one embodiment taken along line X1-X1' of FIGS. 5 and 6.
Figure 11:
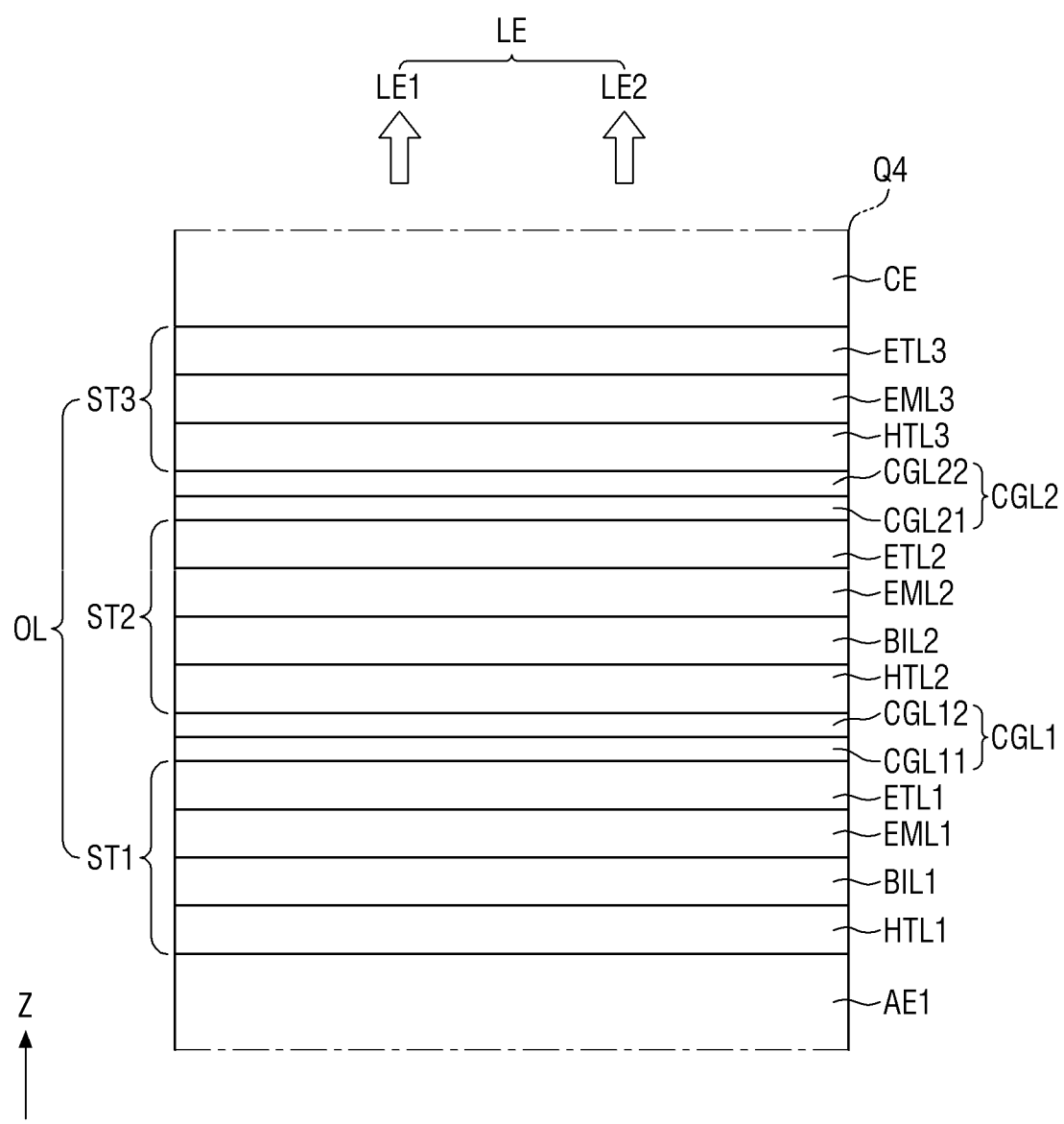
FIG. 11 is an enlarged cross-sectional view of area Q4 of FIG. 10.
Figure 12:
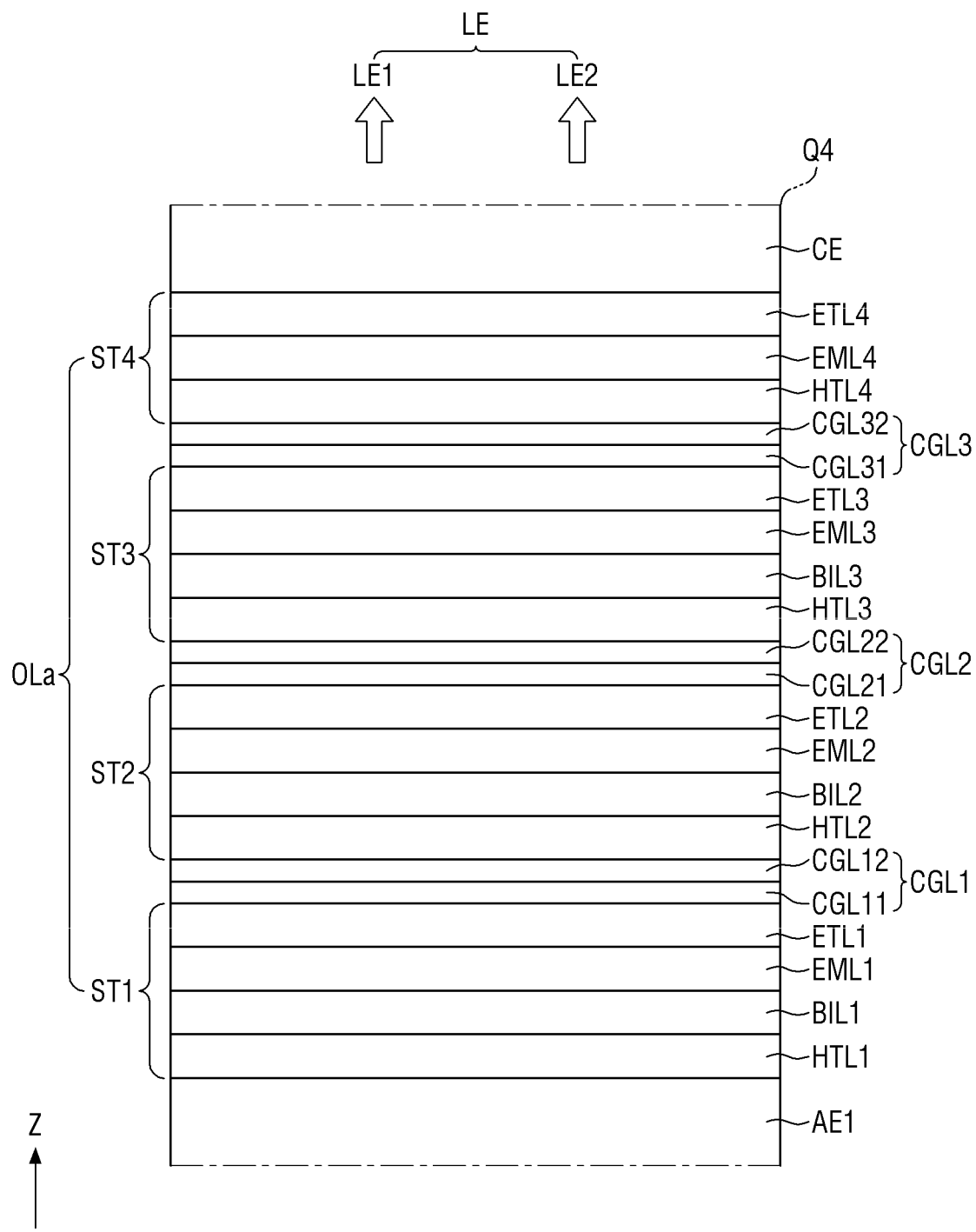
FIG. 12 is a cross-sectional view showing a modified example of the structure shown in FIG. 11.
Figure 13:
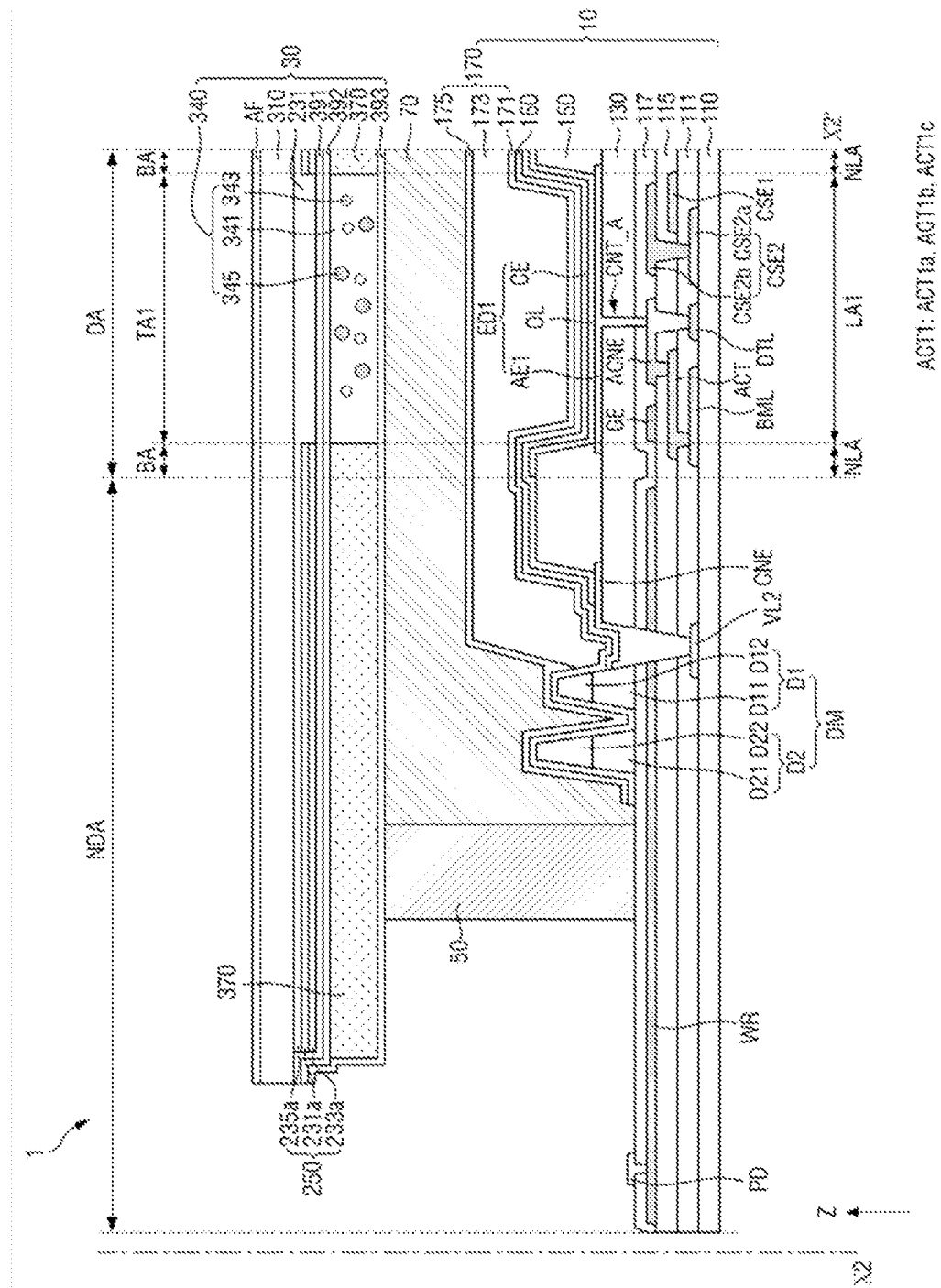
FIG. 13 is a cross-sectional view of a display device according to one embodiment taken along line X2-X2' of FIG. 9.

FIG. 10 is a cross-sectional view of a display device according to one embodiment taken along line X1-X1' of FIGS. 5 and 6. FIG. 11 is an enlarged cross-sectional view of area Q4 of FIG. 10. FIG. 12 is a cross-sectional view showing a modified example of the structure shown in FIG. 11. FIG. 13 is a cross-sectional view of a display device according to one embodiment taken along line X2-X2' of FIG. 9.

Referring further to FIGS. 10 to 13 in addition to FIGS. 1 to 9, the display device 1 may include the display substrate 10 and the color conversion substrate 30 as described above, and may further include the filler 70 positioned between the display substrate 10 and the color conversion substrate 30.

Hereinafter, the display substrate 10 will be described.

The first base portion 110 may be made of a light transmissive material. In some embodiments, the first base portion 110 may be a glass substrate or a plastic substrate. When the first base portion 110 is a plastic substrate, the first base portion 110 may have flexibility.

In some embodiments, in the display area DA, the plurality of emission areas LA1, LA2, and LA3 and the non-emission area NLA may be defined at the first base portion 110 as described above.

In some embodiments, the first side L1, the second side L2, the third side L3, and the fourth side L4 of the display device 1 may be the same as four sides of the first base portion 110. That is, the first side L1, the second side L2, the third side L3, and the fourth side L4 of the display device 1 may be referred to as the first side L1, the second side L2, the third side L3, and the fourth side L4 of the first base portion 110, respectively.

A first conductive layer may be positioned on the first base portion 110. The first conductive layer may include a lower light blocking layer BML, the data line DTL, and a first sub-capacitance electrode CSE2a of a second capacitance electrode CSE2. The lower light blocking layer BML may overlap a semiconductor pattern ACT to be described later in the thickness direction, the data line DTL may overlap a second line portion to be described later in the thickness direction, and the first sub-capacitance electrode CSE2a may overlap a first capacitance electrode CSE1 in the thickness direction.

The lower light blocking layer BML may block incidence of external light or light from the light emitting element into the semiconductor pattern, so that it is possible to prevent a leakage current from occurring due to light in a thin film transistor to be described later or to reduce a leakage current.

In some embodiments, the first conductive layer may be made of a material that blocks light and has conductivity. For example, the first conductive layer may include a single material among metals such as silver (Ag), nickel (Ni), gold (Au), platinum (Pt), aluminum (Al), copper (Cu), molybdenum (Mo), titanium (Ti), and neodymium (Nd), or an alloy thereof. In some embodiments, the first conductive layer may have a single-layer or multi-layer structure. For example, when the first conductive layer has a multi-layer structure, the first conductive layer may be a stacked structure of titanium (Ti)/copper (Cu)/indium tin oxide (ITO) or a stacked structure of titanium (Ti)/copper (Cu)/aluminum oxide ($Al_2O_3$), but the present disclosure is not limited thereto.

In some embodiments, a plurality of lower light blocking layers BML may be provided to correspond to the semiconductor patterns ACT and may overlap the semiconductor patterns ACT.

A buffer layer 111 may be positioned on the first conductive layer. The buffer layer 111 may be positioned on the first base portion 110 and may be disposed in the display area DA and the non-display area NDA. The buffer layer 111 may block foreign substances or moisture permeating through the first base portion 110. For example, the buffer layer 111 may include an inorganic material such as $SiO_2$, SiNx, or SiON, and may be formed as a single layer or multiple layers.

A semiconductor layer may be disposed on the buffer layer 111. The semiconductor pattern ACT and the first capacitance electrode CSE1 may be positioned on the semiconductor layer. The semiconductor layer may be disposed in the display area DA and the non-display area NDA. The semiconductor layer may be disposed to correspond to each of the first emission area LA1, the second emission area LA2, and the third emission area LA3 in the display area DA, and may constitute the above-described lines SL, DTL, VIL, VL1, and VL2. As described above, the semiconductor pattern ACT may constitute the semiconductor patterns of the thin film transistors T1, T2, and T3 of FIG. 3.

Meanwhile, the semiconductor pattern ACT may be electrically connected to each of the lower light blocking layer BML and the data line DTL. For example, the other side (second area ACTb of FIG. 17) of the semiconductor pattern ACT may be electrically connected to the lower light blocking layer BML while penetrating the buffer layer 111, and one side (third area ACTc of FIG. 17) of the semiconductor pattern ACT may be electrically connected to the data line DTL through a first connection electrode ACNE to be described later.

The first capacitance electrode CSE1 may overlap the first sub-capacitance electrode CSE2a in the thickness direction. The first capacitance electrode CSE1 may overlap a second sub-capacitance electrode CSE2b to be described later in the thickness direction. The first capacitance electrode CSE1 may be disposed between the first sub-capacitance electrode CSE2a and the second sub-capacitance electrode CSE2b.

In some embodiments, the semiconductor layer may include an oxide semiconductor. For example, the semiconductor layer may be made of a Zn oxide-based material such as Zn oxide, In—Zn oxide, or Ga—In—Zn oxide, or may be an In—Ga—Zn—O (IGZO) semiconductor in which metals such as indium (In) and gallium (Ga) are contained in ZnO. However, the present disclosure is not limited thereto, and the semiconductor layer may include amorphous silicon or polysilicon.

Further specific components of the semiconductor pattern ACT, the connection between the semiconductor pattern ACT and the lower light blocking layer BML, and the connection between the semiconductor pattern ACT and the data line DTL will be described in detail later.

A gate insulating layer 115 may be positioned on the semiconductor layer. In some embodiments, the gate insulating layer 115 may be positioned in the display area DA and the non-display area NDA. In some embodiments, the gate insulating layer 115 may include an inorganic material such as $SiO_2$, SiNx, SiON, $Al_2O_3$, $TiO_2$, $Ta_2O$, $HfO_2$, $ZrO_2$, or the like.

A second conductive layer (or gate conductive layer) may be positioned on the gate insulating layer 115, and the second conductive layer may include a gate electrode GE, a gate metal WR, and the first connection electrode ACNE. The gate electrode GE may be positioned in the display area DA and may be disposed to overlap each semiconductor pattern ACT. As illustrated in FIG. 13, the gate metal WR may include some of the lines that electrically connect the connection pad PD (see FIG. 2) and the elements positioned in the display area DA (see FIG. 2), such as the thin film transistors T1, T2, and T3 and the light emitting element. The first connection electrode ACNE may be electrically connected to the semiconductor pattern ACT. The first connection electrode ACNE may be located at one side (the third area ACTc of FIG. 17) of the semiconductor pattern ACT. The first connection electrode ACNE may be electrically connected to the third area ACTc while penetrating the gate insulating layer 115 and also connected to data line DTL while penetrating the gate insulating layer 115 and the buffer layer 111.

The gate electrode GE, the gate metal WR, and the first connection electrode ACNE may include one or more materials among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in consideration of adhesion with an adjacent layer, surface flatness of a stacked layer, processability, and the like, and may be formed as a single layer or multiple layers.

A passivation layer 117 may be positioned on the second conductive layer. In some embodiments, the passivation layer 117 may be positioned in the display area DA and the non-display area NDA. In some embodiments, the passivation layer 117 may include an inorganic material such as $SiO_2$, SiNx, SiON, $Al_2O_3$, $TiO_2$, $Ta_2O$, $HfO_2$, or $ZrO_2$, or an organic material such as acrylic resin, epoxy resin, imide resin, or ester resin.

A via layer 130 may be positioned on the passivation layer 117. The via layer 130 may cover the thin film transistors T1, T2, and T3 in the display area DA.

In some embodiments, the via layer 130 may be a planarization layer. In some embodiments, the via layer 130 may be made of an organic material. For example, the via layer 130 may include acrylic resin, epoxy resin, imide resin, ester resin, or the like. In some embodiments, the via layer 130 may include a photosensitive organic material.

In the display area DA, a first anode electrode AE1, a second anode electrode AE2, and a third anode electrode AE3 may be positioned on the via layer 130. Each of the anode electrodes AE1, AE2, and AE3 may correspond to the first electrode of FIG. 3. Further, the connection electrode CNE may be positioned on the via layer 130 in the non-display area NDA.

The first anode electrode AE1 may overlap the first emission area LA1 and may partially extend to the non-emission area NLA. The second anode electrode AE2 may overlap the second emission area LA2 and may partially extend to the non-emission area NLA, and the third anode electrode AE3 may overlap the third emission rea LA3 and may partially extend to the non-emission area NLA.

The first anode electrode AE1 may be connected to one side ACTc (see FIG. 17) of the semiconductor pattern ACT of the thin film transistors T1 and T3 corresponding to the first anode electrode AE1 through a contact hole CNT_A penetrating the via layer 130, the second anode electrode AE2 may be connected to one side ACTc (see FIG. 17) of the semiconductor pattern ACT of the thin film transistors T1 and T3 corresponding to the second anode electrode AE2 through the contact hole CNT_A penetrating the via layer 130, and the third anode electrode AE3 may be connected to one side ACTc (see FIG. 17) of the semiconductor pattern ACT of the thin film transistors T1 and T3 corresponding to the third anode electrode AE3 through the contact hole CNT_A penetrating the via layer 130.

In some embodiments, the first anode electrode AE1, the second anode electrode AE2, and the third anode electrode AE3 may be reflective electrodes. In this case, the first anode electrode AE1, the second anode electrode AE2 and the third anode electrode AE3 may be a metal layer containing metal such as Ag, Mg, Al, Pt, Pd, Au, Ni, Nd, Ir, or Cr. In another embodiment, the first anode electrode AE1, the second anode electrode AE2 and the third anode electrode AE3 may further include a metal oxide layer stacked on the metal layer. In an embodiment, the first anode electrode AE1, the second anode electrode AE2, and the third anode electrode AE3 may have a multi-layer structure, e.g., a two-layer structure of ITO/Ag, Ag/ITO, ITO/Mg, ITO/MgF or a three-layer structure of ITO/Ag/ITO.

The connection electrode CNE may be electrically connected to the second voltage line VL2 in the non-display area NDA, and may be in direct contact with the second voltage line VL2.

The connection pad PD may be disposed in the non-display area NDA, and may be electrically connected to the gate metal WR of the above-described second conductive layer.

A pixel defining layer 150 may be positioned on the first anode electrode AE1, the second anode electrode AE2 and the third anode electrode AE3. The pixel defining layer 150 may include an opening exposing the first anode electrode AE1, an opening exposing the second anode electrode AE2 and an opening exposing the third anode electrode AE3, and may define the first emission area LA1, the second emission area LA2, the third emission area LA3 and the non-emission area NLA. That is, a region of the first anode electrode AE1 which is exposed without being covered by the pixel defining layer 150 may be the first emission area LA1. Similarly, a region of the second anode electrode AE2 which is exposed without being covered by the pixel defining layer 150 may be the second emission area LA2, and a region of the third anode electrode AE3 which is exposed without being covered by the pixel defining layer 150 may be the third emission area LA3. Further, a region where the pixel defining layer 150 is located may be the non-emission area NLA.

In some embodiments, the pixel defining layer 150 may include an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB).

In some embodiments, the pixel defining layer 150 may overlap a light blocking pattern 250 to be described later. Further, in some embodiments, the pixel defining layer 150 may also overlap a bank pattern 370 to be described later.

As illustrated in FIGS. 10 and 13, a light emitting layer OL may be positioned on the first anode electrode AE1, the second anode electrode AE2, and the third anode electrode AE3.

In some embodiments, the light emitting layer OL may have a shape of a continuous film formed over the plurality of emission areas LA1, LA2, and LA3 and the non-emission area NLA. Although it is illustrated in the drawing that the light emitting layer OL is positioned only in the display area DA, the present disclosure is not limited thereto. In some other embodiments, a part of the light emitting layer OL may be further positioned in the non-display area NDA.

A cathode electrode CE may be located on the light emitting layer OL. The cathode electrode CE may correspond to the second electrode of FIG. 3. A part of the cathode electrode CE may be further positioned in the non-display area NDA. The cathode electrode CE may be electrically connected to the connection electrode CNE in the non-display area NDA and may be in contact with the connection electrode CNE. The second power voltage provided to the second voltage line VL2 may be transmitted to the cathode electrode CE via the connection electrode CNE.

In some embodiments, the cathode electrode CE may have a semi-transmissive or transmissive property. When the cathode electrode CE has a semi-transmissive property, the cathode electrode CE may include Ag, Mg, Cu, Al, Pt, Pd, Au, Ni, Nd, Ir, Cr, Li, Ca, LiF/Ca, LiF/Al, Mo, Ti or a compound or mixture thereof, such as a mixture of Ag and Mg. In addition, when the cathode electrode CE has a thickness of tens to hundreds of angstroms, the cathode electrode CE may have a semi-transmissive property.

When the cathode electrode CE has a transmissive property, the cathode electrode CE may include a transparent conductive oxide (TCO). For example, the cathode electrode CE may include tungsten oxide (WxOy), titanium oxide ($TiO_2$), indium tin oxide (ITO), indium zinc oxide (IZO), zinc oxide (ZnO), indium tin zinc oxide (ITZO), magnesium oxide (MgO) or the like.

In some embodiments, the cathode electrode CE may completely cover the light emitting layer OL. In some embodiments, as shown in FIG. 13, the end of the cathode electrode CE may be positioned relatively more outward than the end of the light emitting layer OL, and the end of the light emitting layer OL may be completely covered by the cathode electrode CE.

The first anode electrode AE1, the light emitting layer OL and the cathode electrode CE may constitute a first light emitting element ED1. The second anode electrode AE2, the light emitting layer OL and the cathode electrode CE may constitute a second light emitting element ED2. The third anode electrode AE3, the light emitting layer OL and the cathode electrode CE may constitute a third light emitting element ED3. Each of the first light emitting element ED1, the second light emitting element ED2, and the third light emitting element ED3 may emit an emission light LE.

As illustrated in FIG. 11, the emission light LE ultimately emitted from the light emitting layer OL may be a mixed light in which a first component LE1 and a second component LE2 are mixed. Each of the first component LE1 and the second component LE2 in the emission light LE may have a peak wavelength within a range of 440 nm or more and less than 480 nm. That is, the emission light LE may be blue light.

As illustrated in FIG. 11, in some embodiments, the light emitting layer OL may have a structure in which a plurality of light emitting layers overlap, e.g., a tandem structure. For example, the light emitting layer OL may include a first stack ST1 including a first light emitting layer EML1, a second stack ST2 positioned on the first stack ST1 and including a second light emitting layer EML2, a third stack ST3 positioned on the second stack ST2 and including a third light emitting layer EML3, a first charge generation layer CGL1 positioned between the first stack ST1 and the second stack ST2, and a second charge generation layer CGL2 positioned between the second stack ST2 and the third stack ST3. The first stack ST1, the second stack ST2, and the third stack ST3 may be disposed to overlap each other.

The first light emitting layer EML1, the second light emitting layer EML2, and the third light emitting layer EML3 may be disposed to overlap each other.

In some embodiments, all the first light emitting layer EML1, the second light emitting layer EML2, and the third light emitting layer EML3 may emit light of the blue wavelength light. For example, each of the first light emitting layer EML1, the second light emitting layer EML2, and the third light emitting layer EML3 may be a blue light emitting layer, and may include an organic material.

In some embodiments, at least one of the first light emitting layer EML1, the second light emitting layer EML2, or the third light emitting layer EML3 may emit a first blue light having a first peak wavelength, and at least another one of the first light emitting layer EML1, the second light emitting layer EML2, or the third light emitting layer EML3 may emit a second blue light having a second peak wavelength different from the first peak wavelength. For example, any one of the first light emitting layer EML1, the second light emitting layer EML2, and the third light emitting layer EML3 may emit the first blue light having the first peak wavelength, and the other two of the first light emitting layer EML1, the second light emitting layer EML2, and the third light emitting layer EML3 may emit the second blue light having the second peak wavelength. That is, the emission light LE ultimately emitted from the light emitting layer OL may be a mixed light in which the first component LE1 and the second component LE2 are mixed, and the first component LE1 may be the first blue light having the first peak wavelength, and the second component LE2 may be the second blue light having the second peak wavelength.

In some embodiments, one of the first peak wavelength and the second peak wavelength may be in a range of 440 nm or more and less than 460 nm, and the other one thereof may be in a range of 460 nm or more and 480 nm or less. However, the range of the first peak wavelength and the range of the second peak wavelength are not limited thereto. For example, both the range of the first peak wavelength and the range of the second peak wavelength may include 460 nm In some embodiments, one of the first blue light and the second blue light may be deep blue color, and the other one thereof may be sky blue color.

In accordance with some embodiments, the emission light LE emitted from the light emitting layer OL may be blue light, and may include a long wavelength component and a short wavelength component. Therefore, ultimately, the light emitting layer OL may emit blue light having an emission peak in a broader wavelength range as the emission light LE. Accordingly, there is an advantage in that color visibility may be improved at a side viewing angle compared to a conventional light emitting element emitting blue light having a sharp emission peak.

In some embodiments, each of the first light emitting layer EML1, the second light emitting layer EML2, and the third light emitting layer EML3 may include a host and a dopant. A material of the host is not particularly limited as long as it is generally used. For example, tris(8-hydroxyquinolinato) aluminium (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl) benzene (TPBi), 3-tert-butyl-9,10-di(naphth-2-yl) anthracene (TBADN), distyrylarylene (DSA), 4,4'-bis(9-carbazolyl)-2,2'-dimethyl-biphenyl (CDBP), or 2-methyl-9,10-bis(naphthalen-2-ypanthracene (MADN), and the like may be used.

Each of the first light emitting layer EML1, the second light emitting layer EML2, and the third light emitting layer EML3 emitting blue light may include, e.g., a fluorescent material including any one selected from the group consisting of spiro-DPVBi, spiro-6P, distyryl-benzene (DSB), distyryl-arylene (DSA), polyfluorene (PFO)-based polymer, and poly(p-phenylene vinylene) (PPV)-based polymer. As another example, a phosphorescent material containing an organometallic complex such as (4,6-F2ppy)2Irpic may be included.

As described above, at least one of the first light emitting layer EML1, the second light emitting layer EML2, or the third light emitting layer EML3 emits blue light of a wavelength range different from that of at least another one of the first light emitting layer EML1, the second light emitting layer EML2, or the third light emitting layer EML3. In order to emit blue light in different wavelength ranges, the first light emitting layer EML1, the second light emitting layer EML2, and the third light emitting layer EML3 may include the same material, and a resonance distance may be adjusted. Alternatively, in order to emit blue light in different wavelength ranges, at least one of the first light emitting layer EML1, the second light emitting layer EML2, and the third light emitting layer EML3, and at least another one of the first light emitting layer EML1, the second light emitting layer EML2, and the third light emitting layer EML3 may include different materials from each other.

However, the present disclosure is not limited thereto, and the first light emitting layer EML1, the second light emitting layer EML2, and the third light emitting layer EML3 may emit blue light having a peak wavelength within a range of 440 nm to 480 nm, and may be made of the same material.

Alternatively, in another embodiment, at least any one of the first light emitting layer EML1, the second light emitting layer EML2, or the third light emitting layer EML3 may emit the first blue light having the first peak wavelength, another one of the first light emitting layer EML1, the second light emitting layer EML2, and the third light emitting layer EML3 may emit the second blue light having the second peak wavelength different from the first peak wavelength, and the other one of the first light emitting layer EML1, the second light emitting layer EML2, and the third light emitting layer EML3 may emit third blue light having a third peak wavelength different from the first peak wavelength and the second peak wavelength. In some other embodiments, any one of the first peak wavelength, the second peak wavelength, and the third peak wavelength may be within a range of 440 nm or more and less than 460 nm. Another one of the first peak wavelength, the second peak wavelength, and the third peak wavelength may be within a range of 460 nm or more and less than 470 nm, and the other one of the first peak wavelength, the second peak wavelength, and the third peak wavelength may be within a range of 470 nm or more and 480 nm or less.

In accordance with some other embodiments, the emission light LE emitted from the light emitting layer OL is blue light, and includes a long wavelength component, an intermediate wavelength component, and a short wavelength component. Therefore, ultimately, the light emitting layer OL may emit blue light having an emission peak in a broader wavelength range as the emission light LE, thereby improving the color visibility at a side viewing angle.

In accordance with the above-described embodiments, compared to the conventional light emitting element that does not adopt a tandem structure, i.e., a structure in which a plurality of light emitting layers are stacked, it is advantageous in that the light efficiency increases and the lifespan of the display device increases.

Alternatively, in some other embodiments, at least one of the first light emitting layer EML1, the second light emitting layer EML2, or the third light emitting layer EML3 may emit light of the third color, e.g., blue light, and at least another one of the first light emitting layer EML1, the second light emitting layer EML2, or the third light emitting layer EML3 may emit light of the green wavelength light. In some other embodiments, the range of the peak wavelength of blue light emitted by at least one of the first light emitting layer EML1, the second light emitting layer EML2, or the third light emitting layer EML3 may be within a range of 440 nm or more and 480 nm or less, or 460 nm or more and 480 nm or less. The green light emitted from at least one of the first light emitting layer EML1, the second light emitting layer EML2, or the third light emitting layer EML3 may have a peak wavelength within a range of 510 nm to 550 nm.

For example, any one of the first light emitting layer EML1, the second light emitting layer EML2, and the third light emitting layer EML3 may be a green light emitting layer emitting green light, and the other two among the first light emitting layer EML1, the second light emitting layer EML2, and the third light emitting layer EML3 may be blue light emitting layers emitting blue light. When the other two among the first light emitting layer EML1, the second light emitting layer EML2, and the third light emitting layer EML3 are the blue light emitting layers, the peak wavelength ranges of the blue light emitted by the two blue light emitting layers may be the same, or may be different from each other.

In accordance with some other embodiments, the emission light LE emitted from the light emitting layer OL may be a mixed light in which the first component LE1 that is blue light and the second component LE2 that is green light are mixed. For example, when the first component LE1 is deep blue light and the second component LE2 is green light, the emission light LE may be sky blue light. Similarly to the above-described embodiments, the emission light LE emitted from the light emitting layer OL, which is a mixture of blue light and green light, includes a long wavelength component and a short wavelength component. Therefore, ultimately, the light emitting layer OL may emit blue light having an emission peak in a broader wavelength range as the emission light LE, thereby improving the color visibility at a side viewing angle. In addition, since the second component LE2 of the emission light LE is green light, the green light component of the light provided from the display device 1 to the outside may be supplemented, thereby improving the color reproducibility of the display device 1.

In some embodiments, the green light emitting layer among the first light emitting layer EML1, the second light emitting layer EML2, and the third light emitting layer EML3 may include a host and a dopant. A material of the host including the green light emitting layer is not particularly limited as long as it is generally used. For example, tris(8-hydroxyquinolinato)aluminium (Alq3), 4,4'-bis(N-carbazolyl)-1,1'-biphenyl (CBP), poly(n-vinylcabazole) (PVK), 9,10-di(naphthalene-2-yl)anthracene (ADN), 4,4', 4''-Tris(carbazol-9-yl)-triphenylamine (TCTA), 1,3,5-tris (N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), or 2-methyl-9,10-bis(naphthalen-2-ypanthracene (MADN), and the like may be used.

The dopant included in the green light emitting layer may include a fluorescent material containing, for example, tris (8-hydroxyquinolinato)aluminium(III) (Alq3), or a phosphorescent material such as fac tris(2-phenylpyridine) iridium (Ir(ppy)3), bis(2-phenylpyridine)(acetylacetonate) iridium(III) (Ir(ppy)2(acac)), and 2-phenyl-4-methyl-pyridine iridium (Ir(mpyp)3).

The first charge generation layer CGL1 may be positioned between the first stack ST1 and the second stack ST2. The first charge generation layer CGL1 may serve to allow electric charge to be injected into each light emitting layer. The first charge generation layer CGL1 may serve to control charge balance between the first stack ST1 and the second stack ST2. The first charge generation layer CGL1 may include an n-type charge generation layer CGL11 and a p-type charge generation layer CGL12. The p-type charge generation layer CGL12 may be disposed on the n-type charge generation layer CGL11, and between the n-type charge generation layer CGL11 and the second stack ST2.

The first charge generation layer CGL1 may have a structure in which the n-type charge generation layer CGL11 and the p-type charge generation layer CGL12 are in contact with each other. The n-type charge generation layer CGL11 is disposed closer to the anode electrodes AE1, AE2, and AE3 between the anode electrodes AE1, AE2, and AE3 and the cathode electrode CE. The p-type charge generation layer CGL12 is disposed closer to the cathode electrode CE between the anode electrodes AE1, AE2, and AE3 and the cathode electrode CE. The n-type charge generation layer CGL11 supplies electrons to the first light emitting layer EML1 adjacent to the anode electrodes AE1, AE2, and AE3, and the p-type charge generation layer CGL12 supplies holes to the second light emitting layer EML2 included in the second stack ST2. The first charge generation layer CGL1 is disposed between the first stack ST1 and the second stack ST2 to provide electric charge to each light emitting layer, thereby increasing luminous efficiency and decreasing a driving voltage.

The first stack ST1 may be positioned on the first anode electrode AE1, the second anode electrode AE2, and the third anode electrode AE3, and may further include a first hole transport layer HTL1, a first electron block layer BIL1, and a first electron transport layer ETL1.

The first hole transport layer HTL1 may be disposed on the first anode electrode AE1, the second anode electrode AE2, and the third anode electrode AE3. The first hole transport layer HTL1 serves to facilitate the transport of holes and may include a hole transport material. The hole transport material may include a carbazole-based derivative such as N-phenylcarbazole and polyvinylcarbazole, a fluorene-based derivative, a triphenylamine-based derivative such as N,N'-bis(3-methylphenyl)-N,N-diphenyl)-[1,1-biphenyl]-4,4'-diamine (TPD) and 4,4',4"-tris(N-carbazolyl) triphenylamine (TCTA), N,N'-di(1-naphthyl)-N,N-diphenylbenzidine (NPB), 4,4'-Cyclohexylidene bis[N,N-bis(4-methylphenyl)benzenamine] (TAPC), or the like, but the present disclosure is not limited thereto.

The first electron block layer BIL1 may be positioned on the first hole transport layer HTL1, and between the first hole transport layer HTL1 and the first light emitting layer EML1. The first electron block layer BIL1 may include a hole transport material and a metal or metal compound to prevent electrons generated in the first light emitting layer EML1 from moving into the first hole transport layer HTL1. In some embodiments, the first hole transport layer HTL1 and the first electron block layer BIL1 described above may also be formed of a single layer in which respective materials are mixed.

The first electron transport layer ETL1 may be positioned on the first light emitting layer EML1, and between the first charge generation layer CGL1 and the first light emitting layer EML1. In some embodiments, the first electron transport layer ETL1 may include an electron transport material such as tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), (4,7-diphenyl-1,10-phen anthroline (Bphen), 3-(4-Biphenylyl)-4-phenyl-5-tert-butylphenyl-1,2,4-tri azole (TAZ), 4-(Naphthalen-1-yl)-3,5-diphenyl-4H-1,2,4-tri azole (NTAZ), 2-(4-Biphenylyl)-5-(4-tert-butylphenyl)-1,3,4-oxadiazole (tBu-PBD), bis(2-methyl-8-quinolinolato-N1,O8)-(1,1'-Biphenyl-4-olato)aluminum (BAN), berylliumbis (benzoquinolin-10-olate (Bebq2), 9,10-di(naphthalene-2-yl) anthracene (ADN), and a mixture thereof. However, the present disclosure is not limited to the type of the electron transport material. The second stack ST2 may be positioned on the first charge generation layer CGL1, and further include a second hole transport layer HTL2, a second electron block layer BIL2, and a second electron transport layer ETL2.

The second hole transport layer HTL2 may be positioned on the first charge generation layer CGL1. The second hole transport layer HTL2 may be made of the same material as the first hole transport layer HTL1, or may include one or more materials selected from examples of materials included in the first hole transport layer HTL1. The second hole transport layer HTL2 may be formed of a single layer or a plurality of layers.

The second electron block layer BIL2 may be positioned on the second hole transport layer HTL2, and between the second hole transport layer HTL2 and the second light emitting layer EML2. The second electron block layer BIL2 may be formed of the same material and the same structure as the first electron block layer BIL1, or may include one or more materials selected from examples of materials included in the first electron block layer BIL1.

The second electron transport layer ETL2 may be positioned on the second light emitting layer EML2, and between the second charge generation layer CGL2 and the second light emitting layer EML2. The second electron transport layer ETL2 may be formed of the same material and the same structure as the first electron transport layer ETL1, or may include one or more materials selected from examples of materials included in the first electron transport layer ETL1. The second electron transport layer ETL2 may be formed of a single layer or a plurality of layers.

The second charge generation layer CGL2 may be positioned on the second stack ST2 and between the second stack ST2 and the third stack ST3.

The second charge generation layer CGL2 may have the same structure as the first charge generation layer CGL1 described above. For example, the second charge generation layer CGL2 may include an n-type charge generation layer CGL21 disposed closer to the second stack ST2 and a p-type charge generation layer CGL22 disposed closer to the cathode electrode CE. The p-type charge generation layer CGL22 may be disposed on the n-type charge generation layer CGL21.

The second charge generation layer CGL2 may have a structure in which the n-type charge generation layer CGL21 and the p-type charge generation layer CGL22 are in contact with each other. The first charge generation layer CGL1 and the second charge generation layer CGL2 may be made of different materials, or may be made of the same material.

The second stack ST2 may be positioned on the second charge generation layer CGL2, and may further include a third hole transport layer HTL3 and a third electron transport layer ETL3.

The third hole transport layer HTL3 may be positioned on the second charge generation layer CGL2. The third hole transport layer HTL3 may be made of the same material as the first hole transport layer HTL1, or may include one or more materials selected from examples of materials included in the first hole transport layer HTL1. The third hole transport layer HTL3 may be formed of a single layer or a plurality of layers. When the third hole transport layer HTL3 is formed of a plurality of layers, each layer may include a different material.

The third electron transport layer ETL3 may be positioned on the third light emitting layer EML3, and between the cathode electrode CE and the third light emitting layer EML3. The third electron transport layer ETL3 may be formed of the same material and the same structure as the first electron transport layer ETL1, or may include one or more materials selected from examples of materials included in the first electron transport layer ETL1. The third electron transport layer ETL3 may be formed of a single layer or a plurality of layers. When the third electron transport layer ETL3 is formed of a plurality of layers, each layer may include a different material.

Although not shown in the drawings, a hole injection layer may be further positioned at least one of: between the first stack ST1 and the first anode electrode AE1, between the second anode electrode AE2 and the third anode electrode AE3, between the second stack ST2 and the first charge generation layer CGL1, or between the third stack ST3 and the second charge generation layer CGL2. The hole injection layer may serve to allow holes to be more smoothly injected into the first light emitting layer EML1, the second light emitting layer EML2, and the third light emitting layer EML3. In some embodiments, the hole injection layer may be made of one or materials selected from the group consisting of cupper phthalocyanine (CuPc), poly(3,4)-ethylenedioxythiophene (PEDOT), polyaniline (PANI), and N,N-dinaphthyl-N,N'-diphenyl benzidine (NPD), but the present disclosure is not limited thereto. In some embodiments, the hole injection layer may be positioned between the first stack ST1 and the first anode electrode AE1, between the second anode electrode AE2 and the third anode electrode AE3, between the second stack ST2 and the first charge generation layer CGL1, and between the third stack ST3 and the second charge generation layer CGL2.

Although not shown in the drawings, an electron injection layer may be further positioned at least one of: between the third electron transport layer ETL3 and the cathode electrode CE, between the second charge generation layer CGL2 and the second stack ST2, or between the first charge generation layer CGL1 and the first stack ST1. The electron injection layer serves to facilitate electron injection, and may be made of tris(8-hydroxyquinolino)aluminum (Alq3), PBD, TAZ, Spiro-PBD, BAlq, or SAN, but the present disclosure is not limited thereto. Further, the electron injection layer may be a metal halide compound, and may include one or more materials selected from the group consisting of $MgF_2$, LiF, NaF, KF, RbF, CsF, FrF, LiI, NaI, KI, RbI, CsI, FrI and $CaF_2$, but the present disclosure is not limited thereto. Further, the electron injection layer may include a lanthanum-based material such as Yb, Sm, Eu, or the like. Alternatively, the electron injection layer may include both the metal halide material and the lanthanum-based material, such as RbI:Yb, KI:Yb, or the like. When the electron injection layer includes both the metal halide material and the lanthanum-based material, the electron injection layer may be formed by co-deposition of the metal halide material and the lanthanum-based material. In some embodiments, the electron injection layer may be positioned between the third electron transport layer ETL3 and the cathode electrode CE, between the second charge generation layer CGL2 and the second stack ST2, and between the first charge generation layer CGL1 and the first stack ST1.

The light emitting layer OL may have a modified structure in addition to the above-described structure. For example, the light emitting layer OL may be deformed to a light emitting layer OLa shown in FIG. 12. Unlike the structure shown in FIG. 11, the light emitting layer OLa shown in FIG. 12 may further include a fourth stack ST4 on the third stack ST3, and may further include a third charge generation layer CGL3 positioned between the third stack ST3 and the fourth stack ST4.

The fourth stack ST4 may include a fourth light emitting layer EML4, and may further include a fourth hole transport layer HTL4, a third electron block layer BIL3, and a fourth electron transport layer ETL4.

Each of the first light emitting layer EML1, the second light emitting layer EML2, the third light emitting layer EML3, and the fourth light emitting layer EML4 included in the light emitting layer OL may emit light of the third color blue wavelength light. At least one of the first light emitting layer EML1, the second light emitting layer EML2, the third light emitting layer EML3, or the fourth light emitting layer EML4, and at least another one of the first light emitting layer EML1, the second light emitting layer EML2, the third light emitting layer EML3, or the fourth light emitting layer EML4 may emit blue light in different peak wavelength ranges.

Alternatively, at least one of the first light emitting layer EML1, the second light emitting layer EML2, the third light emitting layer EML3, or the fourth light emitting layer EML4 may emit green light, and at least another one of the first light emitting layer EML1, the second light emitting layer EML2, the third light emitting layer EML3, or the fourth light emitting layer EML4 may emit blue light. For example, any one of the first light emitting layer EML1, the second light emitting layer EML2, the third light emitting layer EML3, and the fourth light emitting layer EML4 may be a green light emitting layer, and the other three light emitting layers may be blue light emitting layers.

Alternatively, the fourth light emitting layer EML4 may be a green light emitting layer, and all the first light emitting layer EML1, the second light emitting layer EML2, and the third light emitting layer EML3 may be blue light emitting layers.

The fourth hole transport layer HTL4 may be positioned on the second charge generation layer CGL2. The fourth hole transport layer HTL4 may be made of the same material as the first hole transport layer HTL1, or may include one or more materials selected from examples of materials included in the first hole transport layer HTL1. The fourth hole transport layer HTL4 may be formed of a single layer or a plurality of layers. When the fourth hole transport layer HTL4 is formed of a plurality of layers, each layer may include a different material.

The third electron block layer BIL3 may be positioned on the fourth hole transport layer HTL4, and may be positioned between the fourth hole transport layer HTL4 and the fourth light emitting layer EML4. The third electron block layer BIL3 may be formed of the same material and the same structure as the first electron block layer BIL1, or may include one or more materials selected from examples of materials included in the first electron block layer BIL1. In some other embodiments, the third electron block layer BIL3 may be omitted.

The fourth electron transport layer ETL4 may be positioned on the fourth light emitting layer EML4, and between the third charge generation layer CGL3 and the fourth light emitting layer EML4. The fourth electron transport layer ETL4 may be formed of the same material and the same structure as the first electron transport layer ETL1, or may include one or more materials selected from examples of materials included in the first electron transport layer ETL1. The fourth electron transport layer ETL4 may be formed of a single layer or a plurality of layers. When the fourth electron transport layer ETL4 is formed of a plurality of layers, each layer may include a different material.

The third charge generation layer CGL3 may have the same structure as the first charge generation layer CGL1 described above. For example, the third charge generation layer CGL3 may include an n-type charge generation layer CGL31 disposed closer to the second stack ST2 and a p-type charge generation layer CGL32 disposed closer to the cathode electrode CE. The p-type charge generation layer CGL32 may be disposed on the n-type charge generation layer CGL31.

Although not shown in the drawing, the electron injection layer may be further positioned between the fourth stack ST4 and the third charge generation layer CGL3. Further, the hole injection layer may be further positioned between the fourth stack ST4 and the second charge generation layer CGL2.

In some embodiments, both the light emitting layer OL shown in FIG. 11 and the light emitting layer OLa shown in FIG. 12 may not include a red light emitting layer in common, and thus may not emit light of the first color, e.g., red light. That is, the emission light LE may not include a light component having a peak wavelength of 610 nm to about 650 nm, and the emission light LE may include only a light component having a peak wavelength of 440 nm to 550 nm.

As illustrated in FIG. 13, the dam member DM may be positioned on the passivation layer 117 in the non-display area NDA.

The dam member DM may be positioned relatively more outward than the second power line VL2. In other words, as illustrated in FIG. 13, the second power line VL2 may be positioned between the dam member DM and the display area DA. The second power line VL2 may be disposed on the above-described first conductive layer.

In some embodiments, the dam member DM may include a plurality of dams. For example, the dam member DM may include a plurality of dams. For example, the dam member DM may include a first dam D1 and a second dam D2.

The first dam D1 may partially overlap the second power line VL2, and may be spaced apart from the via layer 130 with the second power line VL2 interposed therebetween. In some embodiments, the first dam D1 may include a first lower dam pattern D11 positioned on the second insulating layer 117 and a first upper dam pattern D12 positioned on the first lower dam pattern D11.

The second dam D2 may be positioned more outward than the first dam D1, and may be spaced apart from the first dam D1. In some embodiments, the second dam D2 may include a second lower dam pattern D21 positioned on the second insulating layer 117 and a second upper dam pattern D22 positioned on the second lower dam pattern D21.

In some embodiments, the first lower dam pattern D11 and the second lower dam pattern D21 may be made of the same material as the via layer 130 and may be formed simultaneously with the via layer 130.

In some embodiments, the first upper dam pattern D12 and the second upper dam pattern D22 may be made of the same material as the pixel defining layer 150 and may be formed simultaneously with the pixel defining layer 150.

In some embodiments, the heights of the first dam D1 and the second dam D2 may be different from each other. For example, the height of the second dam D2 may be higher than the height of the first dam D1. That is, as the distance from the display area DA increases, the height of the dam included in the dam member DM may gradually increase. Accordingly, it is possible to effectively prevent the organic material from overflowing in a process of forming an organic layer 173 included in an encapsulation layer 170 to be described later.

As illustrated in FIGS. 10 and 13, a first capping layer 160 may be positioned on the cathode electrode CE. The first capping layer 160 may be commonly disposed in the first emission area LA1, the second emission area LA2, the third emission area LA3, and the non-emission area NLA, and may improve viewing angle characteristics and increase external luminous efficiency.

The first capping layer 160 may include at least one of an inorganic material or an organic material having a light transmissive property. That is, the first capping layer 160 may be formed of an inorganic layer, an organic layer, or an organic layer including inorganic particles. For example, the first capping layer 160 may include a triamine derivative, a carbazole biphenyl derivative, an arylenediamine derivative, an aluminum quinolium complex (Alq3), or the like.

Further, the first capping layer 160 may be made of a mixture of a high refractive material and a low refractive material. Alternatively, the first capping layer 160 may include two layers having different refractive indices, e.g., a high refractive layer and a low refractive layer.

In some embodiments, the first capping layer 160 may completely cover the cathode electrode CE. In some embodiments, as shown in FIG. 13, the end of the first capping layer 160 may be positioned relatively more outward than the end of the cathode electrode CE, and the end of the cathode electrode CE may be completely covered by the first capping layer 160.

The encapsulation layer 170 may be disposed on the first capping layer 160. The encapsulation layer 170 protects components positioned under the encapsulation layer 170, such as the light emitting elements ED1, ED2, and ED3, from external foreign substances such as moisture. The encapsulation layer 170 is commonly disposed in the first emission area LA1, the second emission area LA2, the third emission area LA3, and the non-emissive area NLA. In some embodiments, the encapsulation layer 170 may directly cover the cathode electrode CE. In some embodiments, a capping layer (not shown) covering the cathode electrode CE may be further disposed between the encapsulation layer 170 and the cathode electrode CE. In this case, the encapsulation layer 170 may directly cover the capping layer. The encapsulation layer 170 may be a thin film encapsulation layer.

In some embodiments, the encapsulation layer 170 may include a lower inorganic layer 171, an organic layer 173, and an upper inorganic layer 175 that are sequentially stacked on the first capping layer 160.

In some embodiments, the lower inorganic layer 171 may cover the first light emitting element ED1, the second light emitting element ED2, and the third light emitting element ED3 in the display area DA. The lower inorganic layer 171 may cover the dam member DM in the non-display area NDA, and may extend to the outside of the dam member DM.

In some embodiments, the lower inorganic layer 171 may completely cover the first capping layer 160. In some embodiments, the end of the lower inorganic layer 171 may be positioned relatively more outward than the end of the first capping layer 160, and the end of the first capping layer 160 may be completely covered by the lower inorganic layer 171.

The lower inorganic layer 171 may include a plurality of stacked layers. The organic layer 173 may be positioned on the lower inorganic layer 171. The organic layer 173 may cover the first light emitting element ED1, the second light emitting element ED2, and the third light emitting element ED3 in the display area DA. In some embodiments, a part of the organic layer 173 may be positioned in the non-display area NDA, and may not be positioned more outward than the dam member DM. Although it is illustrated that a part of the organic layer 173 is positioned more inward than the first dam D1, the present disclosure is not limited thereto. In some other embodiments, a part of the organic layer 173 may be accommodated in the space between the first dam D1 and the second dam D2, and the end of the organic layer 173 may be positioned in the area between the first dam D1 and the second dam D2.

The upper inorganic layer 175 may be positioned on the organic layer 173. The upper inorganic layer 175 may cover the organic layer 173. In some embodiments, the upper inorganic layer 175 may be in direct contact with the lower inorganic layer 171 in the non-display area NDA to form an inorganic-inorganic junction. In some embodiments, the end of the upper inorganic layer 175 and the end of the lower inorganic layer 171 may be substantially aligned. The upper inorganic layer 175 may include a plurality of stacked layers.

In some embodiments, each of the lower inorganic layer 171 and the upper inorganic layer 175 may be formed of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride or the like.

In some embodiments, the organic layer 173 may be formed of acrylic resin, methacrylic resin, polyisoprene, vinyl resin, epoxy resin, urethane resin, cellulose resin, perylene resin or the like.

Hereinafter, the color conversion substrate 30 will be described with further reference to FIGS. 14 to 16 in addition to FIGS. 1 to 13.

Figure 14:
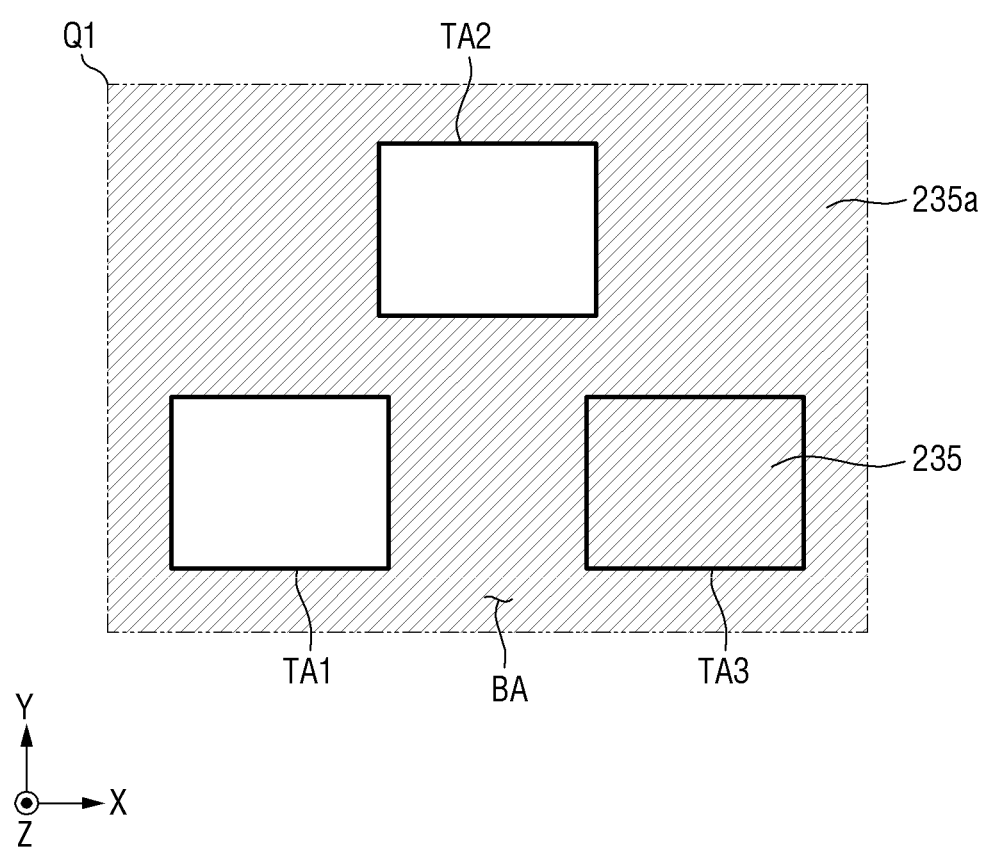
FIG. 14 is a plan view illustrating schematic arrangement of a third color filter in a color conversion substrate of a display device according to one embodiment.

FIG. 14 is a plan view illustrating schematic arrangement of a third color filter in a color conversion substrate of a display device according to one embodiment. FIG. 15 is a plan view illustrating schematic arrangement of a first color filter in a color conversion substrate of a display device according to one embodiment. FIG. 16 is a plan view illustrating schematic arrangement of a second color filter in a color conversion substrate of a display device according to one embodiment.

The second base portion 310 illustrated in FIGS. 10 and 13 may be made of a light transmissive material.

In some embodiments, the second base portion 310 may include a glass substrate or a plastic substrate. In some embodiments, the second base portion 310 may further include a separate layer, for example, an insulating layer such as an inorganic layer, located on the glass substrate or the plastic substrate.

As described above, in some embodiments, the plurality of light transmitting areas TA1, TA2, and TA3 and the light blocking area BA may be defined at the second base portion 310. When the second base portion 310 includes a glass substrate, the refractive index of the second base portion 310 may be about 1.5.

As illustrated in FIGS. 10 and 13, a color filter layer may be disposed on one surface of the second base portion 310 facing the display substrate 10. The color filter layer may include color filters 231, 233, and 235 and the light blocking pattern 250.

As illustrated in FIGS. 10, 13, and 14 to 16, the color filters 231, 233, and 235 may be disposed to overlap the light transmitting areas TA1, TA2, and TA3, respectively. The light blocking pattern 250 may be disposed to overlap the light blocking area BA. The first color filter 231 may overlap the first transmitting area TA1, the second color filter 233 may overlap the second transmitting area TA2, and the third color filter 235 may overlap the third transmitting area TA3. The light blocking pattern 250 may be disposed to overlap the light blocking area BA to block transmission of light. In some embodiments, the light blocking pattern 250 may be disposed in a substantially grid form in plan view. In one embodiment, the light blocking pattern 250 may include a first light blocking pattern portion 235a on one surface of the second base portion 310, a second light blocking pattern portion 231a on the first light blocking pattern portion 235a, and a third light blocking pattern portion 233a on the second light blocking pattern portion 231a. The first light blocking pattern portion 235a may include the same material as the third color filter 235, the second light blocking pattern portion 231a may include the same material as the first color filter 231, and the third light blocking pattern portion 233a may include the same material as the second color filter 233. That is, the light blocking pattern 250 may include a structure in which the first light blocking pattern portion 235a, the second light blocking pattern portion 231a, and the third light blocking pattern portion 233a are sequentially stacked from one surface of the second base portion 310 on the light blocking area BA. In the case where the light blocking pattern 250 has a structure in which the first light blocking pattern portion 235a, the second light blocking pattern portion 231a, and the third light blocking pattern portion 233a are sequentially stacked from one surface of the second base portion 310 on the light blocking area BA, when external light La is incident on the light blocking area BA, as shown in FIG. 8, the light of the first color and the light of the second color except the light of the third color may be absorbed by the first light blocking pattern portion 235a while passing through the first light blocking pattern portion 235a, and the light of the third color may also be absorbed while passing through the second and third light blocking pattern portions 231a and 233a. However, although not shown, there may be some light reflected to the outside from the interface between the first light blocking pattern portion 235a and the second base portion 310 without passing through the first light blocking pattern portion 235a. In this case, the light may be light of the third color.

In some other embodiments, the light blocking pattern 250 may include an organic light blocking material, and may be formed by coating and exposing the organic light blocking material. For example, the organic light blocking material may include a black matrix.

The first color filter 231 may function as a blocking filter that blocks blue light and green light. In some embodiments, the first color filter 231 may selectively transmit light of the first color (e.g., red light) and may block or absorb light of the second color (e.g., green light) and light of the third color (e.g., blue light). For example, the first color filter 231 may be a red color filter, and may include a red colorant. The first color filter 231 may include base resin and a red colorant dispersed in the base resin.

The second color filter 233 may function as a blocking filter that blocks blue light and red light. In some embodiments, the second color filter 233 may selectively transmit light of the second color (e.g., green light) and may block or absorb light of the third color (e.g., blue light) and light of the first color (e.g., red light). For example, the second color filter 233 may be a green color filter, and may include a green colorant.

The third color filter 235 may selectively transmit light of the third color (e.g., blue light) and may block or absorb light of the first color (e.g., red light) and light of the second color (e.g., green light). In some embodiments, the third color filter 235 may be a blue color filter, and may include a blue colorant such as a blue dye or a blue pigment. In the present specification, the colorant is the concept including both a dye and a pigment.

As illustrated in FIGS. 10 and 13, a low refractive layer 391 that covers the light blocking pattern 250, the first color filter 231, the second color filter 233, and the third color filter 235 may be positioned on one surface of the second base portion 310. In some embodiments, the low refractive layer 391 may be in direct contact with the first color filter 231, the second color filter 233 and the third color filter 235. Further, in some embodiments, the low refractive layer 391 may also be in direct contact with the light blocking pattern 250.

The low refractive layer 391 may have a refractive index lower than those of wavelength conversion patterns 340 and 350 and a light transmission pattern 330. For example, the low refractive layer 391 may be made of an inorganic material. For example, the low refractive layer 391 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or the like. In some embodiments, a plurality of hollow particles may be formed in the low refractive layer to lower the refractive index of the low refractive layer 391.

A low refractive capping layer 392 may be further disposed between the low refractive layer 391 and the wavelength conversion patterns 340 and 350 and between the low refractive layer 391 and the light transmission pattern 330. In some embodiments, the low refractive capping layer 392 may be in direct contact with the wavelength conversion patterns 340 and 350 and the light transmission pattern 330. Further, in some embodiments, the low refractive capping layer 392 may also be in direct contact with the bank pattern 370.

The low refractive capping layer 392 may have a refractive index lower than those of the wavelength conversion patterns 340 and 350 and the light transmission pattern 330. For example, the low refractive capping layer 392 may be made of an inorganic material. For example, the low refractive capping layer 392 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or the like. In some embodiments, a plurality of hollow particles may be formed in the low refractive layer to lower the refractive index of the low refractive capping layer 392.

The low refractive capping layer 392 can prevent contamination or damage of the first color filter 231, the second color filter 233, the third color filter 235 and the like due to infiltration of impurities such as moisture or air from the outside. Further, the low refractive capping layer 392 may prevent the colorants included in the first color filter 231, the second color filter 233, and the third color filter 235 from being diffused to the components other than the first color filter 231, the second color filter 233, and the third color filter 235, such as the first wavelength conversion pattern 340, the second wavelength conversion pattern 350, and the like.

In some embodiments, the low refractive layer 391 and the low refractive capping layer 392 may surround the side surface of the light blocking pattern 250 in the non-display area NDA. Further, in some embodiments, the low refractive layer 391 may be in direct contact with the second base portion 310 in the non-display area NDA.

The bank pattern 370 may be positioned on one surface of the low refractive capping layer 392 facing the display substrate 10. In some embodiments, the bank pattern 370 may be positioned directly on one surface of the low refractive capping layer 392 and may be in direct contact with the low refractive capping layer 392.

In some embodiments, the bank pattern 370 may be disposed to overlap the non-emission area NLA or the light blocking area BA. In some embodiments, the bank pattern 370 may surround the first light transmitting area TA1, the second light transmitting area TA2, and the third light transmitting area TA3 in plan view as shown in FIG. 15. The bank pattern 370 may partition the space in which the first wavelength conversion pattern 340, the second wavelength conversion pattern 350, and the light transmission pattern 330 are disposed.

In some embodiments, the bank pattern 370 may be formed as an integrally connected single pattern, but the present disclosure is not limited thereto. In another embodiment, a portion of the bank pattern 370 surrounding the first light transmitting area TA1, a portion of the bank pattern 370 surrounding the second light transmitting area TA2, and a portion of the bank pattern 370 surrounding the third light transmitting area TA3 may be formed as individual patterns separated from each other.

When the first wavelength conversion pattern 340, the second wavelength conversion pattern 350, and the light transmission pattern 330 are formed by ejecting an ink composition using a nozzle, i.e., by an inkjet printing method, the bank pattern 370 may serve as a guide for stably positioning the ejected ink composition at a desired position. That is, the bank pattern 370 may function as a barrier wall.

In some embodiments, the bank pattern 370 may overlap the pixel defining layer 150.

As illustrated in FIG. 13, in some embodiments, the bank pattern 370 may be further positioned in the non-display area NDA. The bank pattern 370 may overlap the light blocking pattern 250 in the non-display area NDA.

In some embodiments, the bank pattern 370 may include an organic material having photocurability. Further, in some embodiments, the bank pattern 370 may include an organic material having photocurability and including a light blocking material. When the bank pattern 370 has a light blocking property, it is possible to prevent light infiltration between the emission areas adjacent to each other in the display area DA. For example, the bank pattern 370 may prevent the emission light LE emitted from the second light emitting element ED2 from being incident on the first wavelength conversion pattern 340 overlapping the first emission area LA1. Further, the bank pattern 370 may block or prevent infiltration of external light into the components positioned under the bank pattern 370 in the non-emission area NLA and the non-display area NDA.

As illustrated in FIGS. 10 and 13, the first wavelength conversion pattern 340, the second wavelength conversion pattern 350, and the light transmission pattern 330 may be positioned under the low refractive layer 391. In some embodiments, the first wavelength conversion pattern 340, the second wavelength conversion pattern 350, and the light transmission pattern 330 may be positioned in the display area DA.

The light transmission pattern 330 may overlap the third emission area LA3 or the third light emitting element ED3. The light transmission pattern 330 may be positioned in the space partitioned by the bank pattern 370 in the third light transmitting area TA3.

In some embodiments, the light transmission pattern 330 may be formed in an island shape pattern. Although it is illustrated in the drawing that the light transmission pattern 330 does not overlap the light blocking area BA, this is only an example. In some other embodiments, a part of the light transmission pattern 330 may overlap the light blocking area BA.

The light transmission pattern 330 may transmit incident light. The emission light LE provided from the third light emitting element ED3 may be blue light as described above. The emission light LE that is blue light passes through the light transmission pattern 330 and the third color filter 235 and is emitted to the outside of the display device 1. That is, the third light L3 (FIG. 10) emitted from the third emission area LA3 to the outside of the display device 1 may be blue light.

In some embodiments, the light transmission pattern 330 may include third base resin 331, and may further include third scatterers 333 dispersed in the third base resin 331. In the following description, in designating the base resin, the scatterer, or the wavelength shifter included in the light transmission pattern 330 and the wavelength conversion patterns 340 and 350, the components of the light transmission pattern 330 and the wavelength conversion patterns 340 and 350 are distinguished by the ordinal numbers "first," "second," and "third." However, the ordinal numbers "first," "second," and "third" used for the components of the light transmission pattern 330 and the wavelength conversion patterns 340 and 350 are not limited thereto, and may be used for the components in different orders.

The third base resin 331 may be made of a material having high light transmittance. In some embodiments, the third base resin 331 may be formed of an organic material. For example, the third base resin 331 may include an organic material such as epoxy resin, acrylic resin, cardo resin, or imide resin.

The third scatterer 333 may have a refractive index different from that of the third base resin 331 and form an optical interface with the third base resin 331. For example, the third scatterer 333 may be light scattering particles. The third scatterer 333 is not particularly limited as long as it is a material capable of scattering at least a portion of the transmitted light, but may be, for example, metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin and urethane resin, and the like. For example, the third scatterer 333 according to one embodiment may include titanium oxide ($TiO_2$).

The third scatterer 333 may scatter the light in a random direction regardless of the incident direction of the incident light without substantially converting the wavelength of the light passing through the light transmissive pattern 330. In some embodiments, the light transmission pattern 330 may be in direct contact with the bank pattern 370.

The first wavelength conversion pattern 340 may overlap the first emission area LA1, or the first light emitting element ED1, or the first light transmitting area TA1.

In some embodiments, the first wavelength conversion pattern 340 may be positioned in the space partitioned by the bank pattern 370 in the first light transmitting area TA1.

Figure 15:
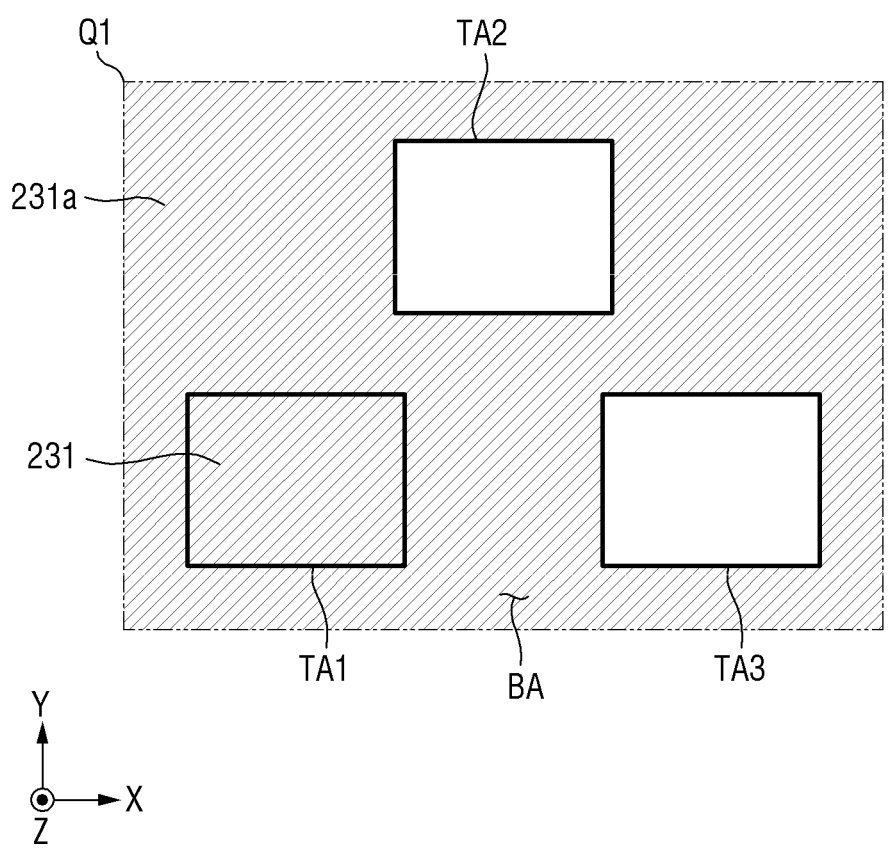
FIG. 15 is a plan view illustrating schematic arrangement of a first color filter in a color conversion substrate of a display device according to one embodiment.
Figure 16:
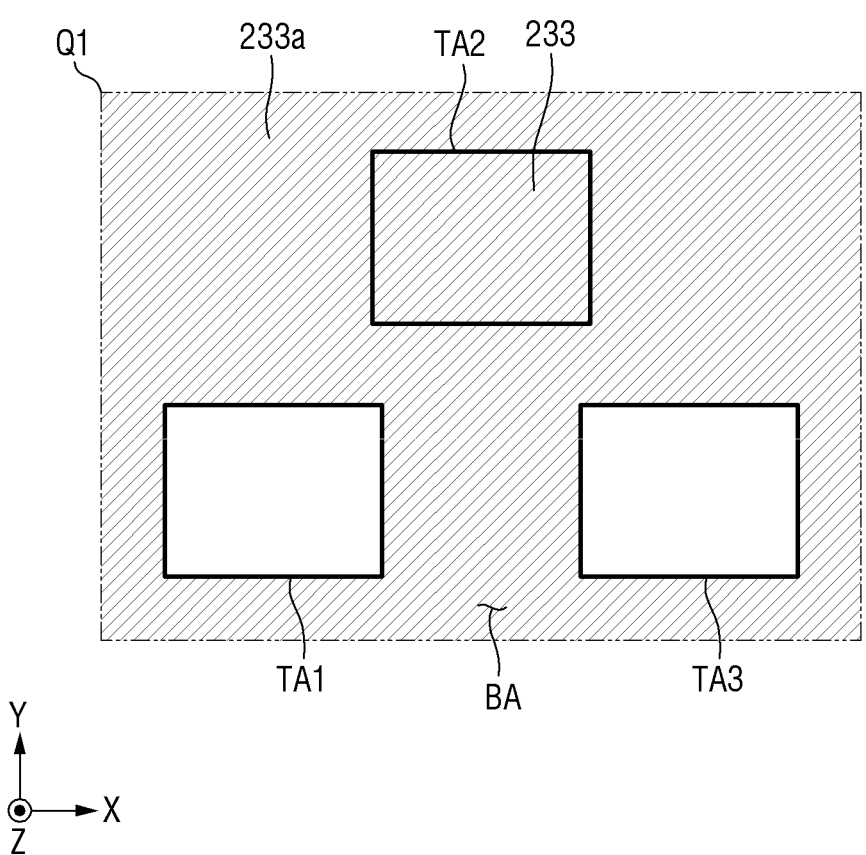
FIG. 16 is a plan view illustrating schematic arrangement of a second color filter in a color conversion substrate of a display device according to one embodiment.

In some embodiments, the first wavelength conversion pattern 340 may be formed in an island pattern as shown in FIG. 15. Although it is illustrated in the drawing that the first wavelength conversion pattern 340 does not overlap the light blocking area BA, this is only an example. In some other embodiments, a part of the first wavelength conversion pattern 340 may overlap the light blocking area BA. In some embodiments, the first wavelength conversion pattern 340 may be in direct contact with the bank pattern 370.

The first wavelength conversion pattern 340 may convert or shift the peak wavelength of incident light to another specific peak wavelength using a first wavelength shifter 345 to be described later and emit the light having another specific peak wavelength. In some embodiments, the first wavelength conversion pattern 340 may convert the emission light LE provided from the first light emitting element ED1 to red light having a peak wavelength in the range of 610 nm to 650 nm and emit the red light.

In some embodiments, the first wavelength conversion pattern 340 may include first base resin 341 and the first wavelength shifter 345 dispersed in the first base resin 341, and may further include first scatterers 343 dispersed in the first base resin 341.

The first base resin 341 may be made of a material having high light transmittance. In some embodiments, the first base resin 341 may be formed of an organic material. In some embodiments, the first base resin 341 may be made of the same material as the third base resin 331, or may include at least one of the materials exemplified as the constituent materials of the third base resin 331.

Examples of the first wavelength shifter 345 may include a quantum dot, a quantum rod, a phosphor, and the like. For example, a quantum dot may be a particulate material that emits light of a specific color when an electron transitions from a conduction band to a valence band.

The quantum dot may be a semiconductor nanocrystal material. The quantum dot may have a specific band gap according to its composition and size. Thus, the quantum dot may absorb light and then emit light having an intrinsic wavelength. Examples of semiconductor nanocrystal of quantum dots may include group IV nanocrystal, group II-VI compound nanocrystal, group III-V compound nanocrystal, group IV-VI nanocrystal, a combination thereof, or the like.

The group II-VI compound may be selected from the group consisting of binary compounds, ternary compounds, and quaternary compounds, wherein the binary compounds are selected from the group consisting of CdSe, CdTe, ZnS, ZnSe, ZnTe, ZnO, HgS, HgSe, HgTe, MgSe, MgS and mixtures thereof, the ternary compounds are selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof, and the quaternary compounds are selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

The group III-V compound may be selected from the group consisting of binary compounds, ternary compounds, and quaternary compounds, wherein the binary compounds are selected from the group consisting of GaN, GaP, GaAs, GaSb, MN, AlP, AlAs, AlSb, InN, InP, InAs, InSb and mixtures thereof, the ternary compounds are selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP and mixtures thereof, and the quaternary compounds are selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The group IV-VI compound may be selected from the group consisting of binary compounds, ternary compounds, and quaternary compounds, wherein the binary compounds are selected from the group consisting of SnS, SnSe, SnTe, PbS, PbSe, PbTe and mixtures thereof, the ternary compounds are selected from the group consisting of SnSeS, SnSeTe, SnSTe, PbSeS, PbSeTe, PbSTe, SnPbS, SnPbSe, SnPbTe and mixtures thereof, and the quaternary compounds are selected from the group consisting of SnPbSSe, SnPbSeTe, SnPbSTe and mixtures thereof. The group IV element may be selected from the group consisting of Si, Ge and mixtures thereof. The group IV compound may be a binary compound selected from the group consisting of SiC, SiGe and mixtures thereof.

In this case, the binary compound, the tertiary compound or the quaternary compound may exist in particles at a uniform concentration, or may exist in the same particle divided into states where concentration distributions are partially different. Further, the particles may have a core/shell structure in which one quantum dot surrounds another quantum dot. An interface between the core and the shell may have a concentration gradient in which the concentration of elements present in the shell decreases toward the center.

In some embodiments, the quantum dot may have a core-shell structure including a core including the nanocrystal described above and a shell surrounding the core. The shell of the quantum dot may serve as a protective layer for maintaining semiconductor characteristics by preventing chemical denaturation of the core or as a charging layer for giving electrophoretic characteristics to the quantum dot. The shell may be a single layer or a multilayer. An interface between the core and the shell may have a concentration gradient in which the concentration of elements present in the shell decreases toward the center. Examples of the shell of the quantum dot may include a metal or non-metal oxide, a semiconductor compound, and a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and NiO, or a tertiary compound such as $MgAl_2O_4$, $CoFe_2O_4$, $NiFe_2O_4$ and $CoMn_2O_4$, but the present invention is not limited thereto.

In addition, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb or the like, but the present invention is not limited thereto.

The light emitted from the first wavelength shifter 345 may have a full width of half maximum (FWHM) of the emission wavelength spectrum, which is about 45 nm or less, about 40 nm or less, or about 30 nm or less. Thus, the purity and reproducibility of colors displayed by the display device 1 can be further improved. In addition, the light emitted from the first wavelength shifter 345 may be emitted in various directions regardless of the incident direction of incident light. Accordingly, the side surface visibility of the first color displayed in the first light transmitting area TA1 may be improved.

A part of the emission light LE provided from the first light emitting element ED1 may be emitted while passing through the first wavelength conversion pattern 340 without being converted to red light by the first wavelength shifter 345. The component of the emission light LE incident to the first color filter 231 without being converted by the first wavelength conversion pattern 340 may be blocked by the first color filter 231. On the other hand, in the emission light LE, the red light converted by the first wavelength conversion pattern 340 passes through the first color filter 231 and is emitted to the outside. That is, first light L1 (FIG. 10) emitted to the outside of the display device 1 through the first light transmitting area TA1 may be red light.

The first scatterer 343 may have a refractive index different from that of the first base resin 341 and form an optical interface with the first base resin 341. For example, the first scatterer 343 may be light scattering particles. A more detailed description of the first scatterer 343 is substantially the same as or similar to the description of the first scatterer 333, and thus will be omitted.

The second wavelength conversion pattern 350 may be positioned in the space partitioned by the bank pattern 370 in the second light transmitting area TA2.

Figure 19:
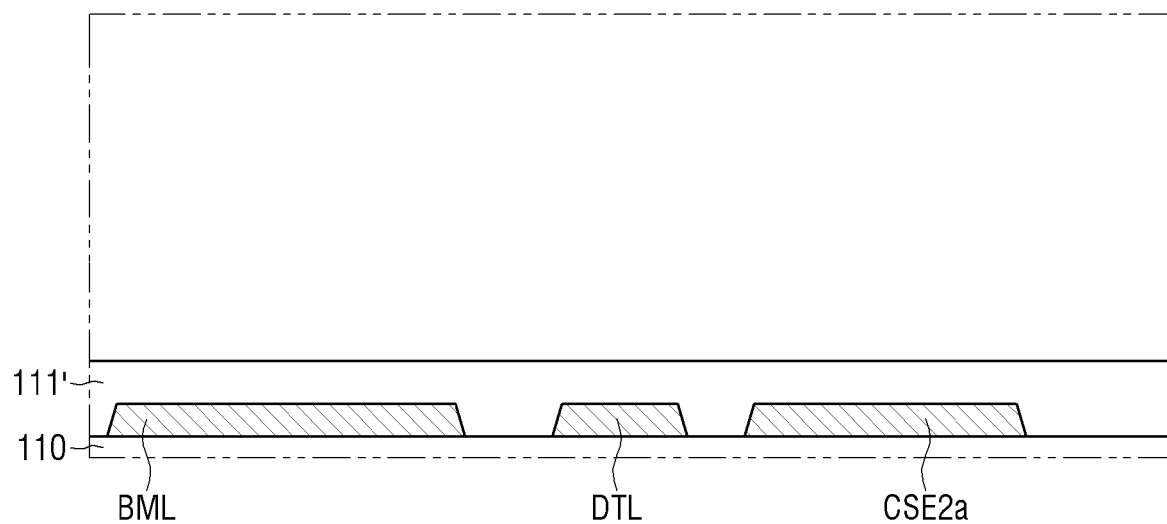

In some embodiments, the second wavelength conversion pattern 350 may be formed in an island pattern as shown in FIG. 19. In some embodiments, a part of the second wavelength conversion pattern 350 may overlap the light blocking area BA, unlike the illustration in the drawing. In some embodiments, the second wavelength conversion pattern 350 may be in direct contact with the bank pattern 370.

The second wavelength conversion pattern 350 may convert or shift the peak wavelength of incident light into another specific peak wavelength using a second wavelength shifter 355 to be described later and emit light having another specific peak wavelength. In some embodiments, the second wavelength conversion pattern 350 may convert the emission light LE provided from the second light emitting element ED2 into green light having a peak wavelength of about 510 nm to about 550 nm and emit the green light.

In some embodiments, the second wavelength conversion pattern 350 may include second base resin 351 and the second wavelength shifter 355 dispersed in the second base resin 351, and may further include second scatterers 353 dispersed in the second base resin 351.

The second base resin 351 may be made of a material having high light transmittance. In some embodiments, the second base resin 351 may be formed of an organic material. In some embodiments, the second base resin 351 may be made of the same material as the third base resin 331, or may include at least one of the materials exemplified as the constituent materials of the third base resin 331.

Examples of the second wavelength shifter 355 may include a quantum dot, a quantum rod, a phosphor, and the like. A more detailed description of the second wavelength shifter 355 is substantially the same as or similar to the description of the first wavelength shifter 345, and thus will be omitted.

In some embodiments, both the first wavelength shifter 345 and the second wavelength shifter 355 may be formed of quantum dots. In this case, the particle size of the quantum dots forming the second wavelength shifter 355 may be smaller than the particle size of the quantum dots forming the first wavelength shifter 345.

The second scatterer 353 may have a refractive index different from that of the second base resin 351 and form an optical interface with the second base resin 351. For example, the second scatterer 353 may be light scattering particles. A more detailed description of the second scatterer 353 is substantially the same as or similar to the description of the first scatterer 343, and thus will be omitted.

The emission light LE emitted from the third light emitting element ED3 may be provided to the second wavelength conversion pattern 350, and the second wavelength shifter 355 may convert the emission light LE provided from the third light emitting element ED3 to green light having a peak wavelength in the range of about 510 nm to about 550 nm and emit the green light.

Some of the emission light LE that is blue light may pass through the second wavelength conversion pattern 350 without being converted to green light by the second wavelength shifter 355, and may be blocked by the second color filter 233. On the other hand, in the emission light LE, the green light converted by the second wavelength conversion pattern 350 passes through the second color filter 233 and is emitted to the outside. Accordingly, second light L2 (FIG. 10) emitted from the second light transmitting area TA2 to the outside of the display device 1 may be green light.

In some embodiments, a capping layer 393 may cover the outer surface of the bank pattern 370 in the non-display area NDA. Further, the capping layer 393 may be in direct contact with the low refractive capping layer 392 in the non-display area NDA.

In some embodiments, the capping layer 393 may be made of an inorganic material. In some embodiments, the capping layer 393 may be made of the same material as the low refractive layer 391, or may include at least one of the materials mentioned in the description of the low refractive layer 391. When both the low refractive layer 391 and the capping layer 393 are made of an inorganic material, in the non-display area NDA, the low refractive layer 391 and the capping layer 393 may be in direct contact with each other to form an inorganic-inorganic junction.

As described above, the sealing member 50 may be positioned between the color conversion substrate 30 and the display substrate 10 in the non-display area NDA.

The sealing member 50 may overlap the encapsulation layer 170. More specifically, the sealing member 50 may overlap the lower inorganic layer 171 and the upper inorganic layer 175 and may not overlap the organic layer 173. In some embodiments, the sealing member 50 may be in direct contact with the encapsulation layer 170. More specifically, the sealing member 50 may be positioned directly on the upper inorganic layer 175 and may be in direct contact with the upper inorganic layer 175.

In some embodiments, the upper inorganic layer 175 and the lower inorganic layer 171 positioned under the sealing member 50 may extend to the outside of the sealing member 50.

The sealing member 50 may overlap the color pattern 250, the first color filter 231, and the bank pattern 370 in the non-display area NDA. In some embodiments, the sealing member may be in direct contact with the capping layer 393 covering the bank pattern 370.

The sealing member 50 may overlap the gate metal WR including a wiring connected to the connection pad PD. Since the sealing member 50 is disposed to overlap the gate metal WR, the width of the non-display area NDA may be reduced.

As described above, the filler 70 may be positioned in the space between the color conversion substrate 30, the display substrate 10, and the sealing member 50. In some embodiments, the filler 70 may be in direct contact with the capping layer 393 and the upper inorganic layer 175 of the encapsulation layer 170 as shown in FIGS. 10 and 13.

An anti-reflection film AF may be further disposed on a surface of the second base portion 310 of the display device 1 according to one embodiment that is opposite to a surface in contact with the color filters 231, 233, and 235. The anti-reflection film AF may be disposed on the surface of the second base portion 310 opposite to the surface in contact with the color filters 231, 233, and 235 to minimize incidence of external light into the display device 1. The anti-reflection film AF may include a first surface positioned on a display surface side and a second surface (surface in contact with the second base portion 310) opposite to the first surface, and may minimize the incidence of external light into the display device 1 using the principle of mutual interference of external light reflected from the first surface and external light reflected from the second surface. Although not shown, the anti-reflection film AF may be formed of a plurality of layers having controlled refractive indices, but the present disclosure is not limited thereto.

Hereinafter, further specific components of the semiconductor pattern ACT, the connection between the semiconductor pattern ACT and the lower light blocking layer BML, the connection between the semiconductor pattern ACT and the data line DTL, the first capacitance electrode CSE1, and the second capacitance electrode CSE2 will be described.

Figure 17:
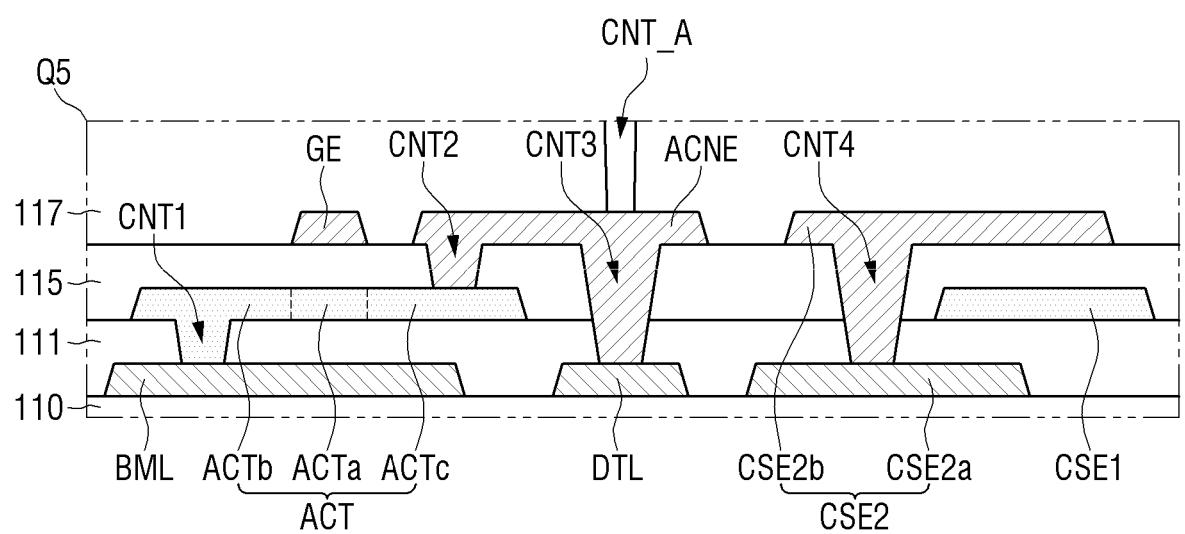
FIG. 17 is an enlarged cross-sectional view of area Q5 of FIG. 10.

FIG. 17 is an enlarged cross-sectional view of area Q5 of FIG. 10.

Referring to FIG. 17, the same description as that in FIG. 10 will be omitted.

Referring to FIG. 17, the semiconductor pattern ACT may include a first area ACTa, a second area ACTb on the other side of the first area ACTa, and a third area ACTc on one side of the first area ACTa. The first area ACTa may be disposed between the second area ACTb and the third area ACTc. The gate electrode GE may overlap the first area ACTa in the thickness direction. The lower light blocking layer BML may overlap the semiconductor pattern ACT. For example, the lower light blocking layer BML may overlap the second area ACTb and the first area ACTa of the semiconductor layer ACT. The lower light blocking layer BML may also overlap the third area ACTc. The second area ACTb may be directly connected to the lower light blocking layer BML through a first contact hole CNT1 penetrating the buffer layer 111. The first connection electrode ACNE overlapping the third area ACTc may be directly connected to the third area ACTc through a second contact hole CNT2 and may be directly connected to the data line DTL through a third contact hole CNT3. That is, the third area ACTc and the data line DTL may be electrically connected by the first connection electrode ACNE. As described above, each of the second area ACTb and the third area ACTc needs to have conductivity so that the second area ACTb is electrically connected to the lower light blocking layer BML by the direct contact therewith while penetrating the buffer layer 111, and the third area ACTc is electrically connected to the data line DTL by the direct contact between the first connection electrode ACNE and the third area ACTc and the data line DTL. That is, the conductivity of each of the second area ACTb and the third area ACTc may be higher than the conductivity of the first area ACTa. Each of the second area ACTb and the third area ACTc may include boron (B) or argon (Ar). On the other hand, the first area ACTa may not include boron (B) or argon (Ar). Each of the second area ACTb and the third area ACTc including boron (B) or argon (Ar) and having conductivity will be described in more detail in a method of manufacturing the display device 1 to be described later.

Meanwhile, the first capacitance electrode CSE1 may include the same material as those of the second area ACTb and the third area ACTc. That is, the conductivity of the first capacitance electrode CSE1 may be higher than that of the first area ACTa. The first capacitance electrode CSE1 may include boron (B) or argon (Ar).

The second sub-capacitance electrode CSE2b may be directly connected to the first sub-capacitance electrode CSE2a through a fourth contact hole CNT4 penetrating the gate insulating layer 115 and the buffer layer 111. The first sub-capacitance electrode CSE2a and the second sub-capacitance electrode CSE2b electrically connected to each other may constitute the first capacitance electrode CSE1 and the storage capacitor Cst, respectively. That is, a first capacitor may be formed between the first sub-capacitance electrode CSE2b and the first capacitance electrode CSE1, and a second capacitor may be formed between the second sub-capacitance electrode CSE2b and the first capacitance electrode CSE1. Since the first sub-capacitance electrode CSE2a and the second sub-capacitance electrode CSE2b are electrically connected to each other, the first capacitor and the second capacitor form a parallel relationship and, thus, the capacitance may be increased compared to the capacitor formed between any one of the first sub-capacitance electrode CSE2a and the second sub-capacitance electrode CSE2b and the first capacitance electrode CSE1.

The second area and the third area of the semiconductor pattern of the conventional thin film transistors T1, T2, and T3 are connected to the lower light blocking layer BML or the data line DTL shown in FIG. 17 through electrodes positioned on a separate conductive layer (e.g., source-drain conductive layer). However, in this case, the separate conductive layer was added, so that the number of steps was increased, and the number of masks required for manufacturing the display device was increased. However, in the case of the display device 1 according to one embodiment, the second area ACTb is electrically connected to the lower light blocking layer BML by the direct contact therewith while penetrating the buffer layer 111 and the third area ACTc is electrically connected to the data line DTL by the direct contact between the first connection electrode ACNE and the third area ACTc and the data line DTL, so that it is advantageous in that it is possible to reduce the number of steps by omitting the separate conductive layer and to prevent an increase in the number of masks.

Figure 18:
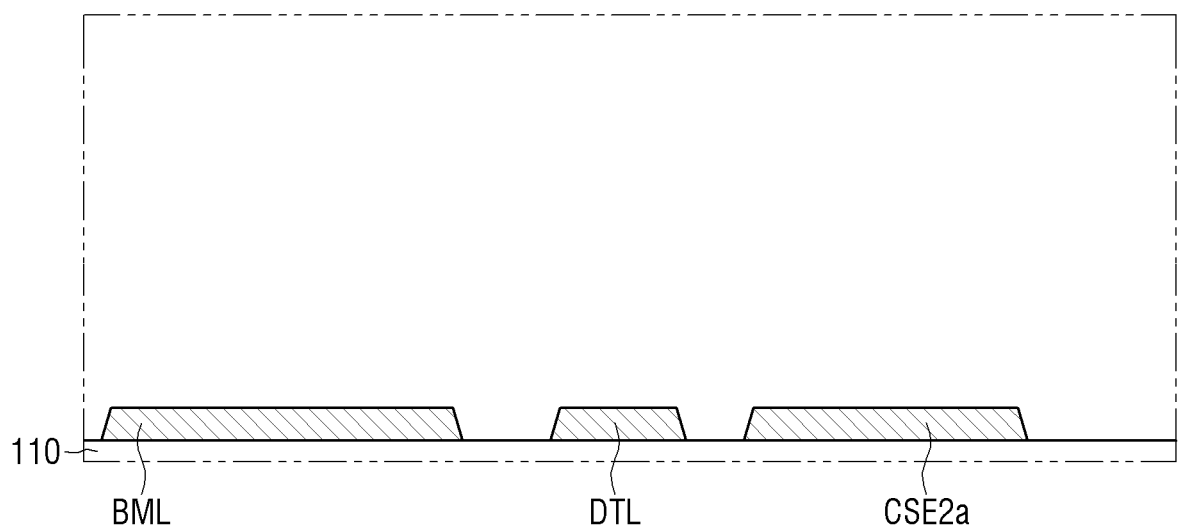
FIGS. 18, 19, 20, 21, 22, 23, 24, 25, 26, 27, 28, and 29 are cross-sectional views showing the steps of a method of manufacturing a display device according to one embodiment.
Figure 28:
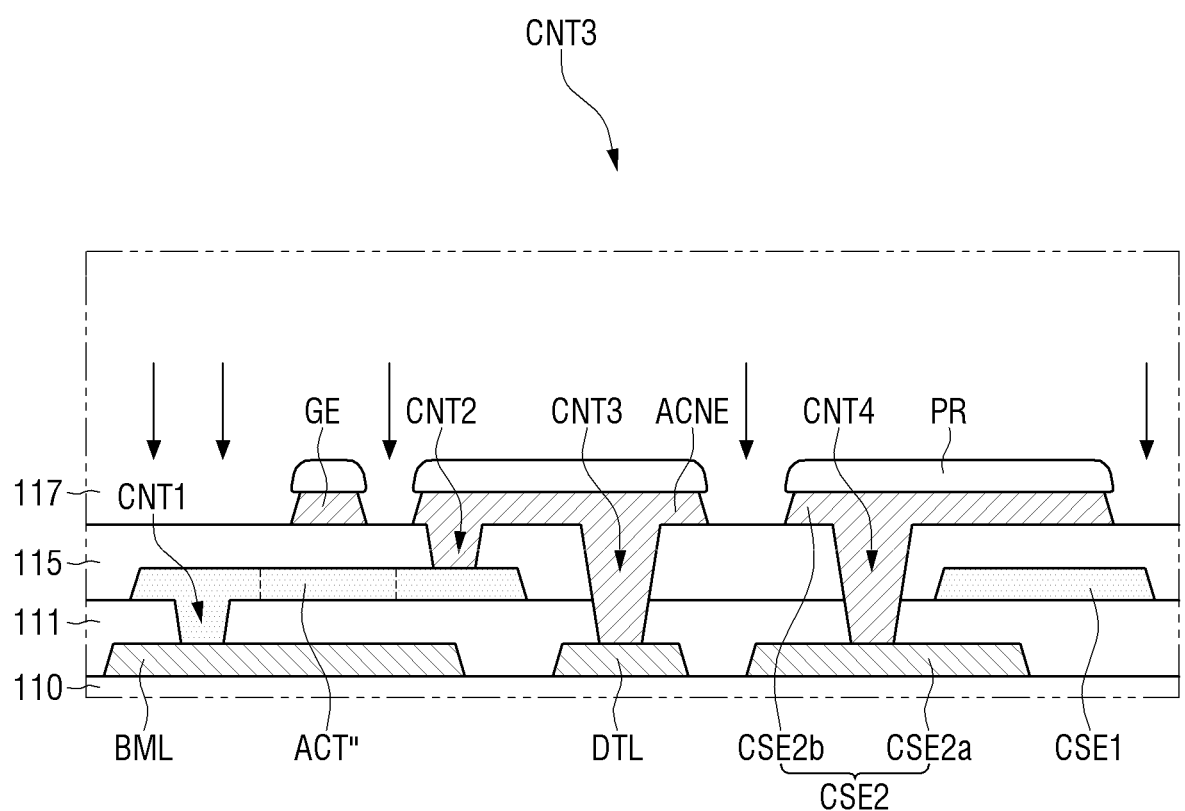
Figure 29:
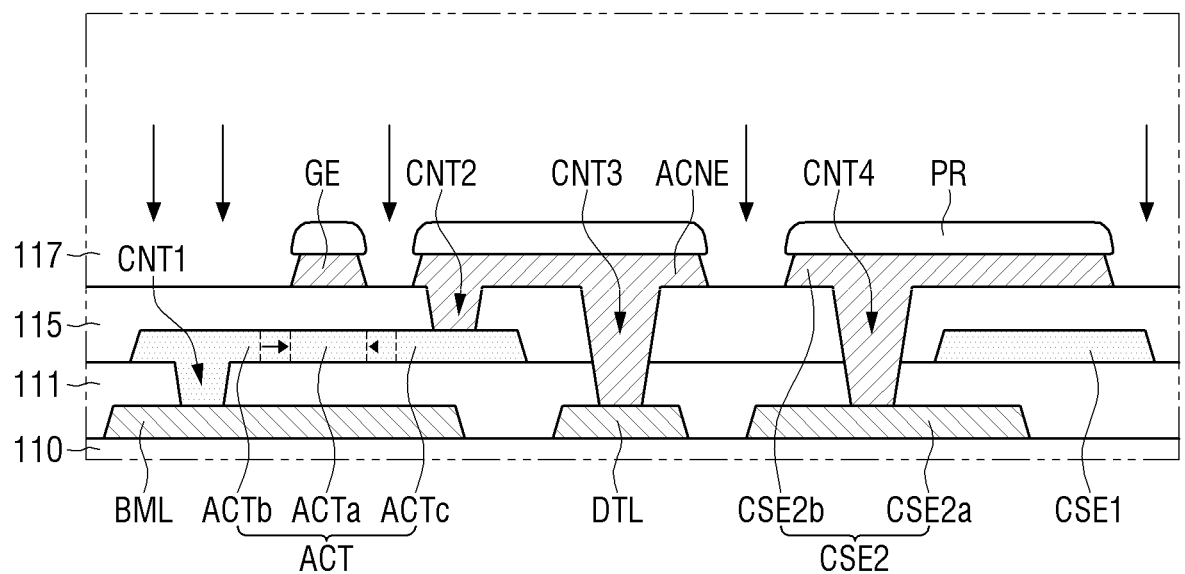

FIGS. 18 and 29 are cross-sectional views showing the steps of a method of manufacturing a display device according to one embodiment. FIG. 17 described above may be further referred to in describing the steps of the method of manufacturing a display device with reference to FIGS. 18 to 29.

Referring to FIGS. 17 and 18, a first conductive layer is formed on the first base portion 110. The first conductive layer may include the lower light blocking layer BML, the data line DTL, and the first sub-capacitance electrode CSE2a of the second capacitance electrode CSE2.

In some embodiments, the first conductive layer may be made of a material that blocks light and has conductivity. For example, the first conductive layer may include a single material among metals such as silver (Ag), nickel (Ni), gold (Au), platinum (Pt), aluminum (Al), copper (Cu), molybdenum (Mo), titanium (Ti), and neodymium (Nd), or an alloy thereof. In some embodiments, the first conductive layer may have a single layer or multi-layer structure. For example, when the first conductive layer has a multi-layer structure, the first conductive layer may be a stacked structure of titanium (Ti)/copper (Cu)/indium tin oxide (ITO) or titanium (Ti)/copper (Cu)/aluminum oxide ($Al_2O_3$), but the present disclosure is not limited thereto.

Then, referring to FIGS. 17 and 19, a buffer layer 111' is formed on the first conductive layer. The buffer layer 111' may block foreign substances or moisture permeating through the first base portion 110. For example, the buffer layer 111' may include an inorganic material such as $SiO_2$, SiNx, or SiON, and may be formed as a single layer or multiple layers.

Figure 20:
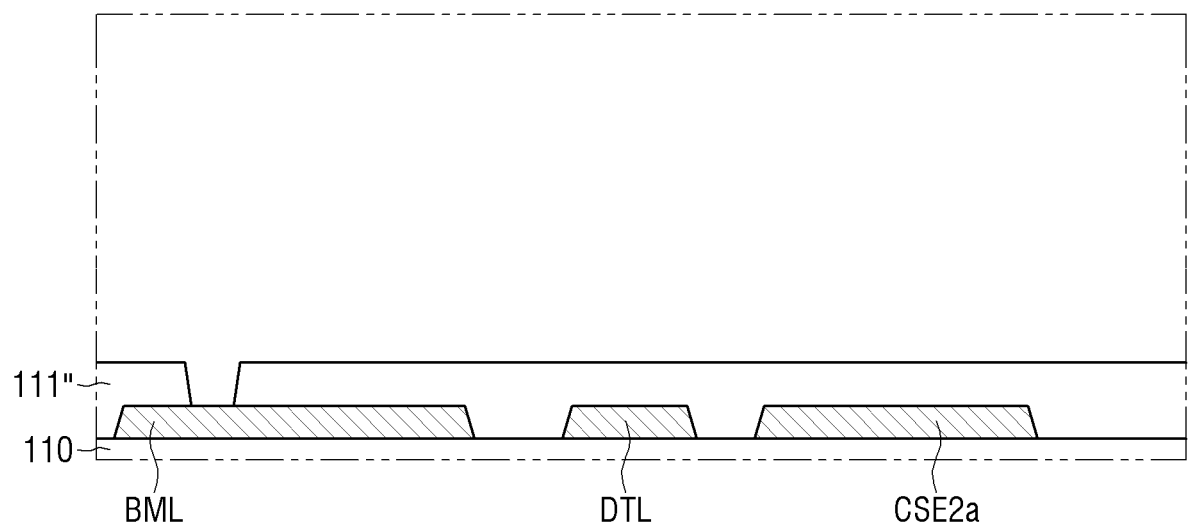

Then, referring to FIGS. 17 and 20, a through-hole where the first contact hole CNT1 to be described later will be positioned is formed in the buffer layer 111'. The through-hole may completely penetrate the buffer layer 111" from the top surface to the bottom surface thereof.

Figure 21:
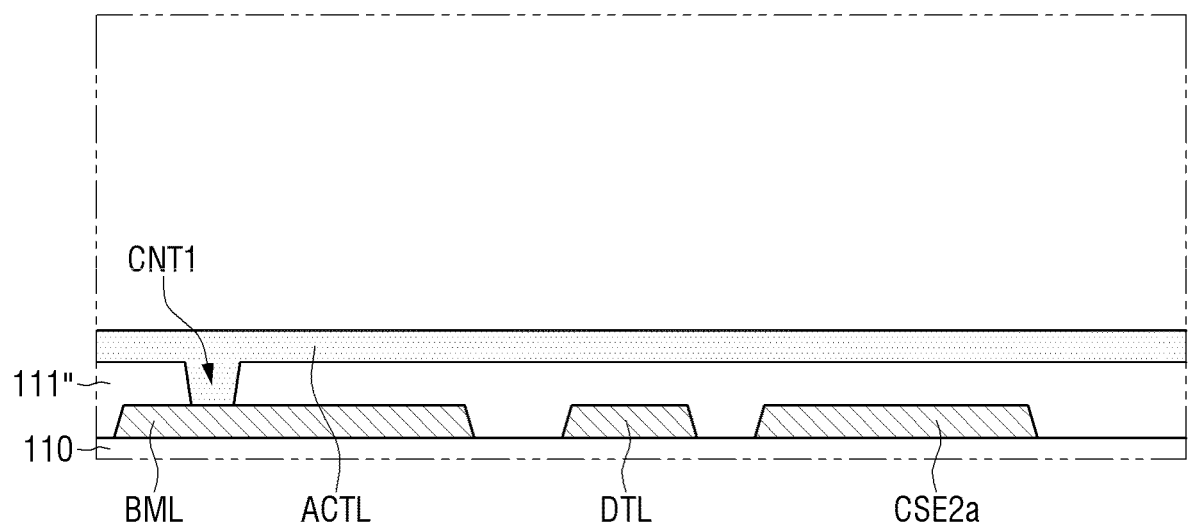

Next, referring to FIGS. 17 and 21, a semiconductor layer ACTL is formed on the buffer layer 111" and the first conductive layer. The semiconductor layer ACTL may be directly connected to the lower light blocking layer BML through the first contact hole CNT1. In some embodiments, the semiconductor layer ACTL may include an oxide semiconductor. For example, the semiconductor layer ACTL may be made of a Zn oxide-based material such as Zn oxide, In—Zn oxide, or Ga—In—Zn oxide, or may be an In—Ga—Zn—O (IGZO) semiconductor in which metals such as Indium (In) and Gallium (Ga) are contained in ZnO. However, the present disclosure is not limited thereto, and the semiconductor layer ACTL may include amorphous silicon or polysilicon.

Figure 22:
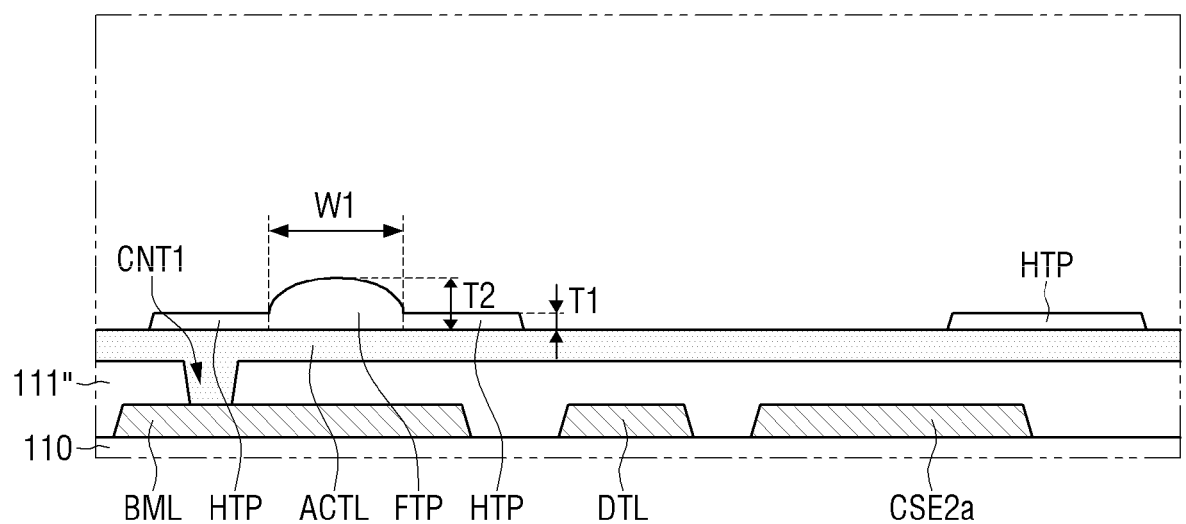

Then, referring to FIGS. 17 and 22, a first photoresist layer is formed on the semiconductor layer ACTL. As shown in FIG. 22, the first photoresist layer may include a fulltone portion (FTP) and a halftone portion (HTP). The fulltone portion FTP may be disposed to overlap a first target area to be described later in FIG. 26, and the halftone portion HTP may be disposed to overlap a second target area, a third target area, and the first capacitance electrode CSE1 to be described later in FIG. 26. The halftone portion HTP may have a first thickness T1, and the fulltone portion FTP may have a second thickness T2 greater than the first thickness T1. The fulltone portion FTP may have a first width W1.

Figure 23:
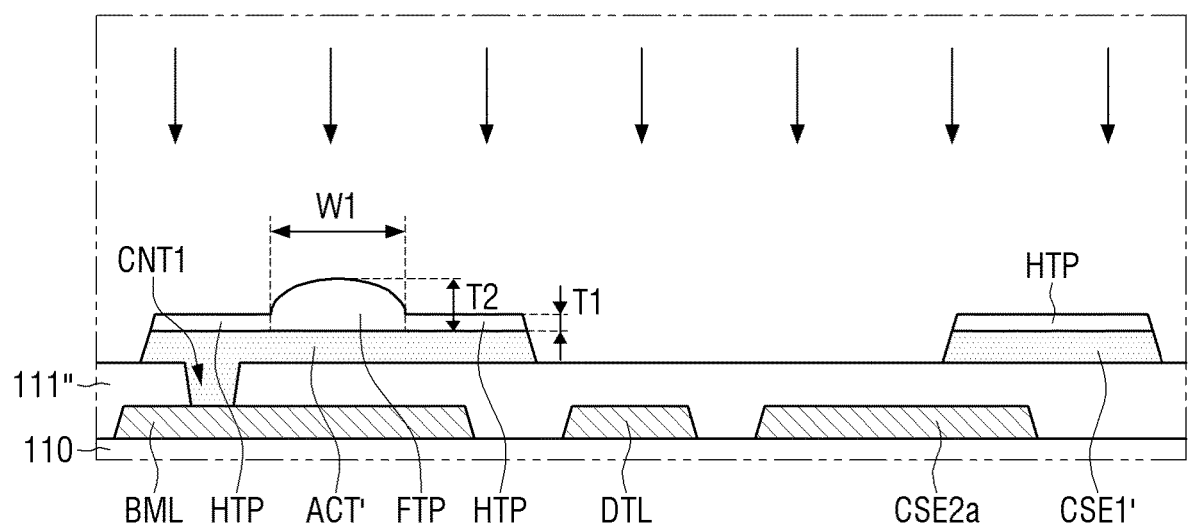

Next, referring to FIGS. 17 and 23, the semiconductor layer ACTL of FIG. 22 is etched using the first photoresist layer. Due to the corresponding process, a semiconductor pattern ACT' and a first capacitance electrode CSE1' are formed.

Figure 24:
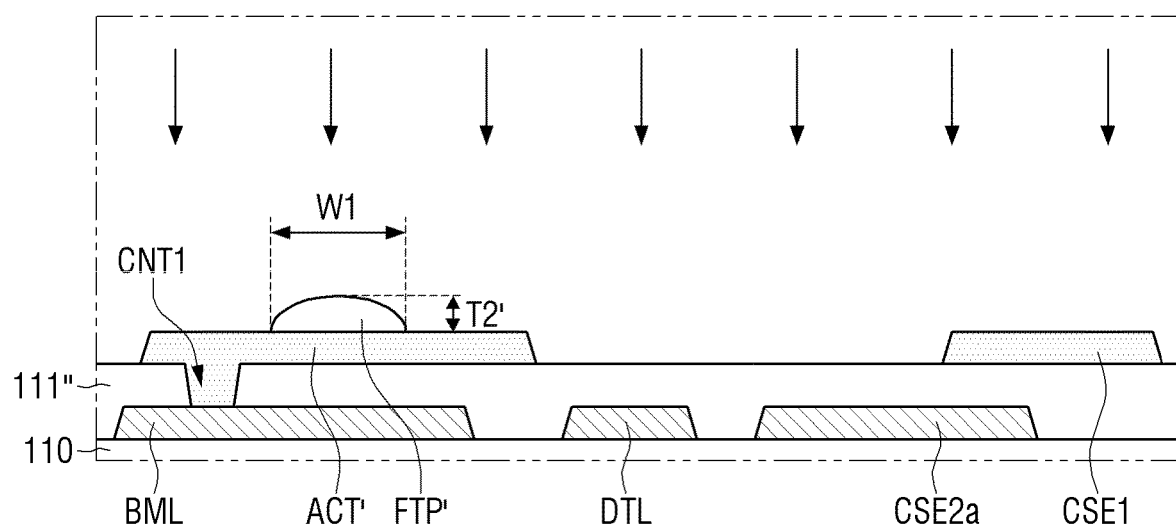

Next, referring to FIGS. 17 and 24, the first photoresist layer of FIG. 23 is etched to remove the halftone portion HTP. Due to the corresponding process, a fulltone portion FTP' may have a second thickness T2' smaller than the second thickness T2. Since the halftone portion HTP is removed, one side and the other side of the top surface of the semiconductor pattern ACT' and the top surface of the first capacitance electrode CSE1' may be exposed. After the first photoresist layer is etched, the halftone portion HTP may be completely removed. However, if the halftone portion HTP is not completely removed, the halftone portion HTP that has not been completely removed may be completely removed by an ashing process in some embodiments.

Figure 25:
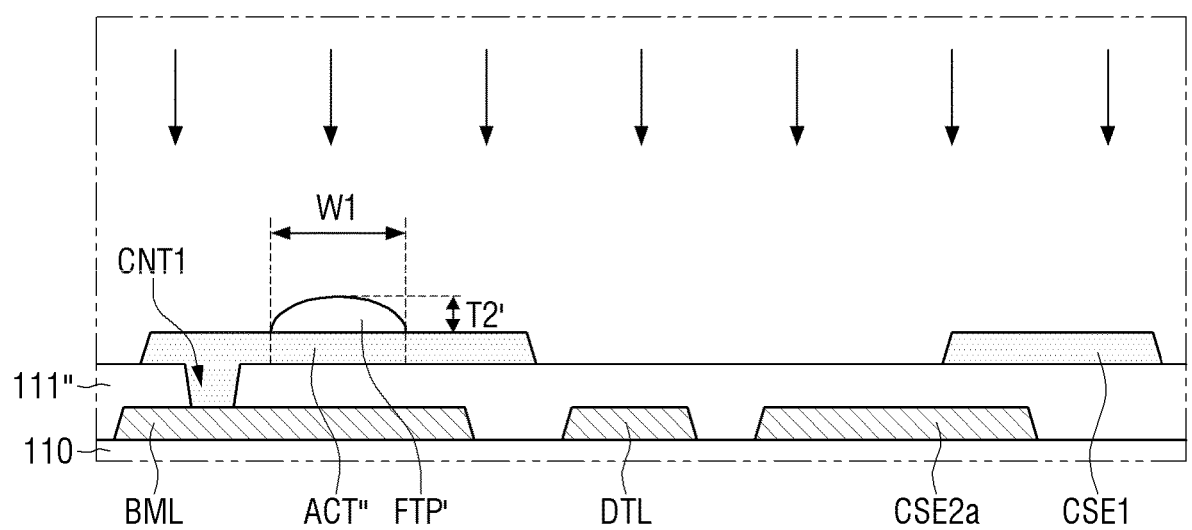

Then, referring to FIGS. 17 and 25, the exposed semiconductor pattern ACT' and the exposed first capacitance electrode CSE1. FIG. 24 are made to be conductive (or made to become conductors). Accordingly, the semiconductor pattern ACT" and the first capacitance electrode CSE1 are formed. The semiconductor pattern ACT" may include a first target area overlapping the fulltone portion FTP', a second target area on the other side of the first target area, and a third target area on one side of the first target area. Each of the second target area and the third target area may not overlap the fulltone portion FTP'. Due to the corresponding process, the conductivity of the second target area, the third target area, and the first capacitance electrode CSE1 may be higher than the conductivity of the first target area. The process of making the exposed semiconductor pattern ACT' and the exposed first capacitance electrode CSE1' of FIG. 24 conductive may be performed by implanting ions such as boron (B) into the second target area, the third target area, and the first capacitance electrode CSE1 that are exposed (hereinafter, referred to as "primary ion implantation process"). Accordingly, the ions such as boron (B) and argon (Ar) may be included in the second target area, the third target area, and the first capacitance electrode CSE1. Argon (Ar) serves to break the molecular structure of the semiconductor pattern ACT" to dope boron (B).

Figure 26:
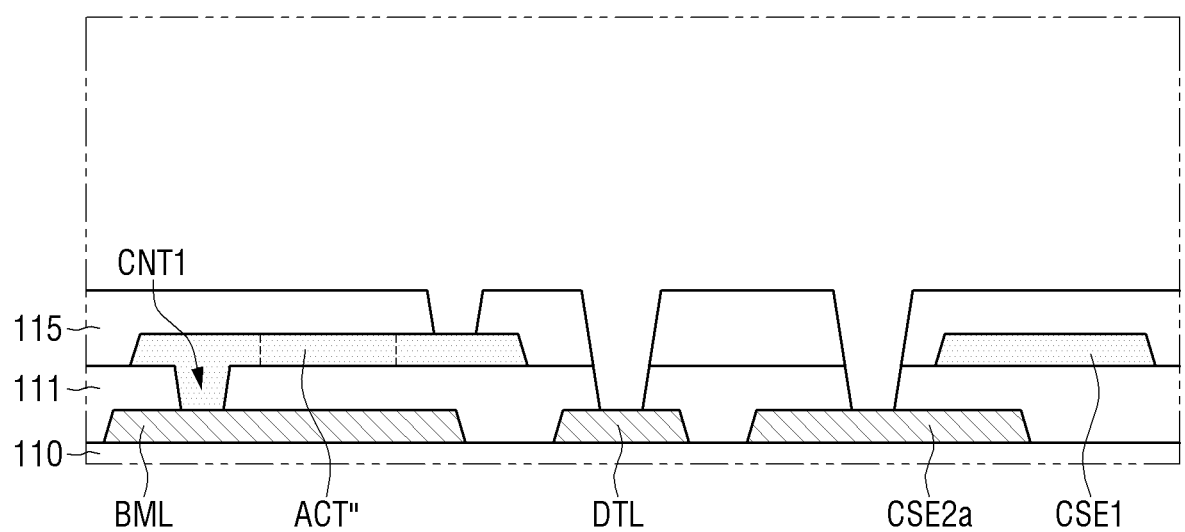

Then, referring to FIGS. 17 and 26, the gate insulating layer 115 is formed on the semiconductor pattern ACT", the first capacitance electrode CSE1, and the buffer layer 111" of FIG. 25. The gate insulating layer 115 may include through-holes penetrating the areas where the contact holes CNT2, CNT3, and CNT4 of FIG. 27 will be formed later from the top surfaces and the bottom surfaces thereof, and the through-holes of the buffer layers 111 may be additionally formed in the areas where the contact holes CNT3 and CNT4 of FIG. 27 will be formed in the process of forming the through-holes of the gate insulating layer 115.

Figure 27:
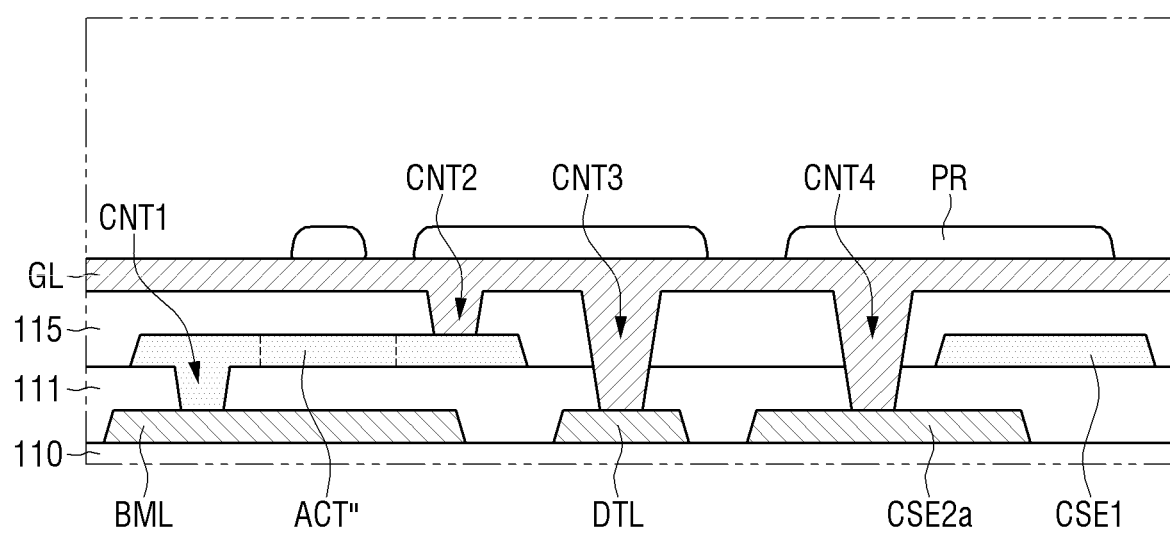

Then, referring to FIGS. 17 and 27, a first conductive layer GL is formed on the gate insulating layer 115, the semiconductor pattern ACT", and the buffer layer 111.

The first conductive layer GL may include one or more materials of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in consideration of adhesion with an adjacent layer, surface flatness of a stacked layer, processability, and the like, and may be formed as a single layer or multiple layers.

The first conductive layer GL may be connected to the semiconductor pattern ACT", the data line DTL, and the first sub-capacitance electrode CSE2a through the contact holes CNT2, CNT3, and CNT4, respectively. The second contact hole CNT2 may be in direct contact with the third target area of the semiconductor pattern ACT".

Next, a second photoresist layer PR is formed on the first conductive layer GL. The second photoresist layer PR may be disposed in an area where the gate electrode GE, the first connection electrode ACNE, and the second sub-capacitance electrode CSE2b to be described later will be formed.

Then, referring to FIGS. 17 and 28, the gate electrode GE, the first connection electrode ACNE, and the second sub-capacitance electrode CSE2b of FIG. 28 are formed by etching the first conductive layer GL of FIG. 27 using the second photoresist layer PR. Meanwhile, the width of the second photoresist layer PR on the gate electrode GE in cross-sectional view may be smaller than the width of the first target area of the semiconductor pattern ACT'.

Then, referring to FIGS. 17 and 29, in the first target area of the semiconductor pattern ACT" of FIG. 28, the area exposed by the second photoresist layer PR on the gate electrode GE is made to be conductive (or made to become a conductor).

Accordingly, the semiconductor pattern ACT may be formed. As shown in FIGS. 17 and 29, the semiconductor pattern ACT may include the first to third areas ACTa, ACTb, and ACTc. The first area ACTa may overlap the gate electrode GE in the thickness direction.

The process of making the area exposed by the second photoresist layer PR on the gate electrode GE in the first target area of the semiconductor pattern ACT" of FIG. 28 conductive (the process of making it a conductor) may be performed by implanting ions such as boron (B) or argon (Ar) into the exposed first target area (hereinafter, referred to as "secondary ion implantation process"). Accordingly, the second area ACTb and the third area ACTc may include ions such as boron (B) or argon (Ar), and the first area ACTa may not include ions such as boron (B) or argon (Ar).

FIGS. 30 to 34 are cross-sectional views showing the steps of a method of manufacturing a display device according to another embodiment.

The method of manufacturing a display device according to the present embodiment of FIGS. 30 to 34 is different from the method of manufacturing a display device of FIGS. 22 to 29 in that the semiconductor pattern ACT is formed only by the primary ion implantation process without performing both the first ion implantation process and the secondary ion implantation process as shown in FIGS. 22 to 29.

Figure 30:
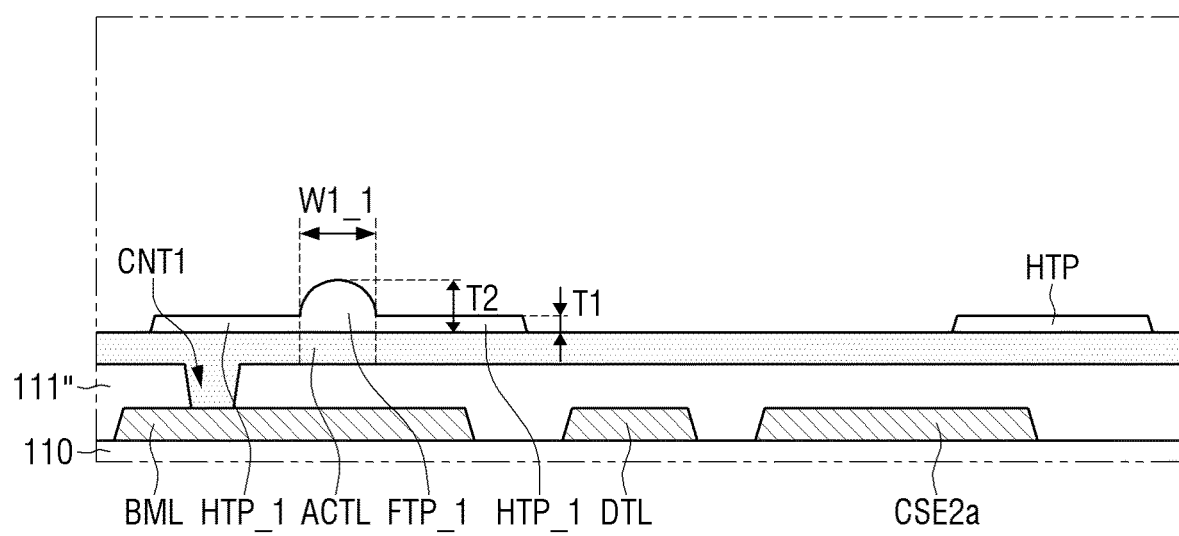
FIGS. 30, 31, 32, 33, and 34 are cross-sectional views showing the steps of a method of manufacturing a display device according to another embodiment.

More specifically, a first width W1_1 of a fulltone portion FTP_1 of FIG. 30 may be smaller than the first width W1 of the fulltone portion FTP of FIG. 22. The fulltone portion FTP_1 may be disposed in the area corresponding to the first area ACTa of FIG. 34. Since the first width W1_1 of the fulltone portion FTP_1 is reduced, the widths of halftone portions HTP_1 adjacent to the fulltone portion FTP_1 may be smaller than the width of the halftone portion HTP of FIG. 22.

Figure 31:
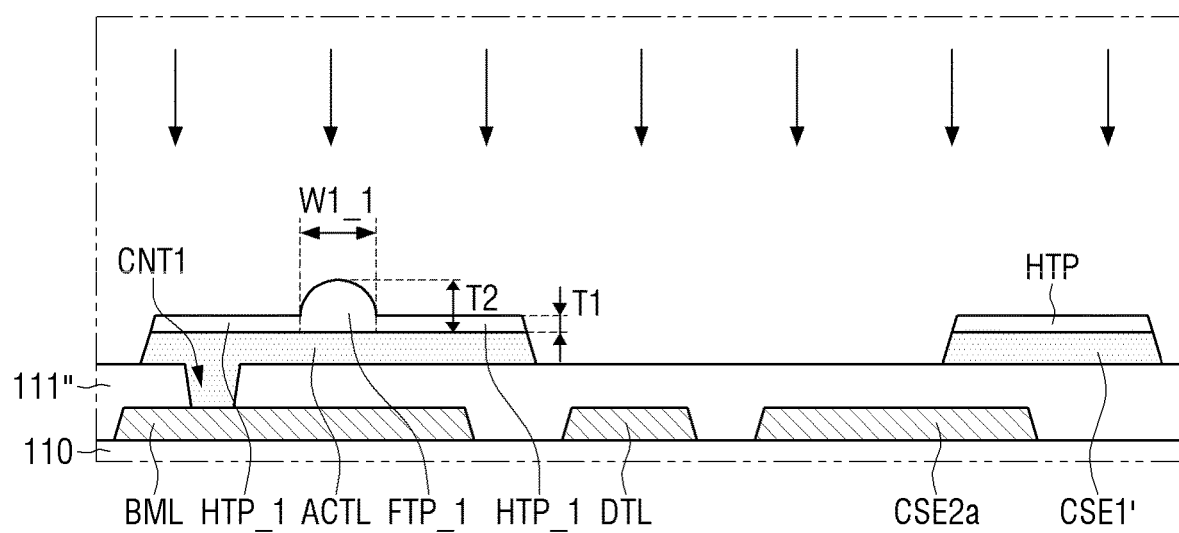

Next, referring to FIG. 31, the semiconductor layer ACTL of FIG. 30 is etched using the first photoresist layer of FIG. 30. Due to the corresponding process, the semiconductor pattern ACT' and the first capacitance electrode CSE1' are formed.

Figure 32:
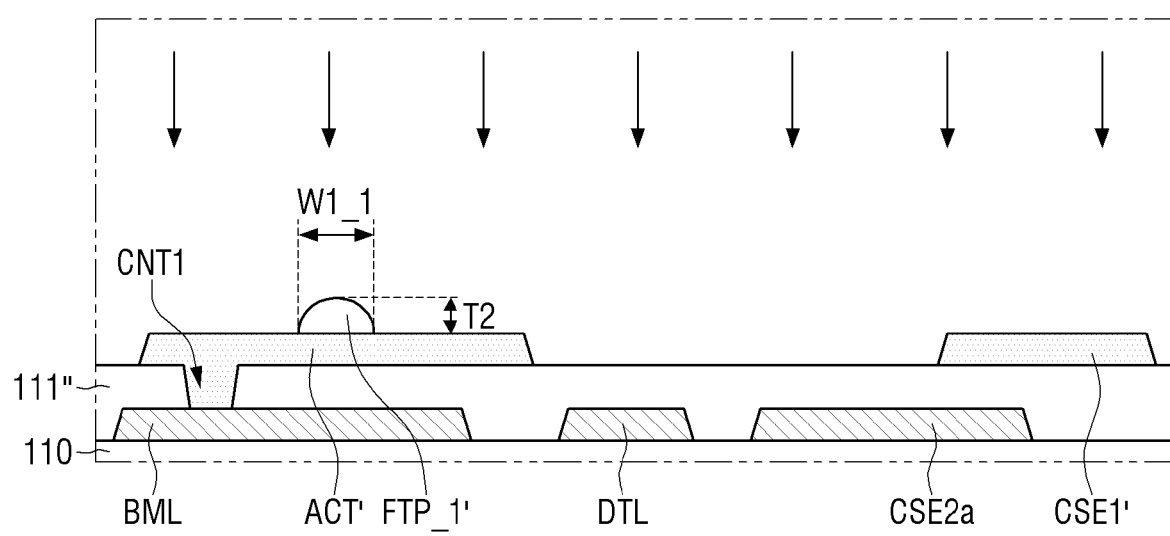

Next, referring to FIG. 32, the first photoresist layer of FIG. 31 is etched to remove the halftone portions HTP and HTP_1. Due to the corresponding process, the fulltone portion FTP_1' may have the second thickness T2' smaller than the second thickness T2. Since the halftone portions HTP and HTP_1 are removed, one side and the other side of the top surface of the semiconductor pattern ACT' and the top surface of the first capacitance electrode CSE1' may be exposed. After the first photoresist layer is etched, the halftone portions HTP and HTP_1 may be completely removed. However, if the halftone portions HTP and HTP_1 are not completely removed, in some embodiments, the halftone portions HTP and HTP_1 that have not been completely removed may be completely removed by an ashing process.

Figure 33:
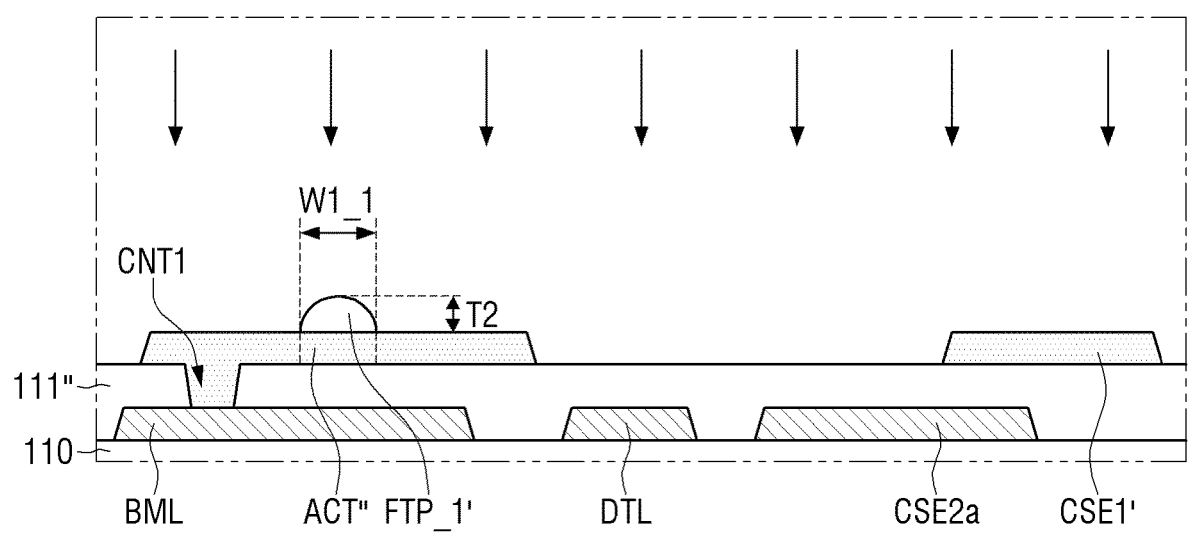
Figure 34:
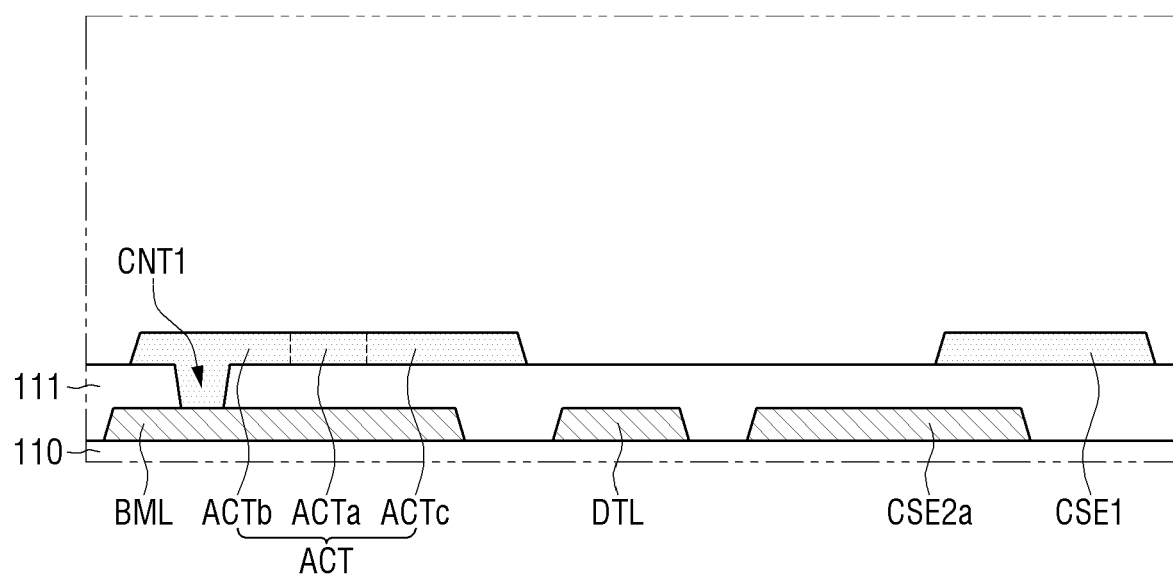

Next, referring to FIG. 33, the exposed semiconductor pattern ACT" and the exposed first capacitance electrode CSE1' of FIG. 33 are made to be conductive (or made to become conductors). Accordingly, the semiconductor pattern ACT and the first capacitance electrode CSE1 of FIG. 34 are formed. The process of making the exposed semiconductor pattern ACT' and the exposed first capacitance electrode CSE1' of FIG. 33 conductive may be performed by implanting ions such as boron (B) or argon (Ar) into the exposed areas of the semiconductor layer ACT" and the first capacitance electrode CSE1 (hereinafter, referred to as "primary ion implantation process"). Accordingly, the ions such as boron (B) or argon (Ar) may be included in the second area ACTb, the third area ACTc, and the first capacitance electrode CSE1.

Hereinafter, display devices according to other embodiments be described.

Figure 35:
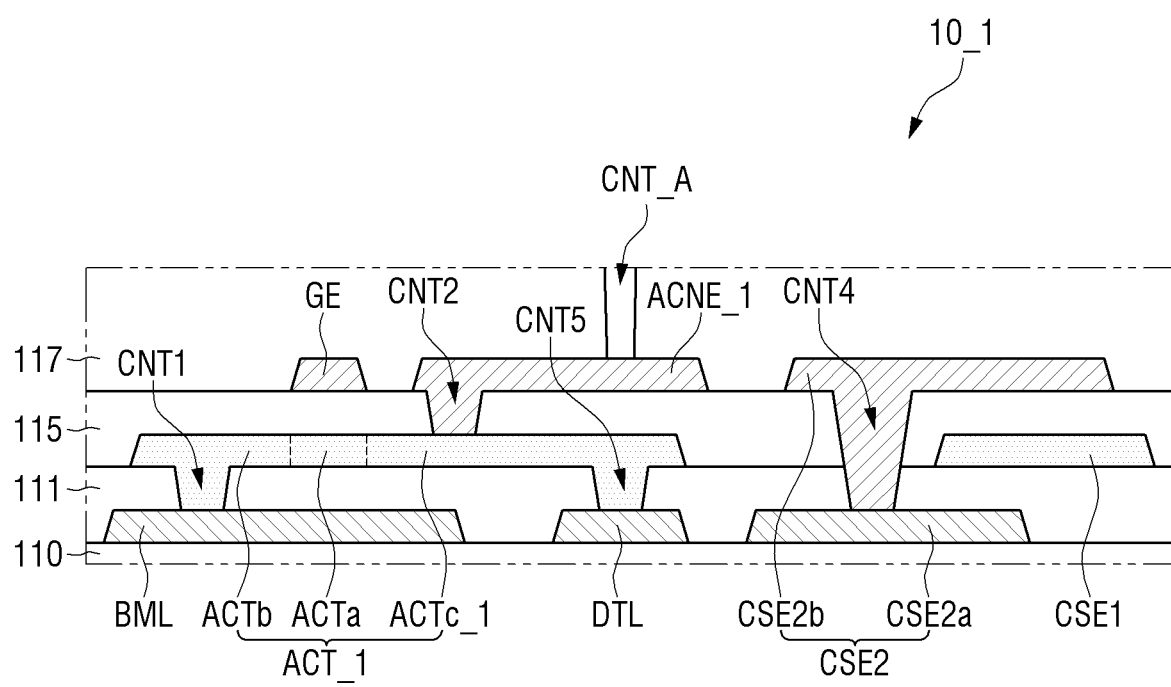
FIG. 35 is a cross-sectional view of a display device according to another embodiment.

FIG. 35 is a cross-sectional view of a display device according to another embodiment.

Referring to FIG. 35, a display substrate 10_1 of the display device according to the present embodiment is different from the display device of FIG. 17 in that it includes a semiconductor pattern ACT_1.

More specifically, the semiconductor pattern ACT_1 according to the present embodiment may include a third area ACTc_1, and the third area ACTc_1 may be directly connected to the data line DTL through a fifth contact hole CNT5. The fifth contact hole CNT5 may penetrate the buffer layer 111 in the thickness direction.

In the present embodiment as well, the first capacitor may be formed between the first sub-capacitance electrode CSE2a and the first capacitance electrode CSE1, and the second capacitor may be formed between the second sub-capacitance electrode CSE2b and the first capacitance electrode CSE1. Since the first sub-capacitance electrode CSE2a and the second sub-capacitance electrode CSE2b are electrically connected to each other, the first capacitor and the second capacitor form a parallel relationship and, thus, the capacitance may be increased compared to the capacitor formed between any one of the first sub-capacitance electrode CSE2a and the second sub-capacitance electrode CSE2b and the first capacitance electrode CSE1.

Furthermore, since the second area CTb is electrically connected to the lower light blocking layer BML by the direct contact therewith while penetrating the buffer layer 111, and the third area ACTc_1 is electrically connected to the data line DTL by the direct contact therewith, it is advantageous in that the number of steps may be reduced by omitting the separate conductive layer and an increase in the number of masks may be prevented.

Figure 36:
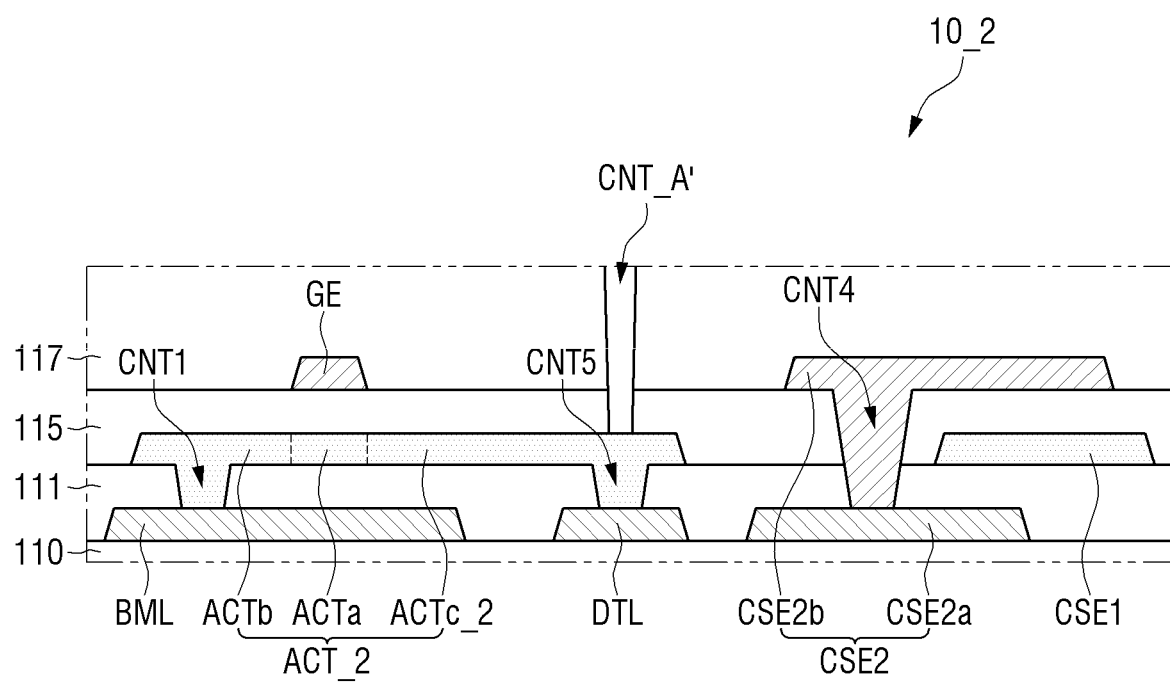
FIG. 36 is a cross-sectional view of a display device according to still another embodiment.

FIG. 36 is a cross-sectional view of a display device according to still another embodiment.

Referring to FIG. 36, a display substrate 10_2 of the display device according to the present embodiment is different from the display device of FIG. 17 in that it includes a semiconductor pattern ACT_2.

More specifically, the semiconductor pattern ACT_2 according to the present embodiment may include a third area ACTc_2, and the third area ACTc_2 may be directly connected to the data line DTL through the fifth contact hole CNT5. The fifth contact hole CNT5 may penetrate the buffer layer 111 in the thickness direction. Furthermore, in the display substrate 10_2, the first connection electrode ACNE of FIG. 17 is omitted, so that the third area ACTc_2 may be directly connected to the anode electrodes AE1, AE2, and AE3 of FIG. 10 through a contact hole CNT_A'.

In the present embodiment as well, the first capacitor may be formed between the first sub-capacitance electrode CSE2a and the first capacitance electrode CSE1, and the second capacitor may be formed between the second sub-capacitance electrode CSE2b and the first capacitance electrode CSE1. Since the first sub-capacitance electrode CSE2a and the second sub-capacitance electrode CSE2b are electrically connected to each other, the first capacitor and the second capacitor form a parallel relationship, so that the capacitance may be increased compared to the capacitor formed between any one of the first sub-capacitance electrode CSE2a and the second sub-capacitance electrode CSE2b and the first capacitance electrode CSE1.

Furthermore, since the second area ACTb is electrically connected to the lower light blocking layer BML by the direct contact therewith while penetrating the buffer layer 111, and the third area ACTc_2 is electrically connected to the data line DTL by the direct contact therewith, it is advantageous in that the number of steps may be reduced by omitting the separate conductive layer and an increase in the number of masks may be prevented.

Further, when the first connection electrode ACNE is omitted, a contact hole tolerance for connecting the first connection electrode ACNE and the third area ACTc_2 and a design margin that has reflected a process error of the first connection electrode ACNE may not be considered. That is, since the design margin is reduced due to the first connection electrode ACNE, the area of the sub-pixel SPXn may be reduced. Therefore, when the first connection electrode ACNE1 is omitted as shown in FIG. 36, a design for a high-resolution display device may be facilitated.

Figure 37:
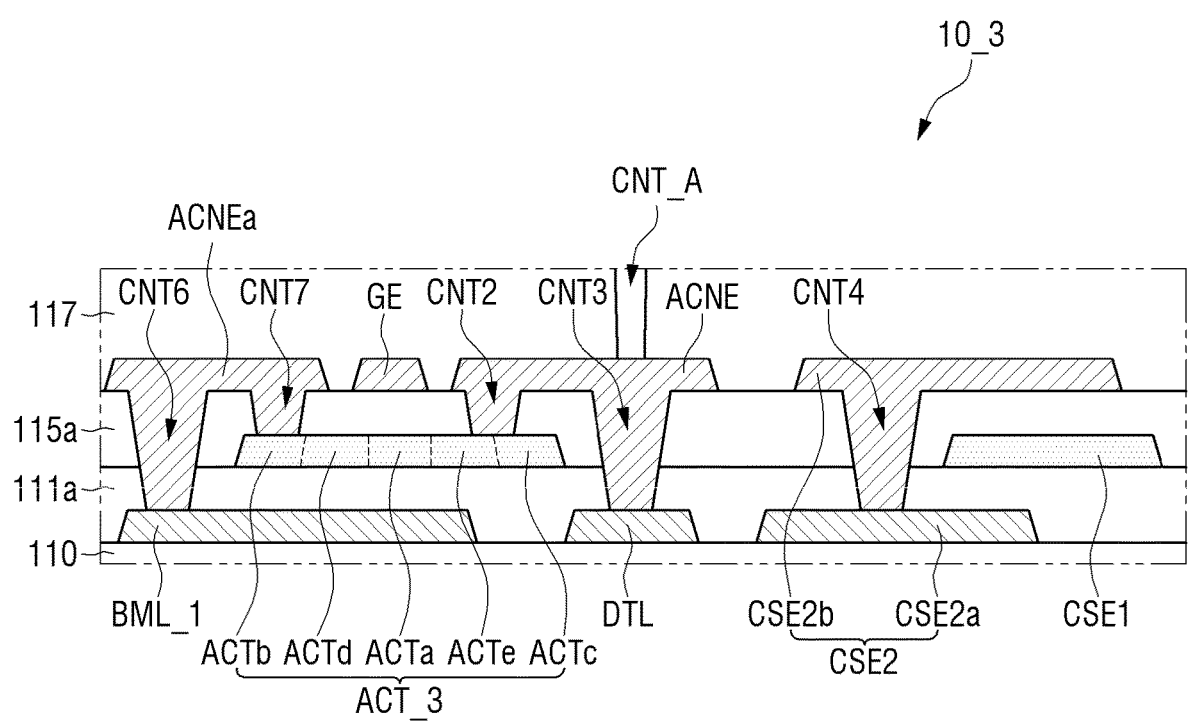
FIG. 37 is a cross-sectional view of a display device according to still another embodiment.

FIG. 37 is a cross-sectional view of a display device according to still another embodiment.

Referring to FIG. 37, a display substrate 10_3 of the display device according to the present embodiment is different from the display device of FIG. 17 in that it includes a semiconductor pattern ACT_3.

More specifically, the semiconductor pattern ACT_3 according to the present embodiment may further include a fourth area ACTd and a fifth area ACTe. The fourth area ACTd may be disposed between the second area ACTb and the first area ACTa, and the fifth area ACTe may be disposed between the third area ACTc and the first area ACTa. The conductivity of the fourth area ACTd and the fifth area ACTe may be the same as the conductivity of the second area ACTb. However, the present disclosure is not limited thereto, and the conductivity of the fourth area ACTd and the fifth area ACTe may be different from the conductivity of the second area ACTb. The conductivity of the fourth area ACTd and the fifth area ACTe may be higher than the conductivity of the first area ACTa.

Furthermore, the display substrate 10_3 may further include a second connection electrode ACNEa. The second connection electrode ACNEa and the first connection electrode ACNE may be positioned on the same layer, and may include the same material. The second connection electrode ACNEa may overlap the second area ACTb and a lower light blocking layer BML_1. The second connection electrode ACNEa may be directly connected to the lower light blocking layer BML_1 and the second area ACTb through contact holes CNT6 and CNT7, respectively. The sixth contact hole CNT6 may penetrate a gate insulating layer 115a and the buffer layer 111a, and the seventh contact hole CNT7 may penetrate the gate insulating layer 115a.

In the present embodiment as well, the first capacitor may be formed between the first sub-capacitance electrode CSE2a and the first capacitance electrode CSE1, and the second capacitor may be formed between the second sub-capacitance electrode CSE2b and the first capacitance electrode CSE1. Since the first sub-capacitance electrode CSE2a and the second sub-capacitance electrode CSE2b are electrically connected to each other, the first capacitor and the second capacitor form a parallel relationship, so that the capacitance may be increased compared to the capacitor formed between any one of the first sub-capacitance electrode CSE2a and the second sub-capacitance electrode CSE2b and the first capacitance electrode CSE1.

Furthermore, since the second area ACTb is electrically connected to the lower light blocking layer BML_1 through the second connection electrode ACNEa, and the third area ACTc is electrically connected to the data line DTL through the first connection electrode ACNE, it is advantageous in that the number of steps may be reduced by omitting the separate conductive layer and an increase in the number of masks may be prevented.

FIGS. 38 to 49 are cross-sectional views showing the steps of a method of manufacturing a display device according to still another embodiment. FIGS. 38 to 49 relate to a method of manufacturing the display device of FIG. 37. The above-described FIG. 37 may be further referred to in describing the steps of the method of manufacturing a display device with reference to FIGS. 38 to 49.

Figure 38:
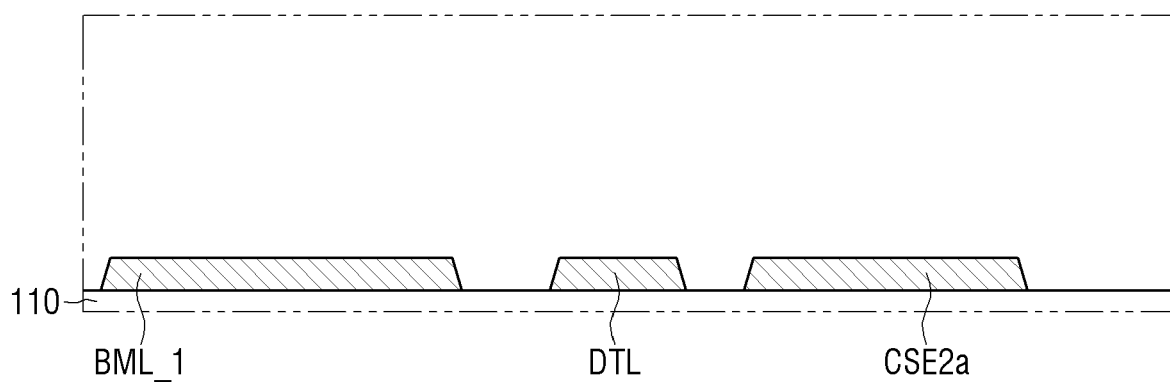
FIGS. 38, 39, 40, 41, 42, 43, 44, 45, 46, 47, 48, and 49 are cross-sectional views showing the steps of a method of manufacturing a display device according to still another embodiment.

Referring to FIGS. 37 and 38, a first conductive layer is formed on the first base portion 110. The first conductive layer may include the lower light blocking layer BML_1, the data line DTL, and the first sub-capacitance electrode CSE2a of the second capacitance electrode CSE2.

In some embodiments, the first conductive layer may be made of a material that blocks light and has conductivity. For example, the first conductive layer may include a single material among metals such as silver (Ag), nickel (Ni), gold (Au), platinum (Pt), aluminum (Al), copper (Cu), molybdenum (Mo), titanium (Ti), and neodymium (Nd), or an alloy thereof. In some embodiments, the first conductive layer may have a single layer or multi-layer structure. For example, when the first conductive layer has a multi-layer structure, the first conductive layer may be a stacked structure of titanium (Ti)/copper (Cu)/indium tin oxide (ITO) or titanium (Ti)/copper (Cu)/aluminum oxide ($Al_2O_3$), but the present disclosure is not limited thereto.

Figure 39:
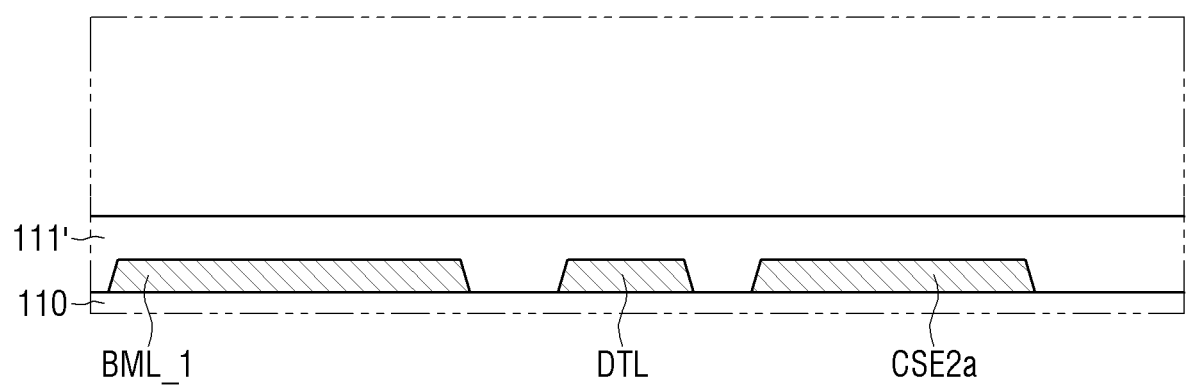

Next, referring to FIGS. 37 and 39, a buffer layer 111' is formed on the first conductive layer. The buffer layer 111' may block foreign substances or moisture permeating through the first base portion 110. For example, the buffer layer 111' may include an inorganic material such as $SiO_2$, SiNx, or SiON, and may be formed as a single layer or multiple layers.

Figure 40:
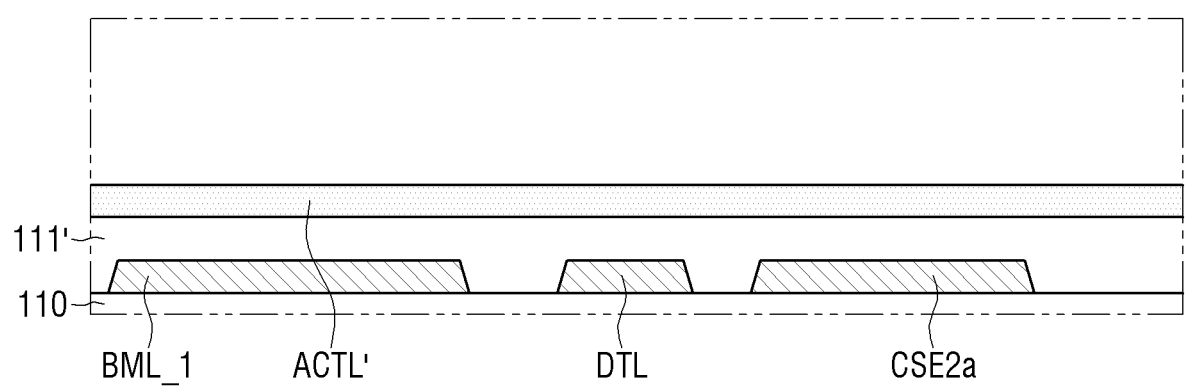

Next, referring to FIGS. 37 and 40, a semiconductor layer ACTL' is formed on the buffer layer 111'. In some embodiments, the semiconductor layer ACTL' may include an oxide semiconductor. For example, the semiconductor layer ACTL' may be made of a Zn oxide-based material such as Zn oxide, In—Zn oxide, or Ga—In—Zn oxide, and may be an In—Ga—Zn—O (IGZO) semiconductor in which metals such as indium (In) and gallium (Ga) are contained in ZnO. However, the present disclosure is not limited thereto, and the semiconductor layer ACTL' may include amorphous silicon or polysilicon.

Figure 41:
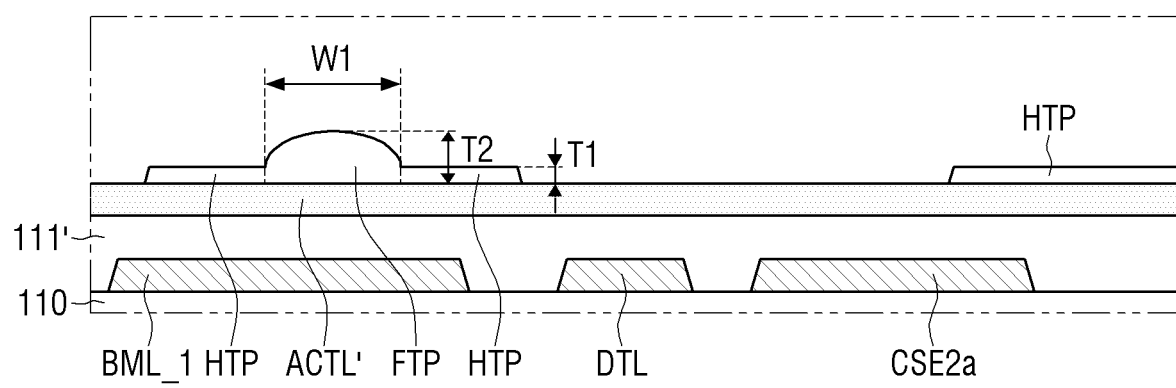

Next, referring to FIGS. 37 and 41, a first photoresist layer is formed on the semiconductor layer ACTL'. As shown in FIG. 41, the first photoresist layer may include the fulltone portion (FTP) and the halftone portion (HTP). The fulltone portion FTP may be disposed to overlap a first target area to be described later in FIG. 44, and the halftone portion HTP may be disposed to overlap a second target area, a third target area, and the first capacitance electrode CSE1 to be described later in FIG. 44. The halftone portion HTP may have the first thickness T1, and the fulltone portion FTP may have the second thickness T2 greater than the first thickness T1. The fulltone portion FTP may have the first width W1.

Figure 42:
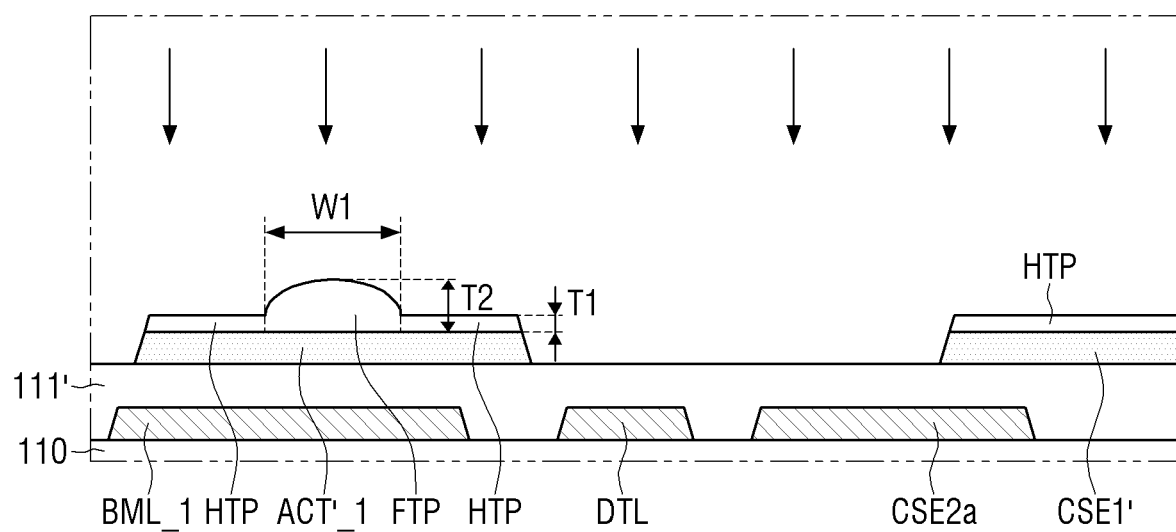

Next, referring to FIGS. 37 and 42, the semiconductor layer ACTL' of FIG. 41 is etched using the first photoresist layer. Due to the corresponding process, a semiconductor pattern ACT'_1 and the first capacitance electrode CSE1' are formed.

Figure 43:
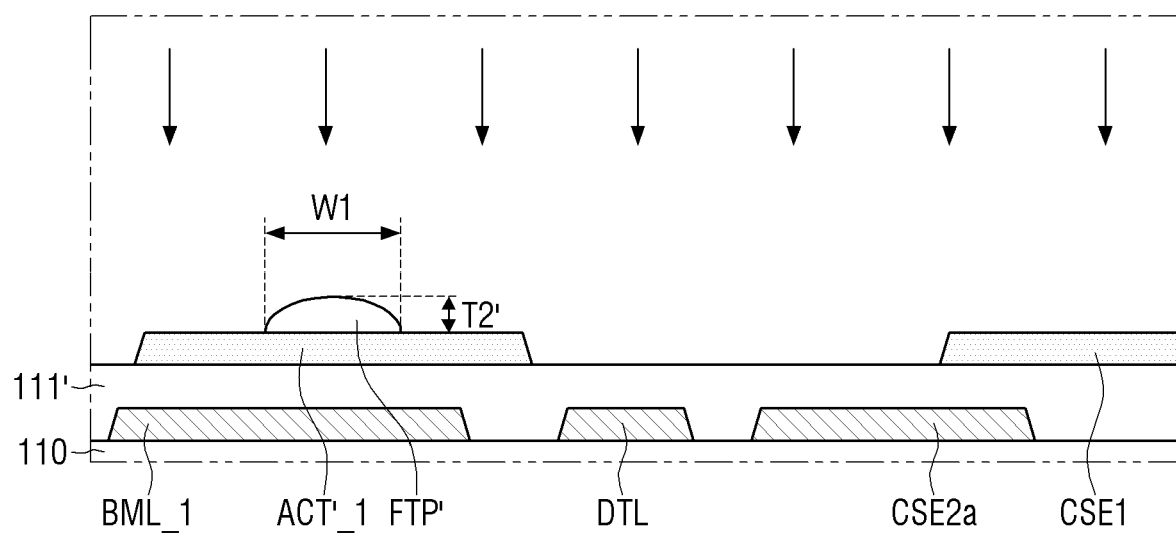

Next, referring to FIGS. 37 and 43, the halftone portion HTP is removed by etching the first photoresist layer of FIG. 42. Due to the corresponding process, the fulltone portion FTP' may have the second thickness T2' smaller than the second thickness T2. Since the halftone portion HTP is removed, one side and the other side of the top surface of the semiconductor pattern ACT'_1 and the top surface of the first capacitance electrode CSE1' may be exposed. After the first photoresist layer is etched, the halftone portion HTP may be completely removed. If the halftone portion HTP is not completely removed, in some embodiments, the halftone portion HTP that has not be completely removed may be completely removed by an ashing process.

Figure 44:
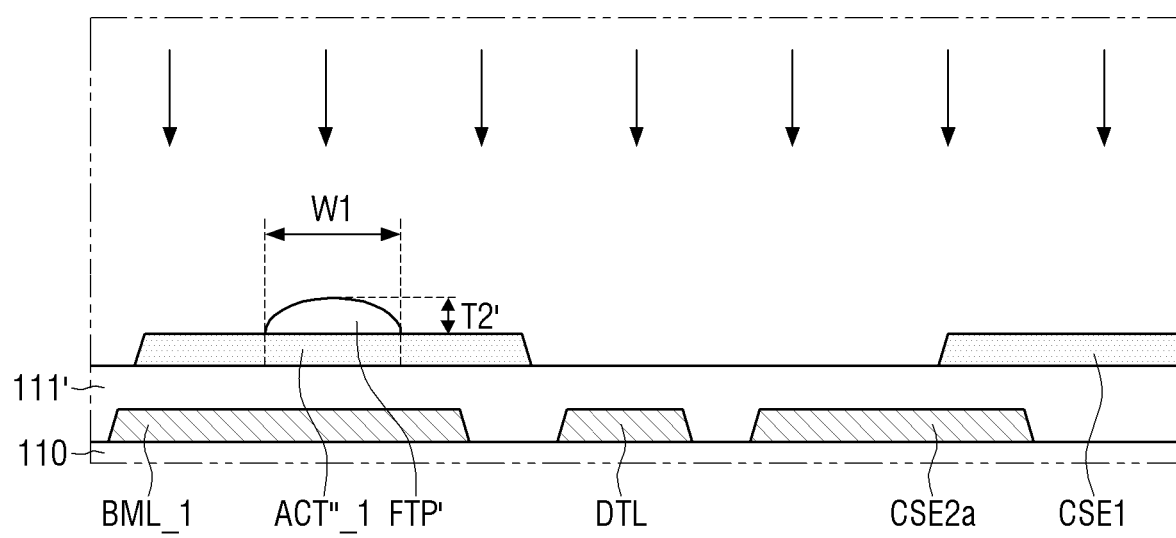

Next, referring to FIGS. 37 and 44, the exposed semiconductor pattern ACT'_1 and the exposed first capacitance electrode CSE1' of FIG. 43 are made to be conductive (or made to become conductors). Accordingly, a semiconductor pattern ACT"_1 and the first capacitance electrode CSE1 are formed. The semiconductor pattern ACT"_1 may include a first target area overlapping the fulltone portion FTP', a second target area on the other side of the first target area, and a third target area on one side of the first target area. Each of the second target area and the third target area may not overlap the fulltone portion FTP'. Due to the corresponding process, the conductivity of the second target area, the third target area, and the first capacitance electrode CSE1 may be higher than the conductivity of the first target area. The process of making the exposed semiconductor pattern ACT'_1 and the exposed first capacitance electrode CSE1' of FIG. 43 conductive may be performed by implanting ions such as boron (B) or argon (Ar) into the second target area, the third target area, and the first capacitance electrode CSE1 that are exposed (hereinafter, referred to as "primary ion implantation process"). Accordingly, the ions such as boron (B) or argon (Ar) may be included in the second target area, the third target area, and the first capacitance electrode CSE1.

Figure 45:
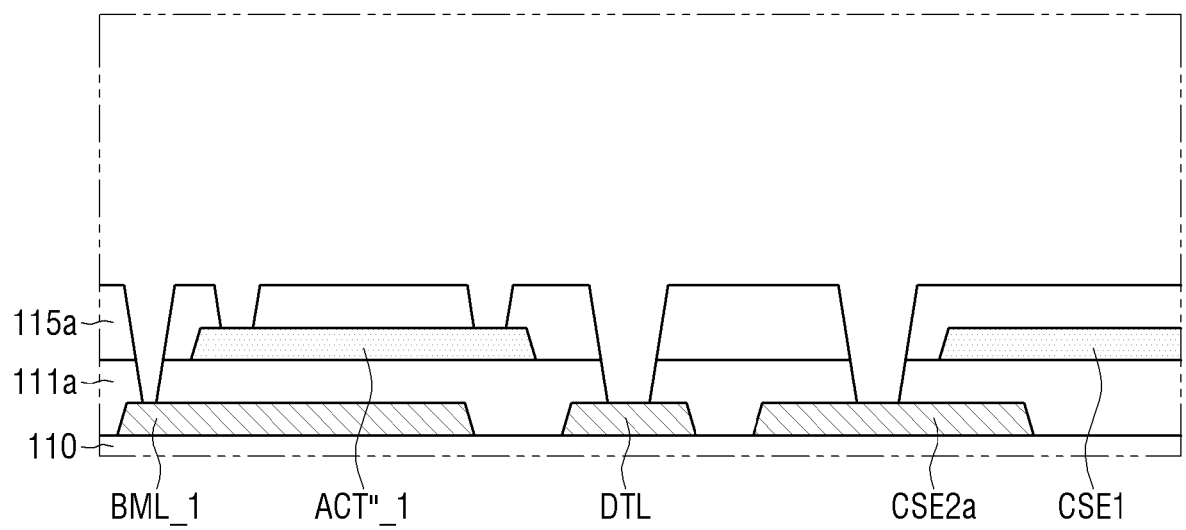

Next, referring to FIGS. 37 and 45, the gate insulating layer 115a is formed on the semiconductor pattern ACT"_1, the first capacitance electrode CSE1, and the buffer layer 111' of FIG. 44. The gate insulating layer 115a may include through-holes penetrating the areas where the contact holes CNT2, CNT3, CNT4, CNT5, and CNT6 of FIG. 46 will be formed later from the top surfaces to the bottom surfaces thereof, and the through-holes of the buffer layers 111a may be additionally formed in the areas where the contact holes CNT3, CNT4, and CNT6 of FIG. 46 will be formed in the process of forming the through-holes of the gate insulating layer 115a.

Figure 46:
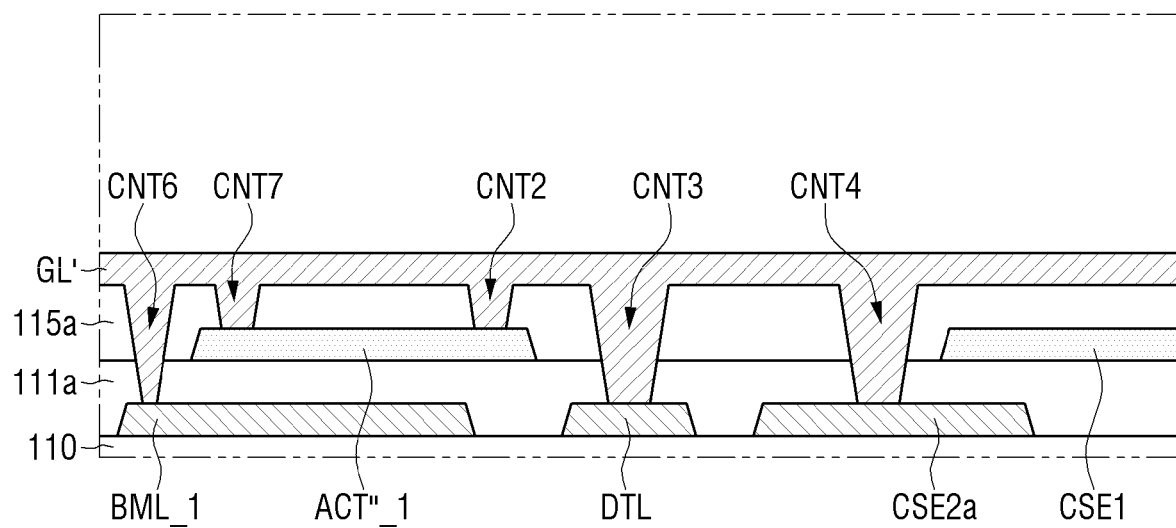

Next, referring to FIGS. 37 and 46, a first conductive layer GL' is formed on the gate insulating layer 115a, the semiconductor pattern ACT"_1, and the buffer layer 111a.

The first conductive layer GL' may include one or more materials of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in consideration of adhesion with an adjacent layer, surface flatness of a stacked layer, processability, and the like, and may be formed as a single layer or multiple layers.

The first conductive layer GL' may be connected to the semiconductor pattern ACT"_1, the data line DTL, and the first sub-capacitance electrode CSE2a through the contact holes CNT2, CNT3, and CNT4, respectively. The second contact hole CNT2 may be in direct contact with the third target area of the semiconductor pattern ACT". Furthermore, the first conductive layer GL' may be connected to the semiconductor pattern ACT"_1 and the lower light blocking layer BML_1 through the contact holes CNT6 and CNT7, respectively. The seventh contact hole CNT7 may be in direct contact with the second target area of the semiconductor pattern ACT"_1.

Figure 47:
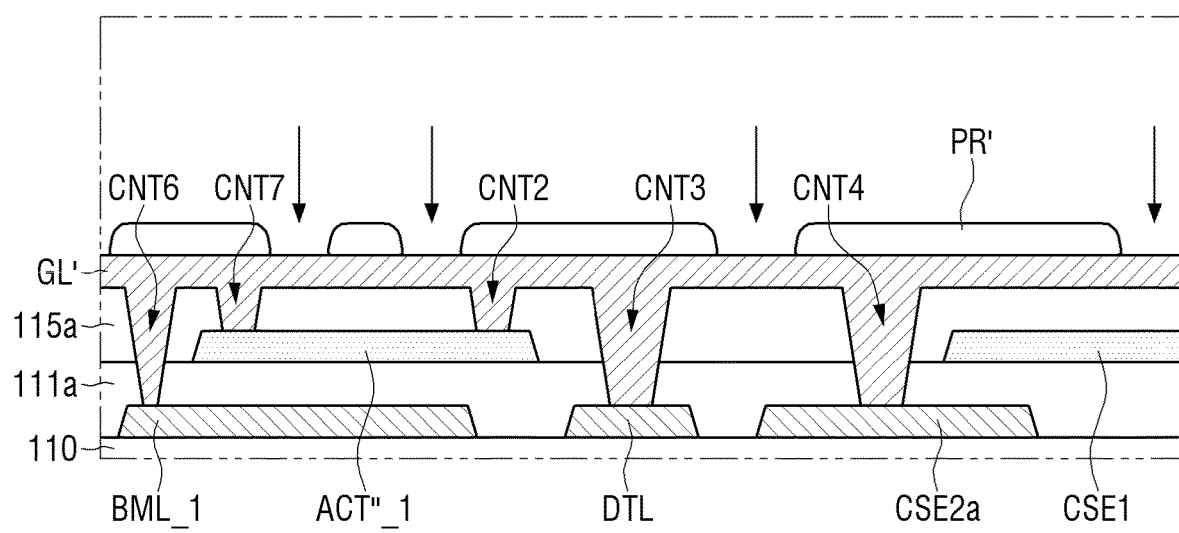

Next, as shown in FIGS. 37 and 47, a second photoresist layer PR' is formed on the first conductive layer GL'. The second photoresist layer PR' may be disposed in the area where the gate electrode GE, the first connection electrode ACNE, the second connection electrode ACNEa, and the second sub-capacitance electrode CSE2b to be described later will be formed.

Figure 48:
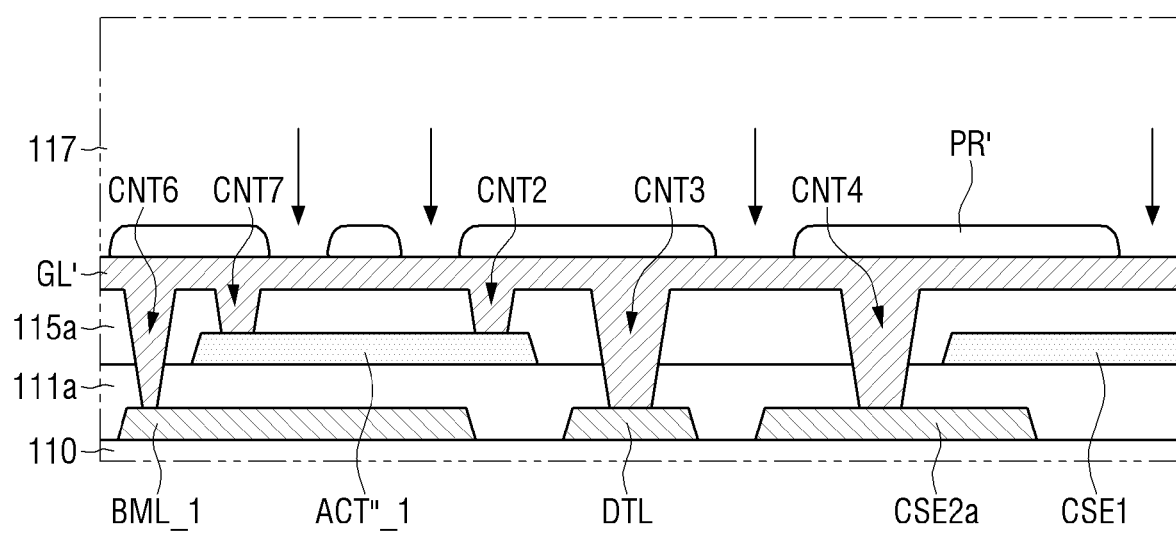

Next, referring to FIGS. 37 and 48, the first conductive layer GL' of FIG. 47 may be etched using the second photoresist layer PR' to form the gate electrode GE, the first connection electrode ACNE, the second connection electrode ACNEa, and the second sub-capacitance electrode CSE2b of FIG. 48. Meanwhile, the width of the second photoresist layer PR on the gate electrode GE in cross-sectional view may be smaller than the width of the first target area of the semiconductor pattern ACT"_1.

Figure 49:
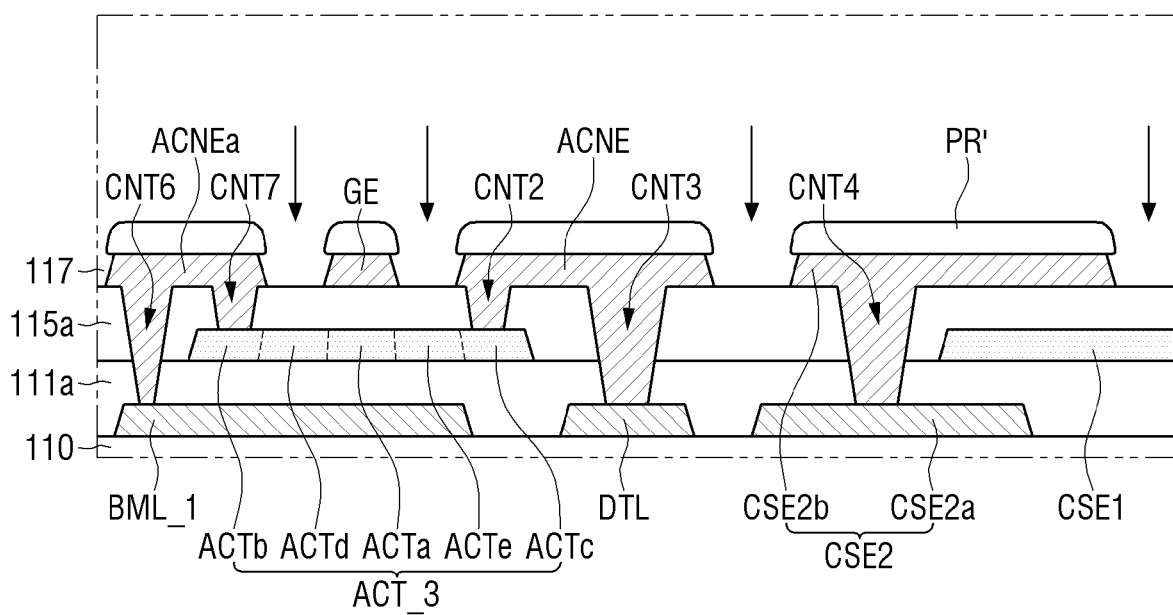

Next, referring to FIGS. 37 and 49, in the first target area of the semiconductor pattern ACT"_1 of FIG. 48, the areas exposed by the second photoresist layer PR' on the gate electrode GE, the second photoresist layer PR' on the first connection electrode, and the second photoresist layer PR on the second connection electrode ACNEa are made to be conductive (or made to become conductors). Accordingly, the semiconductor pattern ACT_3 may be formed. As shown in FIGS. 37 and 49, the semiconductor pattern ACT_3 may include the first to fifth areas ACTa, ACTb, ACTc, ACTd, and ACTe. The first area ACTa may overlap the gate electrode GE in the thickness direction.

The process of making the areas exposed by the second photoresist layer PR' on the gate electrode GE, the second photoresist layer PR' on the first connection electrode ACNE, and the second photoresist layer PR on the second connection electrode ACNEa in the first target area of the semiconductor pattern ACT"_1 of FIG. 48 conductive (the process of making them conductors) may be performed by implanting ions such as boron (B) or argon (Ar) into the exposed first target area (hereinafter, referred to as "secondary ion implantation process"). Accordingly, the second area ACTb, the third area ACTc, the fourth area ACTd, and the fifth area ACTe may include ions such as boron (B) or argon (Ar), and the first area ACTa may not include ions such as boron (B) or argon (Ar).

Figure 50:
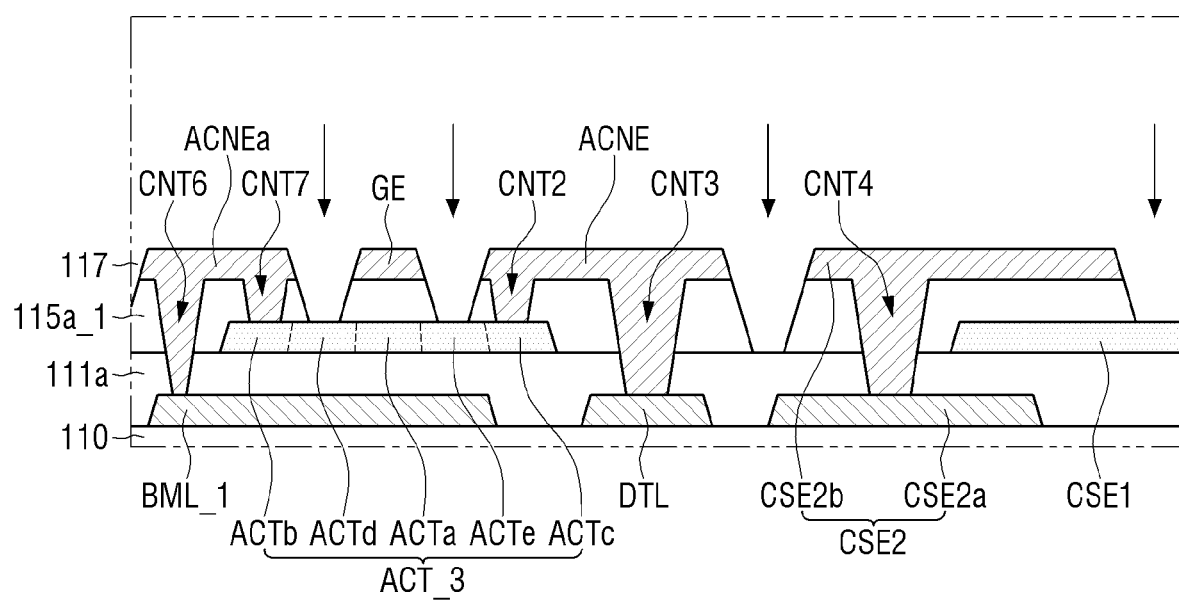
FIG. 50 is a cross-sectional view of a display device according to still another embodiment.

FIG. 50 is a cross-sectional view of a display device according to still another embodiment.

Referring to FIG. 50, a display substrate 10_4 of the display device according to the present embodiment is different from the display device of FIG. 37 in that the conductivity of the fourth area ACTd and the fifth area ACTe is higher than the conductivity of the second area ACTb.

More specifically, a gate insulating layer 115a_1 may additionally include through-holes penetrating the areas overlapping the gate electrode GE, the first connection electrode ACNE, and the second connection electrode ACNEa of the second conductive layer on the gate insulating layer 115a of FIG. 37. The through-holes may overlap the fourth area ACTd and the fifth area ACTe.

Figure 51:
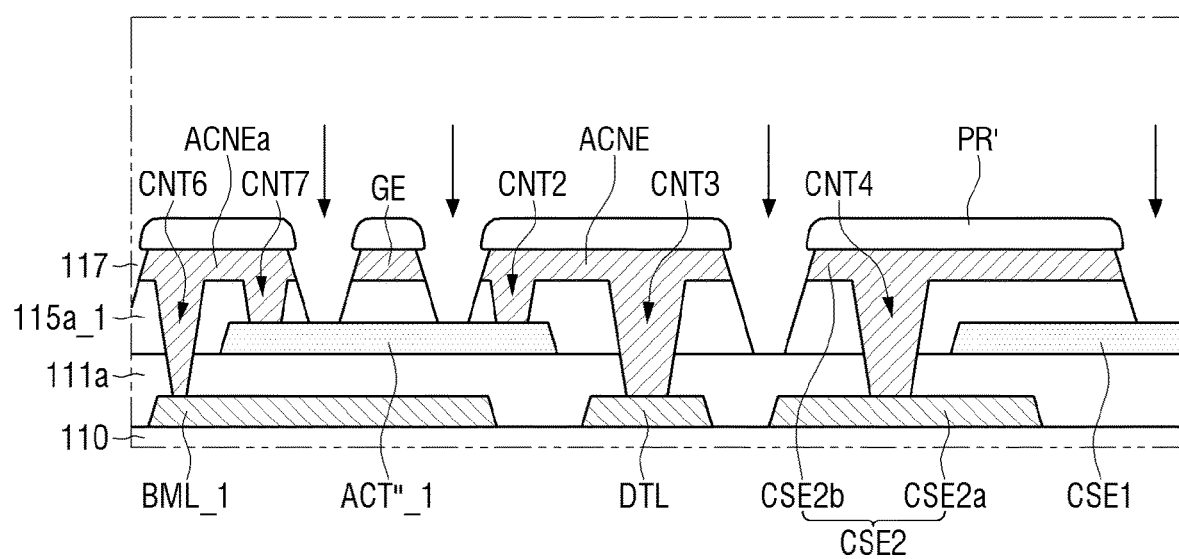
FIGS. 51 and 52 are cross-sectional views showing the steps of a method of manufacturing a display device according to still another embodiment.
Figure 52:
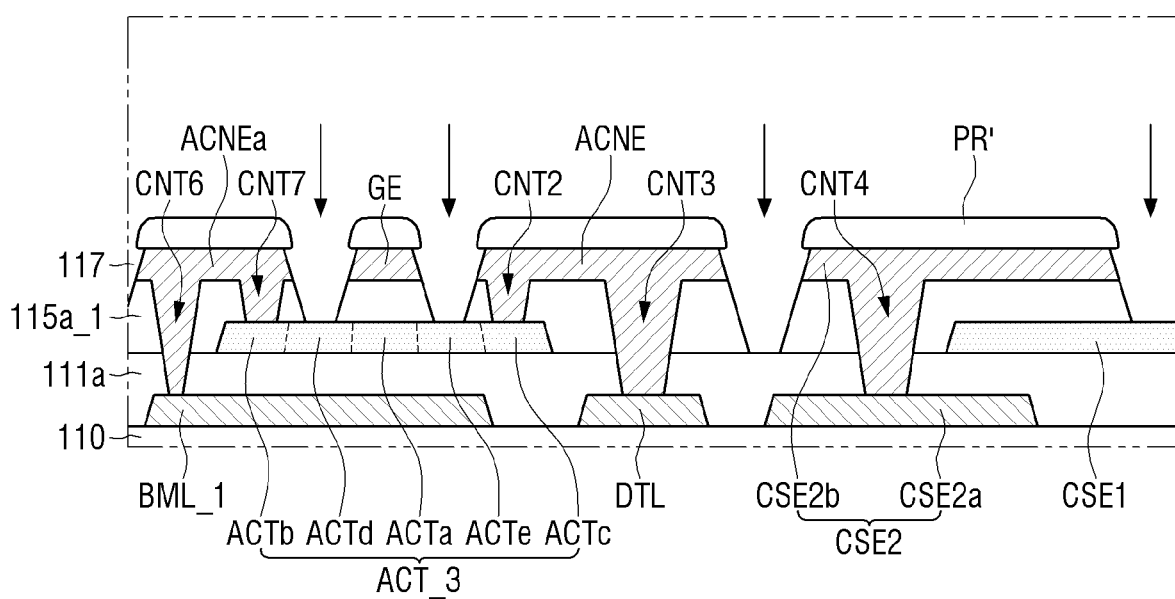

FIGS. 51 and 52 are cross-sectional views showing the steps of a method of manufacturing a display device according to still another embodiment. FIGS. 51 and 52 illustrate a method of manufacturing the display substrate 10_4 of FIG. 50.

First, as shown in FIG. 51, after the gate electrode GE, the first connection electrode ACNE, and the second connection electrode ACNEa are formed as shown in FIG. 49, the gate insulating layer 115a of FIG. 49 is additionally etched using the second photoresist layer before the process of making the fourth area ACTd and the fifth area ACTd conductive. Accordingly, as shown in FIGS. 50 and 51, the gate insulating layer 115a_1 may additionally include through-holes penetrating the areas overlapping the gate electrode GE, the first connection electrode ACNE, and the second connection electrode ACNEa. The through-holes may overlap the areas in which the fourth area ACTd and the fifth area ACTe of FIG. 52 will be formed.

Next, as shown in FIG. 52, the area exposed by the second photoresist layer PR' of the semiconductor pattern ACT"_1 of FIG. 51 is made to be conductive (or made to become a conductor).

The corresponding process may be performed by implanting ions such as boron (B) or argon (Ar) into the exposed semiconductor pattern ACT"_1 (hereinafter, referred to as "secondary ion implantation process"). Accordingly, the second area ACTb, the third area ACTc, the fourth area ACTd, and the fifth area ACTe may include ions such as boron (B) or argon (Ar), and the first area ACTa may not include ions such as boron (B) or argon (Ar).

In accordance with the present embodiment, the ions such as boron (B) or argon (Ar) are implanted into the semiconductor patterns ACT"_1 exposed by the through-hole of the gate insulating layer 115a_1, so that the conductivity of the fourth area ACTd and the fifth area ACTe may be higher than the conductivity of the second area ACTb. That is, the concentration of ions such as boron (B) or argon (Ar) in each of the fourth area ACTd and the fifth area ACTe may be higher than the concentration of ions such as boron (B) or argon (Ar) in the second area ACTb.

While the present disclosure has been described with reference to embodiments thereof, it will be apparent to those of ordinary skill in the art that various changes and modifications may be made thereto without departing from the scope and spirit of the present disclosure as set forth in the following claims.

What is claimed is:

1. A display device comprising:
a first base portion;
a first conductive layer comprising a lower light blocking layer on the first base portion, and a lower wiring spaced apart from the lower light blocking layer;
a buffer layer disposed on the first conductive layer;
a semiconductor layer disposed on the first buffer layer and comprising a first area, a second area on one side of the first area, and a third area on the other side of the first area;
a gate insulating layer on the semiconductor layer; and
a second conductive layer comprising a gate electrode overlapping the first area on the gate insulating layer,
wherein conductivity of each of the second area and the third area is higher than conductivity of the first area,
the third area is electrically connected to the lower wiring, and
the second area is directly connected to the lower light blocking layer.

2. The display device of claim 1, wherein the semiconductor layer comprises an oxide semiconductor layer.

3. The display device of claim 1, wherein each of the second area and the third area contains boron (B) or argon (Ar).

4. The display device of claim 1, wherein the lower light blocking layer overlaps the semiconductor layer in a thickness direction.

5. The display device of claim 1, wherein the second conductive layer further comprises a first connection electrode overlapping the third area.

6. The display device of claim 5, wherein the first connection electrode is directly connected to the third area and the lower wiring.

7. The display device of claim 5, wherein the third area is connected to the first connection electrode and the lower wiring.

8. The display device of claim 5, further comprising a light emitting element comprising a first electrode on the second conductive layer, a second electrode on the first electrode, and a light emitting layer between the first electrode and the second electrode.

9. The display device of claim 8, wherein the first connection electrode is directly connected to the first electrode.

10. The display device of claim 1, further comprising a light emitting element comprising a first electrode on the second conductive layer, a second electrode on the first electrode, and a light emitting layer between the first electrode and the second electrode.

11. The display device of claim 10, wherein the third area is directly connected to the first electrode.

12. The display device of claim 1, wherein the first conductive layer further comprises a first sub-capacitance electrode, and the second conductive layer further comprises a second sub-capacitance electrode overlapping the first sub-capacitance electrode.

13. The display device of claim 12, wherein the semiconductor layer further comprises the second capacitance electrode, and the second capacitance electrode has conductivity higher than that of the first area.

14. The display device of claim 13, wherein the second capacitance electrode overlaps each of the first sub-capacitance electrode and the second sub-capacitance electrode.

15. The display device of claim 14, wherein the second capacitance electrode forms a capacitor with each of the first sub-capacitance electrode and the second sub-capacitance electrode.

16. A display device comprising:
a first base portion;
a first conductive layer comprising a lower light blocking layer on the first base portion and a lower wiring spaced apart from the lower light blocking layer;
a buffer layer disposed on the first conductive layer;
a semiconductor layer disposed on the first buffer layer and comprising a first area, a second area on one side of the first area, and a third area on the other side of the first area;
a gate insulating layer on the semiconductor layer; and
a second conductive layer comprising a gate electrode overlapping the first area on the gate insulating layer, a first connection electrode overlapping the third area, and a second connection electrode overlapping the second area,
wherein conductivity of each of the second area and the third area is higher than conductivity of the first area,
the second area is directly connected to the lower light blocking layer, and
the third area is electrically connected to the lower wiring.

17. The display device of claim 16, wherein the semiconductor layer comprises an oxide semiconductor layer.

18. The display device of claim 16, wherein each of the second area and the third area contains boron (B) or argon (Ar).

19. The display device of claim 16, wherein the second area is electrically connected to the lower light blocking layer through the second connection electrode, and the third area is electrically connected to the lower wiring through the first connection electrode.

20. The display device of claim 16, wherein the semiconductor layer further comprises a fourth area between the first area and the second area, and a fifth area between the first area and the third area, and conductivity of each of the fourth area and the fifth area is higher than conductivity of the second area and the third area.

21. A method of manufacturing a display device, comprising:
forming a first conductive layer comprising a lower light blocking layer on a first base portion, a lower wiring spaced apart from the lower light blocking layer, and a first sub-capacitance electrode spaced apart from the lower wiring;
forming a buffer layer disposed on the first conductive layer;
forming a semiconductor layer on the buffer layer;
disposing a first photoresist layer on the semiconductor layer;
etching the semiconductor layer using the first photoresist layer to form a semiconductor layer comprising a first target area, a second target area on one side of the first target area, and a third target area on the other side of the first target area, and a second capacitance electrode;
etching the first photoresist layer such that a remaining first photoresist layer covers only the first target area; and
making conductive the second target area, the third target area, and the second capacitance electrode by implanting ions outside of the remaining first photoresist layer.

22. The method of claim 21, further comprising, after making conductive the second target area, the third target area, and the second capacitance electrode, removing the first photoresist layer, and forming a gate insulating layer on the semiconductor layer and the second capacitor electrode.

23. The method of claim 22, further comprising, after forming the gate insulating layer, forming a second conductive layer comprising a gate electrode overlapping the first target area, a first connection electrode overlapping the third target area, and a second sub-capacitance electrode overlapping the second capacitance electrode using a second photoresist layer.

24. The method of claim 23, further comprising, after forming the second conductive layer, making conductive a part of the first target area adjacent to each of the second target area and the third target area using the second photoresist layer overlapping the gate electrode to form the first target area as a first area, form the second target area as a second area, and form the third target area as a third area.

25. The method of claim 24, wherein the second area is electrically connected to the lower light blocking layer, and the third area is electrically connected to the lower wiring.

26. The method of claim 22, further comprising, after forming the gate insulating layer, forming a second conductive layer comprising a gate electrode overlapping the first target area, a first connection electrode overlapping the third target area, a second connection electrode overlapping the second target area, and a second sub-capacitance electrode overlapping a second capacitor electrode using a second photoresist layer.

27. The method of claim 26, further comprising, after forming the second conductive layer, making conductive a part of the first target area adjacent to each of the second target area and the third target area by implanting ions outside of the second photoresist layer overlapping the gate electrode, the first connection electrode, and the second connection electrode to form first to fifth areas.

28. The method of claim 27, wherein the second area is electrically connected to the lower light blocking layer through the second connection electrode, and the third area is electrically connected to the lower wiring through the first connection electrode.

\* \* \* \* \*